United States Patent [19]

Ziegler et al.

[11] Patent Number: 4,513,372
[45] Date of Patent: Apr. 23, 1985

[54] UNIVERSAL MEMORY

[75] Inventors: Michael L. Ziegler, Whitinsville; Peter G. Marshall, Northboro; David L. Whipple, Braintree, all of Mass.

[73] Assignee: Data General Corporation, Westboro, Mass.

[21] Appl. No.: 441,968

[22] Filed: Nov. 15, 1982

[51] Int. Cl.³ .............................................. G06F 13/00
[52] U.S. Cl. ..................................... 364/200; 365/230
[58] Field of Search ... 364/200 MS File, 900 MS File; 365/230

[56] References Cited

U.S. PATENT DOCUMENTS 3,969,706 7/1976 Proebsting et al. ................. 365/230
4,253,147 2/1981 MacDougall et al. .............. 364/200

Primary Examiner—Raulfe B. Zache
Attorney, Agent, or Firm—Gerald Cechony; Simon Cohen

[57] ABSTRACT

A memory device is disclosed that operates internally substantially independent of the timing of signals from its associated computer. That is, the timing controls for multiplexing the row and column address into the memory chips as well as the enabling signal for writing information into the chips are controlled by different delay lines so that the memory always operates at its optimal operational speed. In addition, the input and output latches are arranged to receive or output information to or from the computer at a time that is optimal for the computer or other information requester.

10 Claims, 41 Drawing Figures

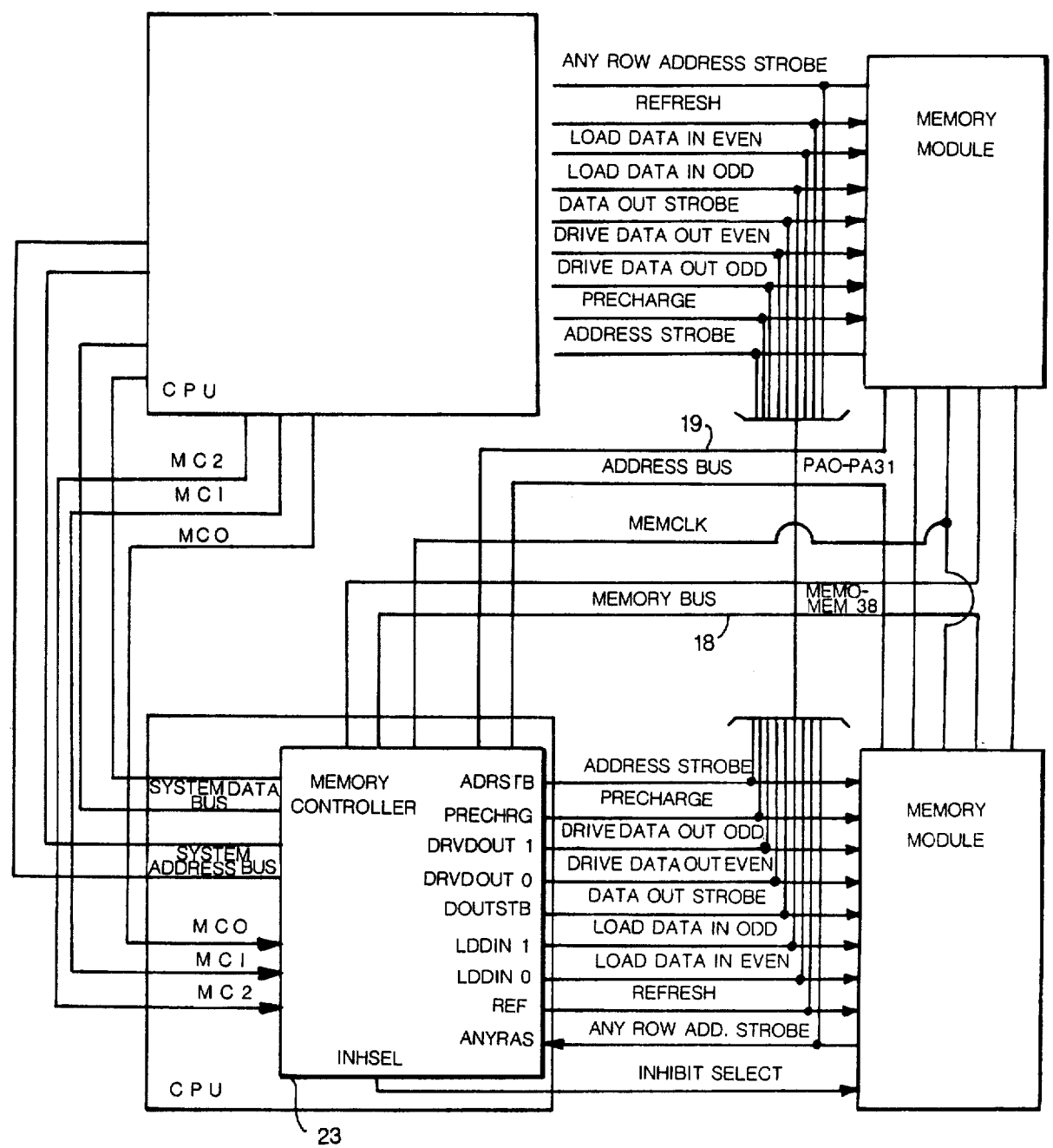
FIG. I

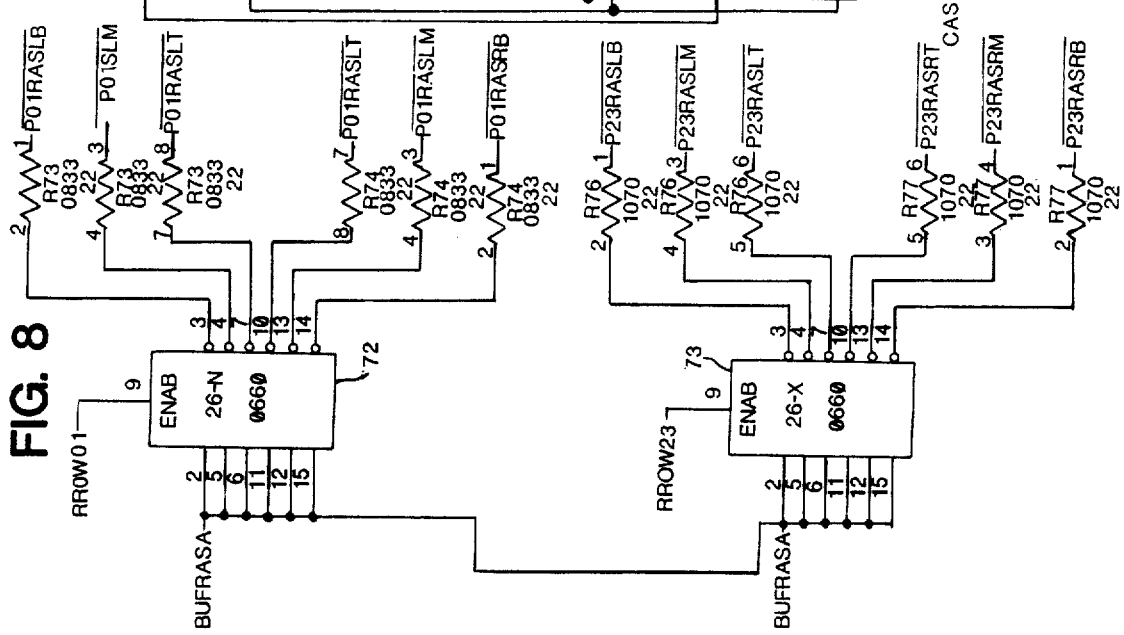

FIG. 10-1 PLANE 0 BITS 0-20
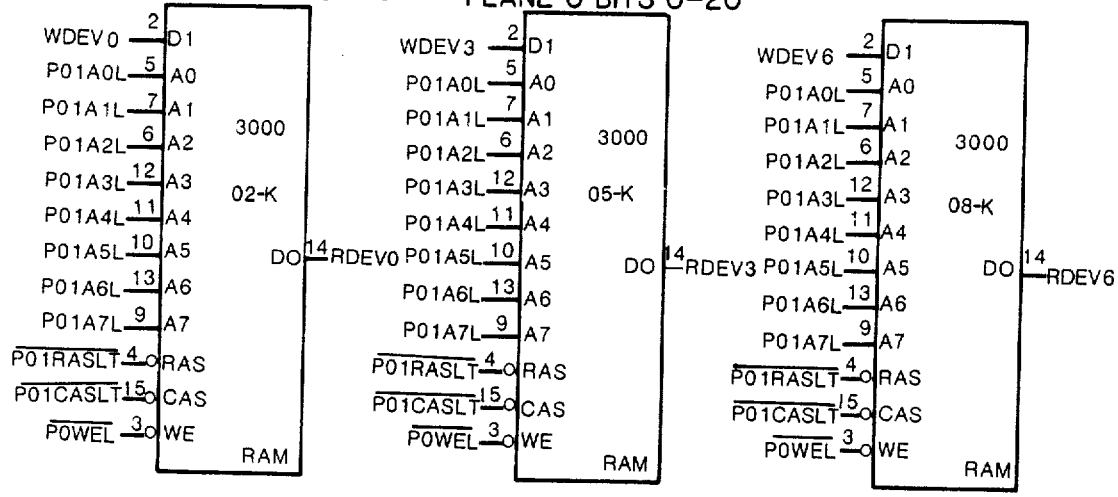
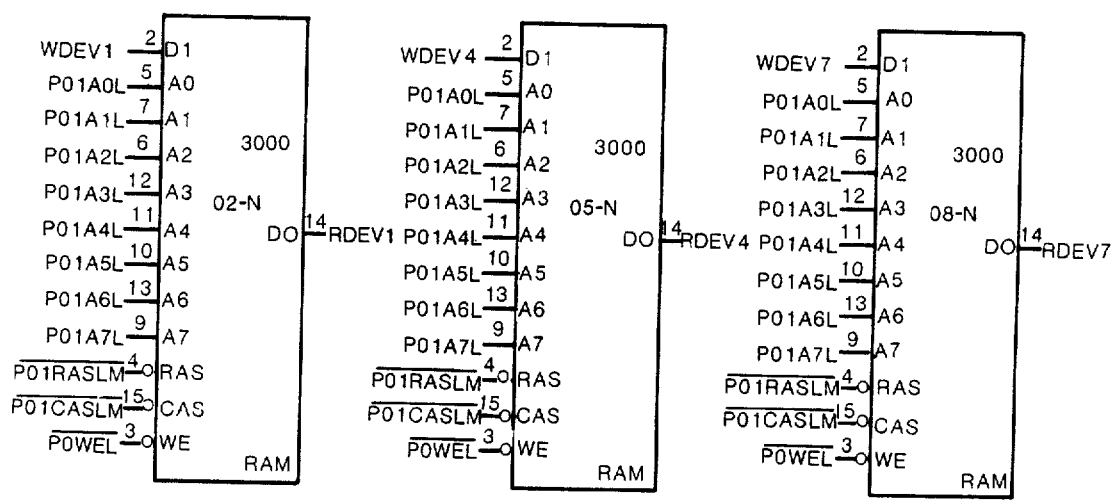
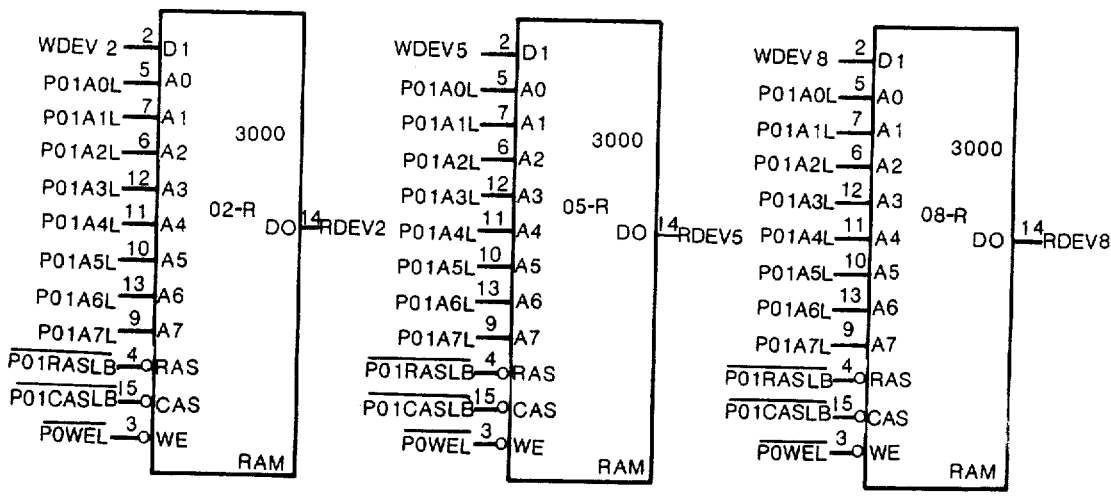

FIG. 10-2
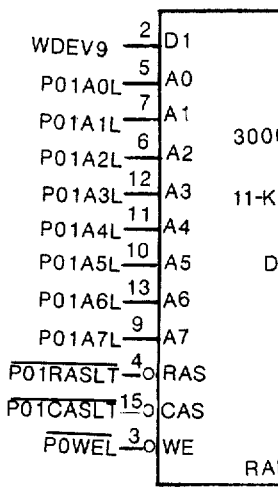
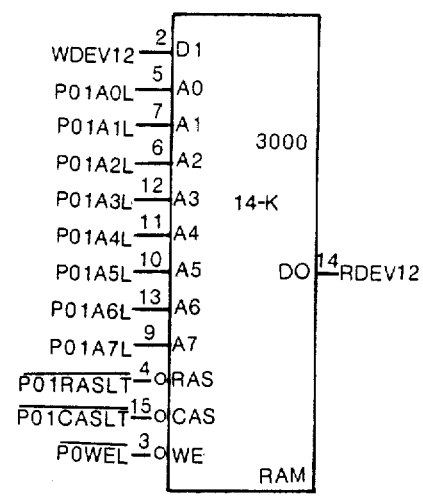
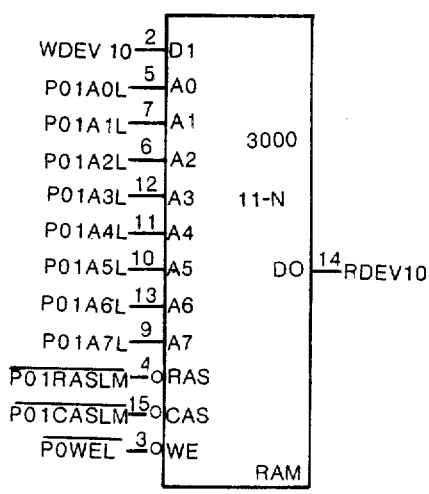
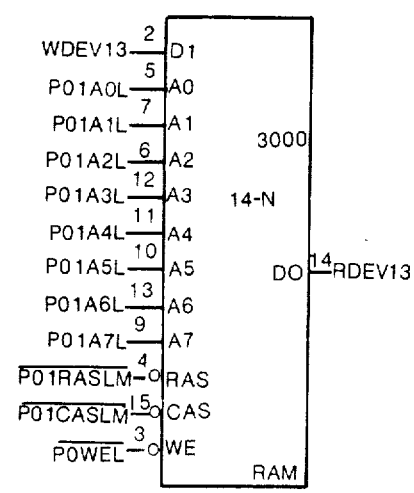
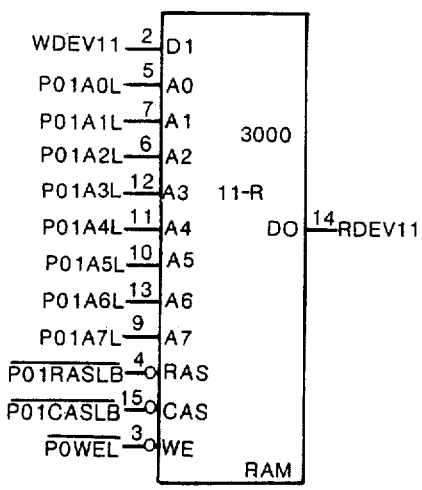
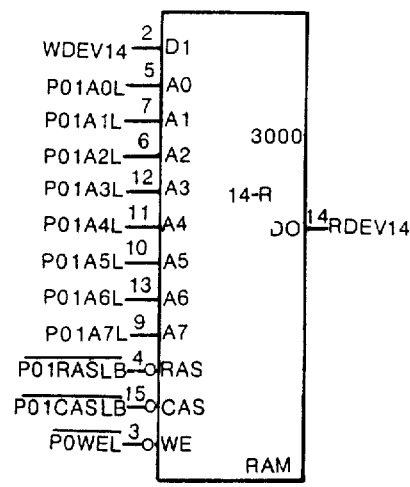

FIG. 10-3
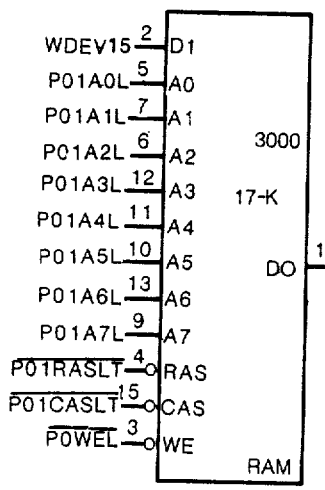
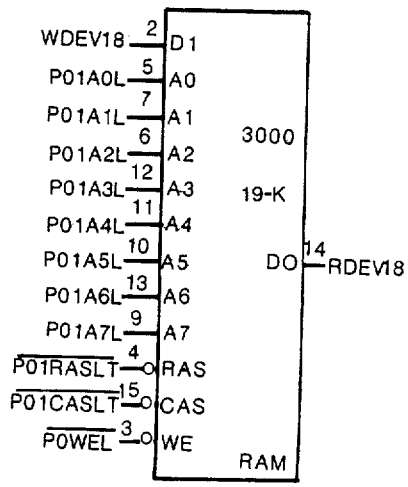
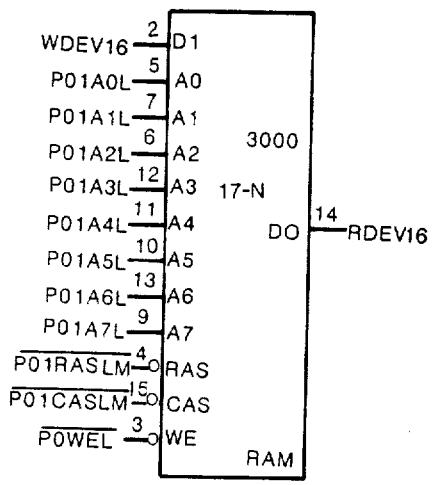
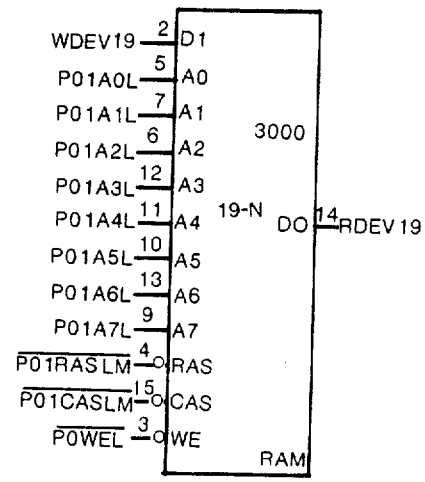
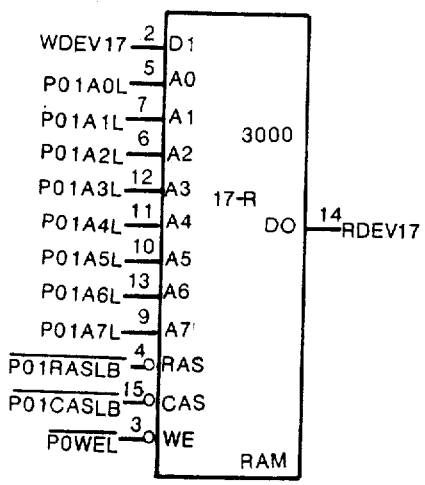
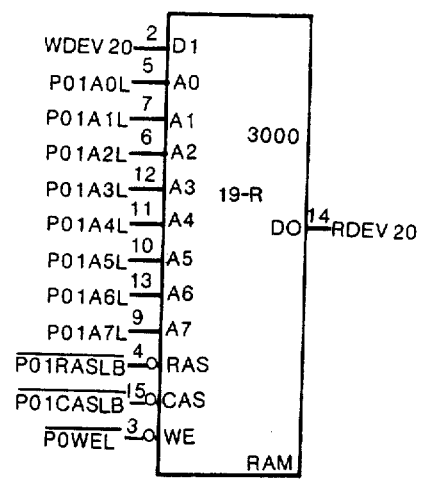

PLANE 0  BITS 21 - 38

FIG. 12-1
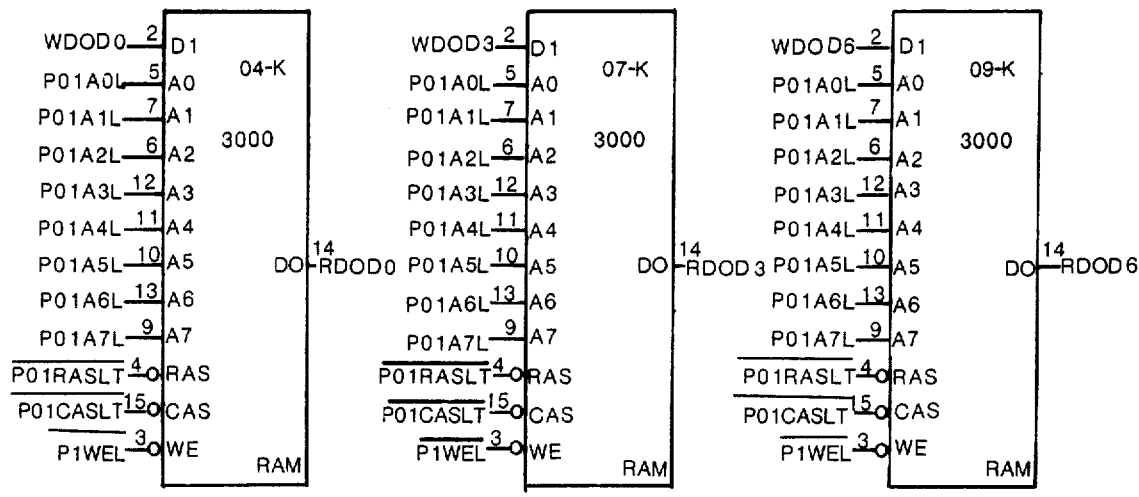
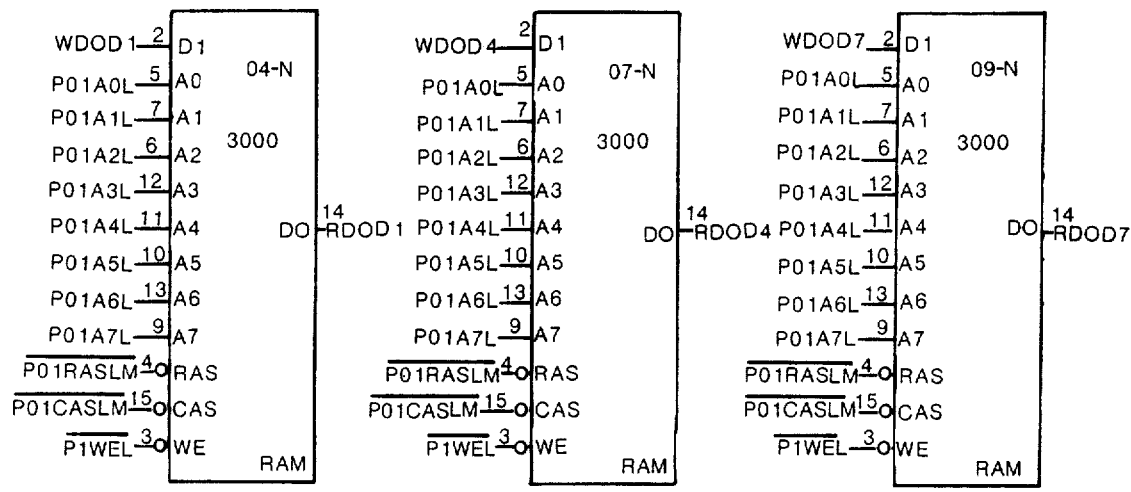
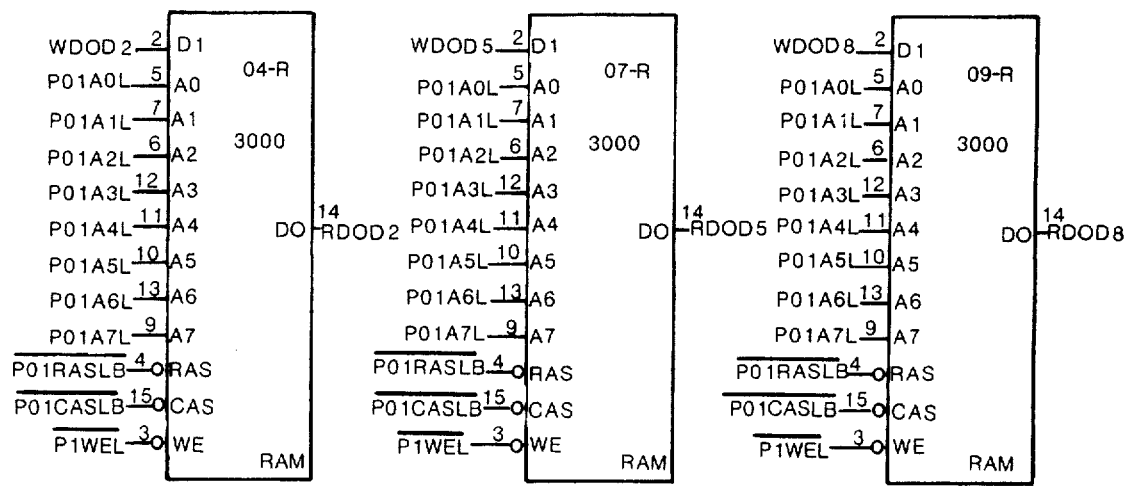

FIG. 12-2
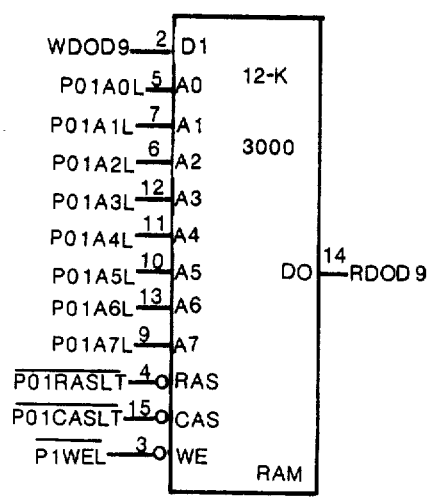
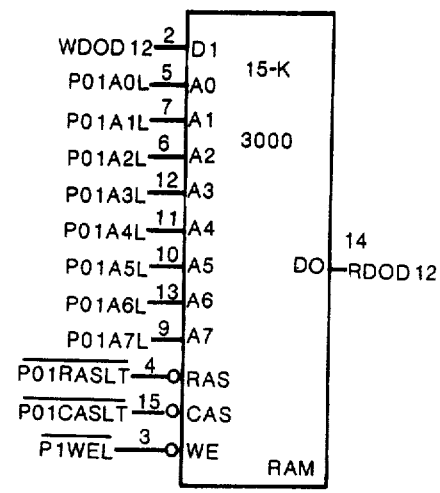
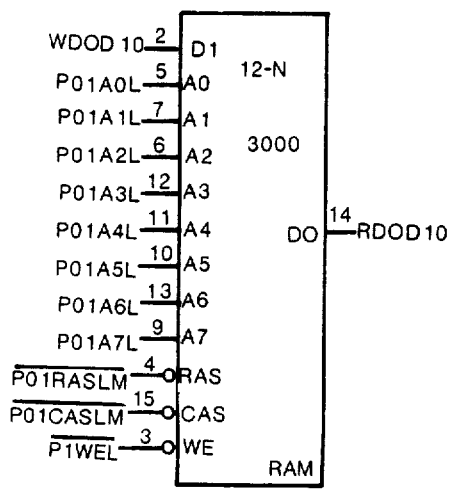
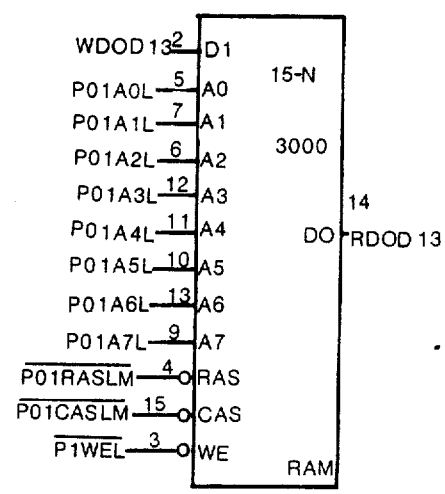
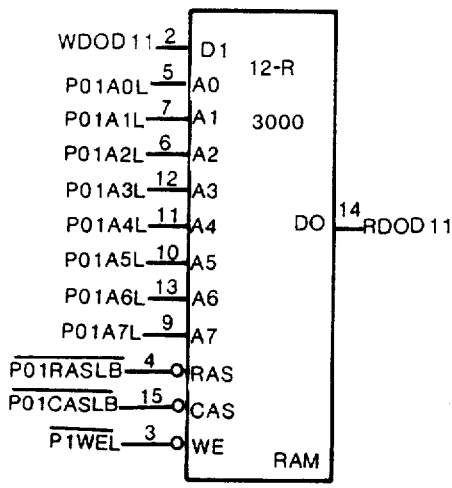
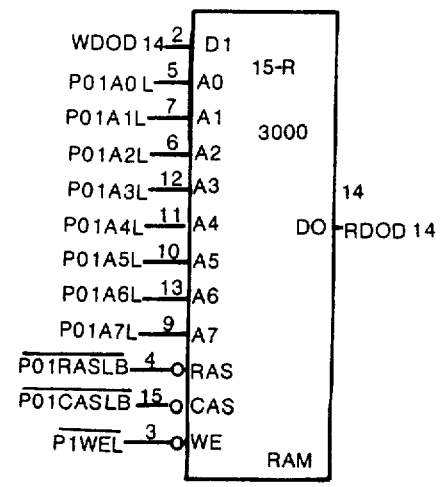

FIG. 13-1
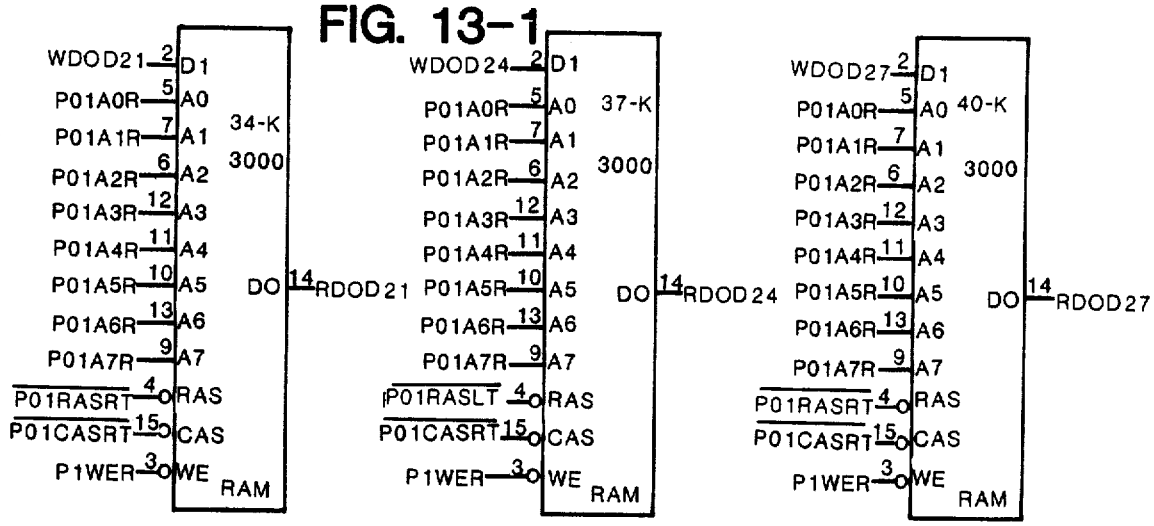
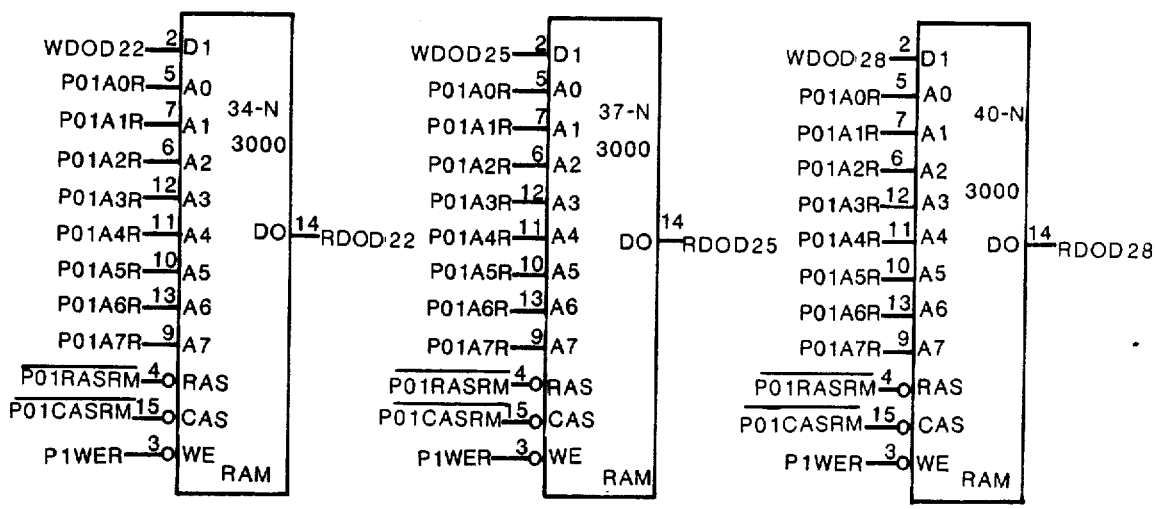
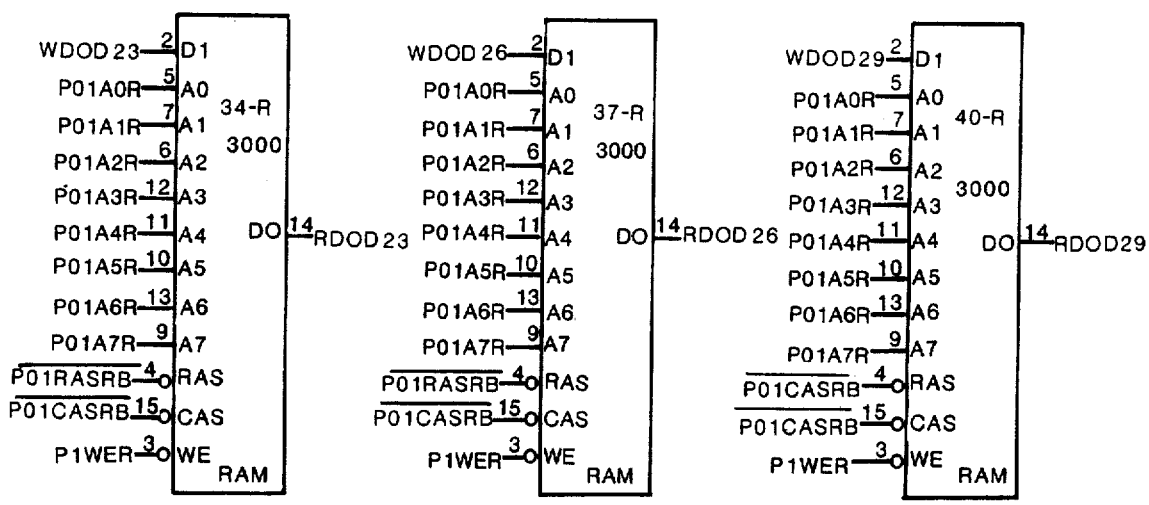

FIG. 13-2
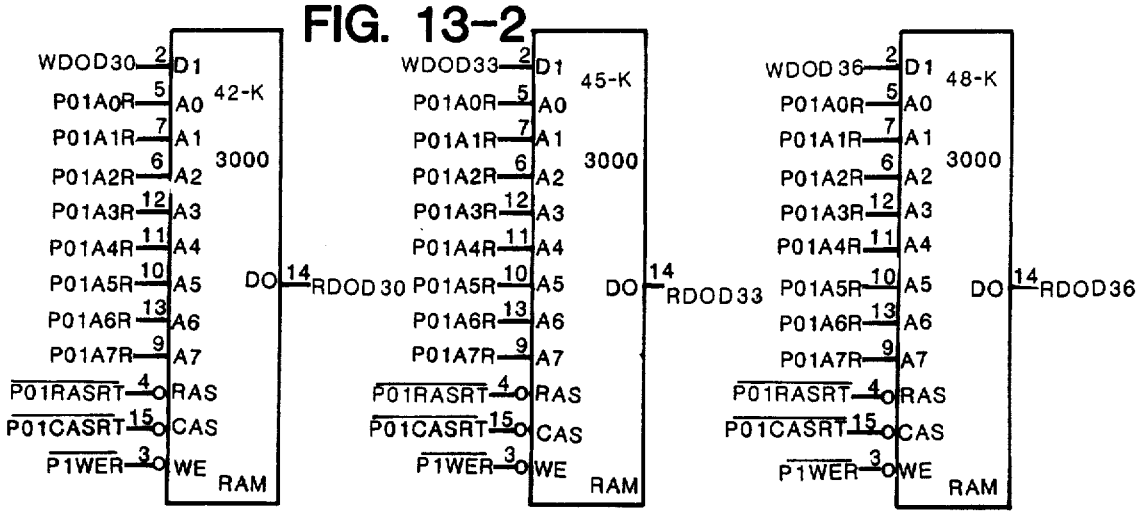
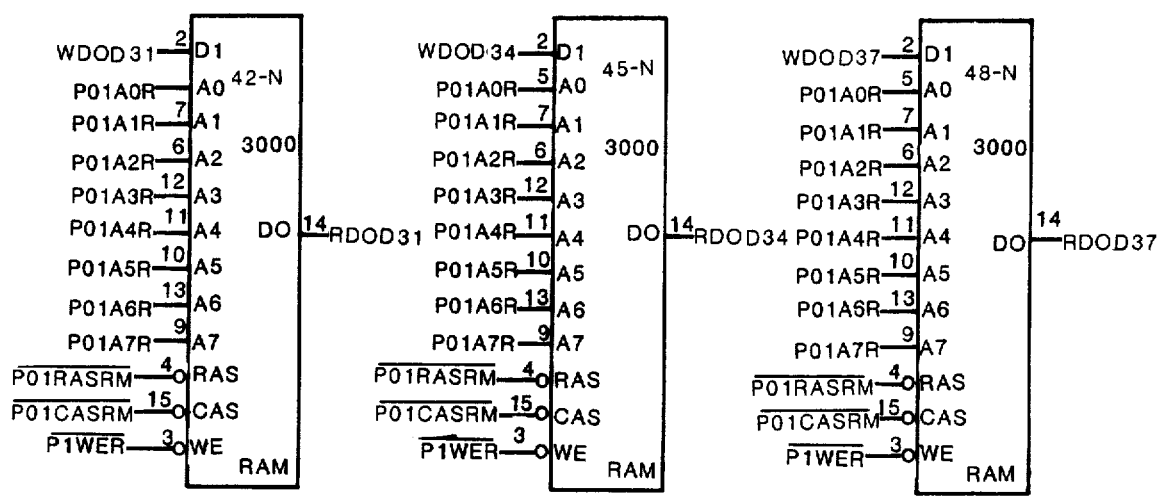
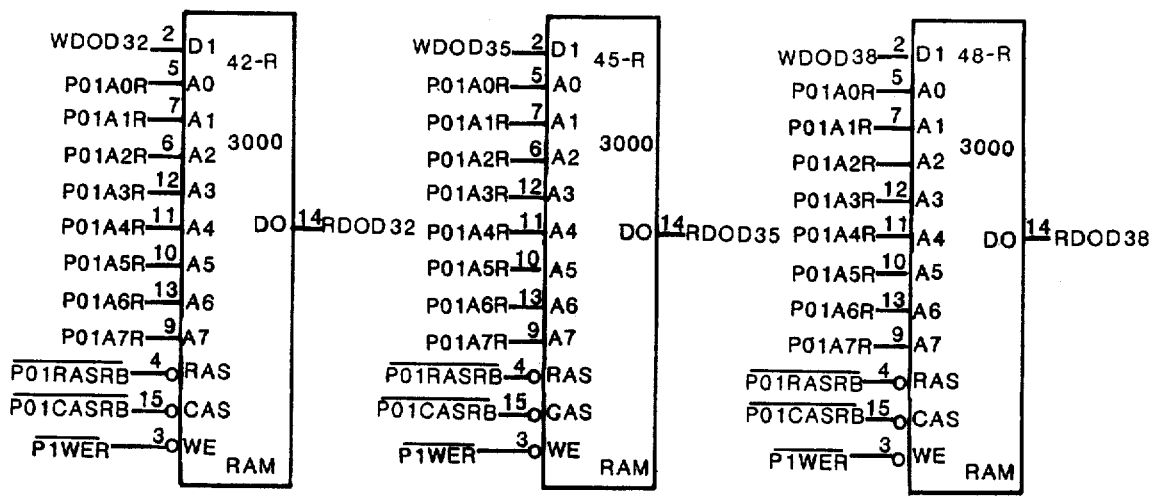

UNIVERSAL MEMORY

BACKGROUND OF THE INVENTION

The present invention relates generally to computer memories and more particularly computer memories of the type in which a given memory can be accommodated to operate with different computer systems having different timing requirements without modifying the memory and in which several memory modules possessing memory chips of different timing characteristic requirements may be used with the same computer without the necessity for modifying the timing signals from the computer to the different memory modules.

Most large computer companies manufacture several different types of computers with varying capacities and operating speeds. Generally the memory system for each different type of computer is custom designed for the particular computer in which the memory is to be utilized. In designing such computer systems the requirements of the particular memory selected are accommodated for by designing the computer-memory interface, or memory controller, in such a way as to provide the memory modules with the necessary timing signals required to read and write the information. The memory and computer were thus designed together to optimize the best features of each.

Generally such memories could be utilized for that one computer only and would not be adaptable to utilization in other computers with different timing characteristics.

In many prior art memory systems if two words were to be sequentially read out of different address locations in a particular memory module it was necessary to provide the same delay time for addressing the second word as was required for reading the first.

SUMMARY OF THE INVENTION

It is an object of this invention to provide a new and improved computer memory device.

It is another object of this invention to provide a new and improved computer memory device of the type in which each memory module operates at its optimum operational speed regardless of the computer to which it is connected.

It is still another object of this invention to provide a computer memory device wherein memory modules having different operational speeds may be used in conjunction with the same computer without adjusting the timing of the computer signals for the different modules.

A computer memory in accordance with the invention includes a single memory address bus, a single data bus, and nine control signal lines including the following signals;

ANY ROW ADDRESS STROBE
REFRESH
LOAD DATA IN EVEN
LOAD DATA IN ODD
DATA OUT STROBE
DRIVE DATA OUT EVEN
DRIVE DATA OUT ODD
PRECHARGE
ADDRESS STROBE.

In addition, a memory clock signal from the memory controller is used to clock all memory modules in the memory device. The memory controller communicates with the central processing unit of the computer or with any other requester of memory service along a system data bus, a system address bus, and three control signals that ultimately generate the signals used to control the memory module. Upon receipt of the ADDRESS STROBE signal delay lines in the memory module control the multiplexing of the ADDRESS signal into all of the memory elements of a selected memory module. In addition, the ADDRESS STROBE signal enables all address latches in the system at the same time. The LOAD DATA IN EVEN signal clocks any signals on the memory data bus into a data-in-even register and, through a further delay line generates a write enable even signal that is applied to the memory elements of a selected memory module.

The LOAD DATA IN ODD signal controls the data-in-odd register and produces the write enable odd signal for the memory elements of a selected memory module.

The DATA OUT STROBE signal enables both the odd and even output data latches in all memory modules of the memory system. The output data latches of the selected memory module are held in a latched condition longer than all of the other such latches in the other memory modules.

The DRIVE DATA OUT EVEN signal places the information from the even output data latch of the selected memory module onto the memory data bus.

Similarly, the DRIVE DATA OUT ODD signal places the signals from the odd output data latch of the selected memory module onto the memory data bus.

The PRECHARGE signal prevents the same row of a selected module from starting again until a characteristic time for recovery of the memory elements of a selected memory module has expired where the row is addressed twice in succession.

The REFRESH signal produces a Row Address Strobe signal (RAS) for all the elements of the memory device.

The ANY ROW ADDRESS STROBE signal is generated by a selected memory module to indicate that it has started. Thus, after an address strobe is produced, the memory controller does not produce any further sequential control signals for the memory module until the ANY ROW ADDRESS STROBE signal is received by the controller.

DESCRIPTION OF THE DRAWINGS

While the novel features of this invention are set forth with particularity in the appended claims, the invention, both as to organization and content, will be better understood and appreciated along with other subjects and features thereof from the following detailed description taken in conjunction with the drawings in which like reference numerals represent like parts and wherein:

FIG. 8 is a schematic diagram of part of the memory module of FIG. 2.

FIG. 9 is a schematic diagram of part of the memory module of FIG. 2.

FIG. 10 is a schematic diagram of part of the memory module of FIG. 2.

FIG. 13 is a schematic diagram of part of the memory module of FIG. 2.

DETAILED DESCRIPTION OF THE PREFERRED EMBODIMENTS

Figures 1, 3:
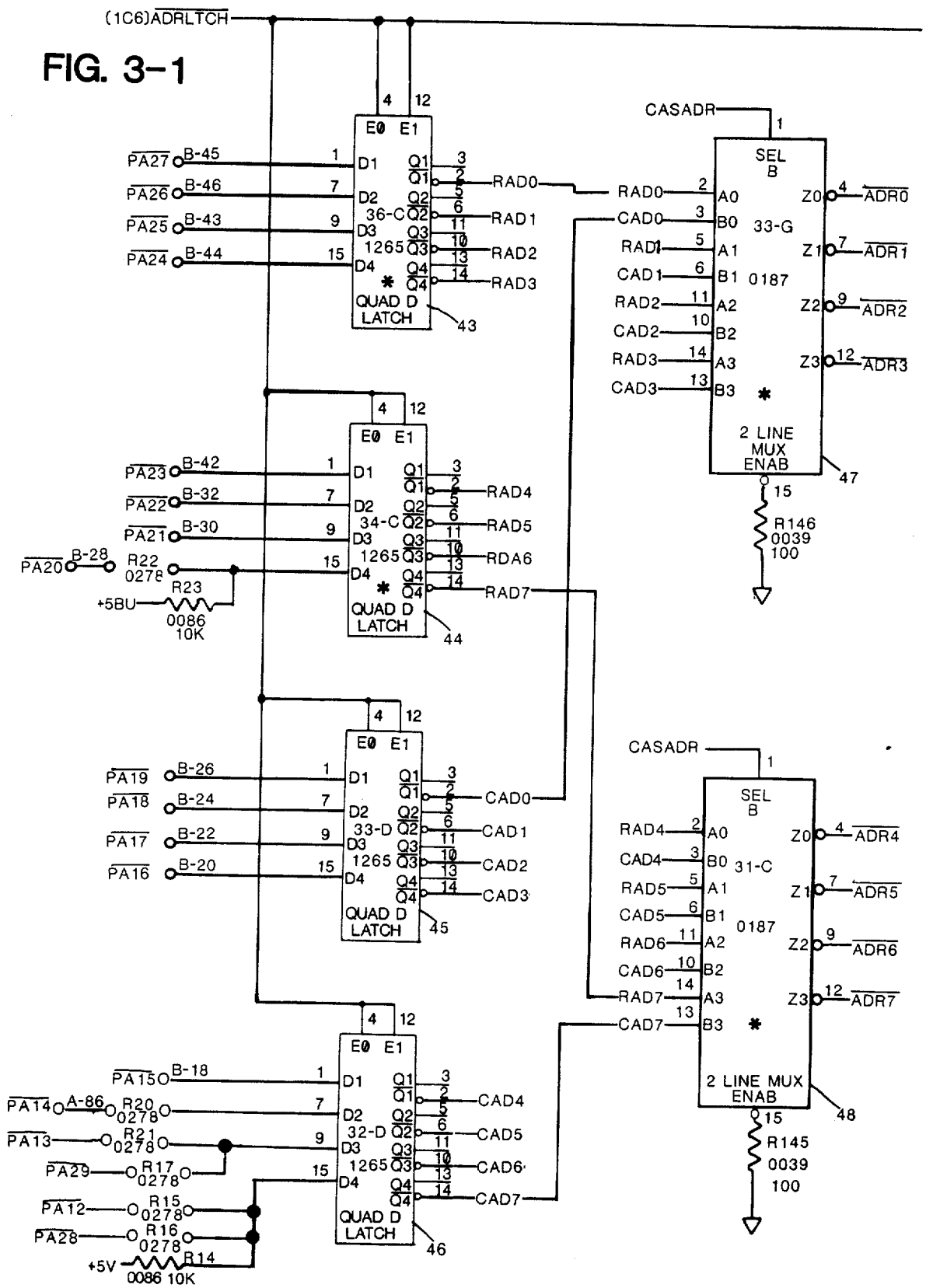
FIG. 1 is a block diagram showing signal flow of signals between the computers, the memory controllers, and memory modules of a system in which the memory modules according to the invention may be used.
FIG. 3 is schematic diagram of part of the memory module of FIG. 2.
Figures 2, 3:
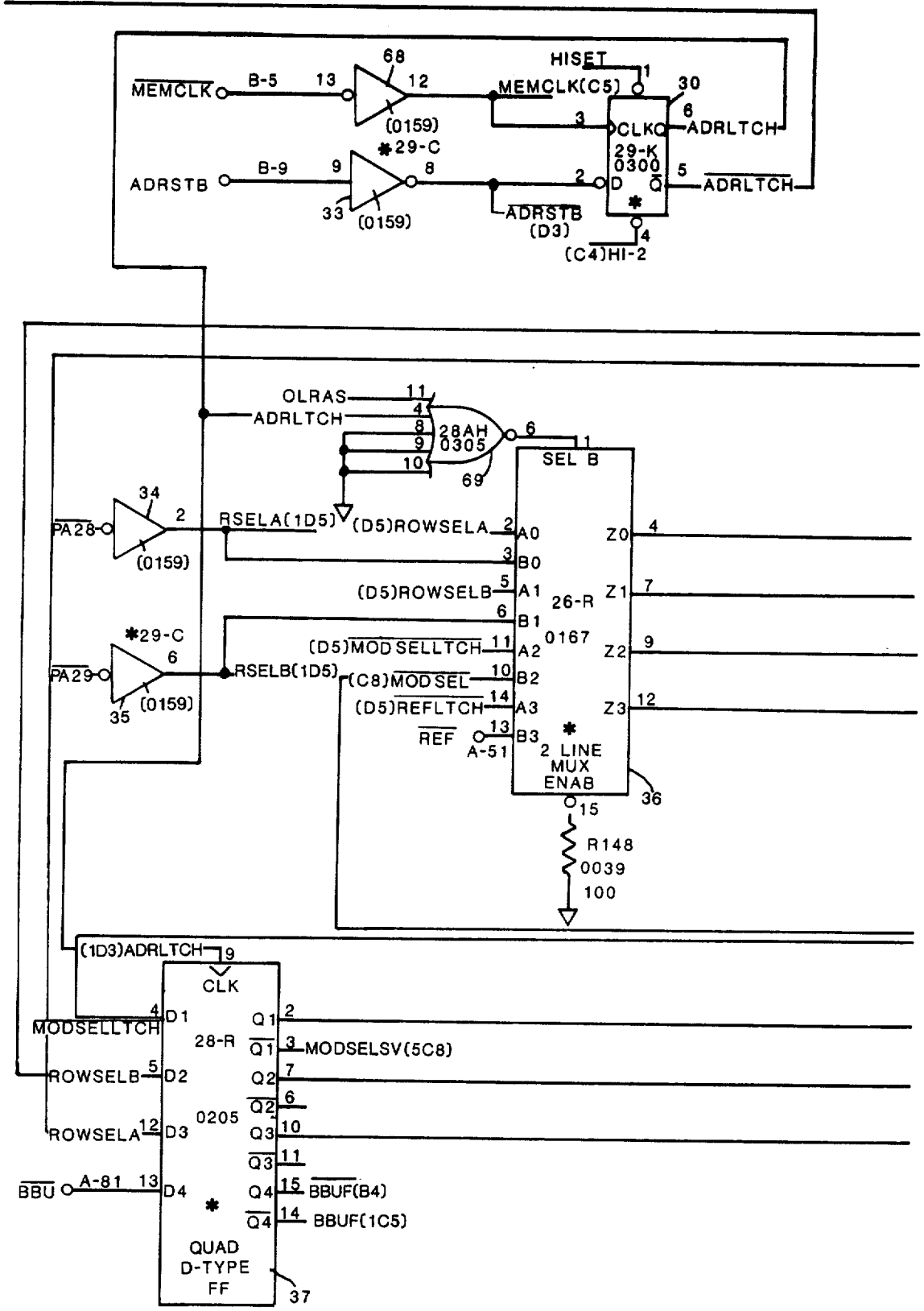
Figure 3:
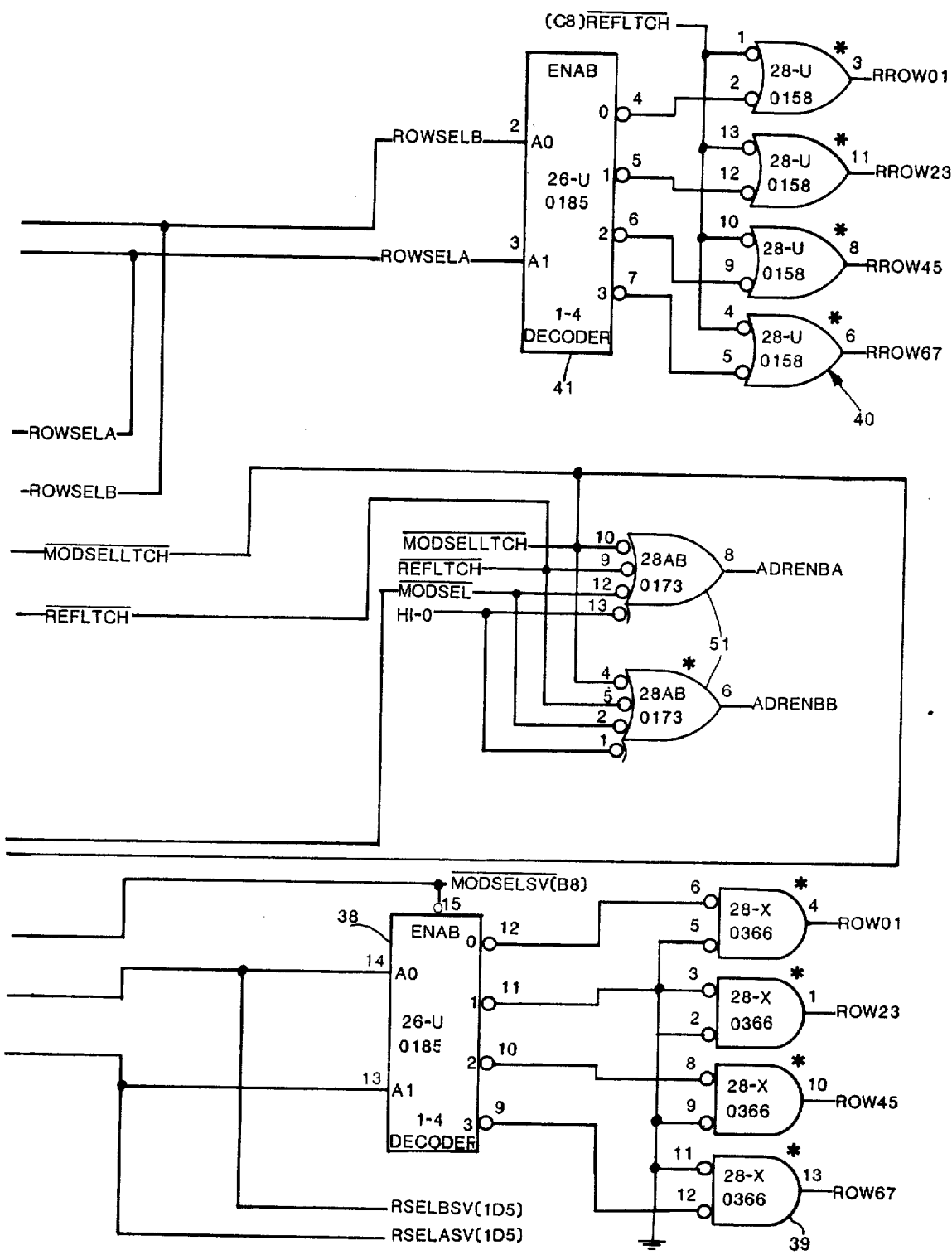

A computer system as shown in FIG. 1 has several computers including a Central Processing Unit (CPU) and a memory controller interconnected with a number of memory modules. The CPU, which in this case is the memory requester, provides the memory controller with a system data bus path for supplying information and accepting information from the memory controller, a system address bus for supplying addresses to the memory controller and a group of three control signals, MC0, MC1, MC2. Memory controller 23 communicates with the memory modules along memory data bus 18 and address bus 19. Memory data bus 18 is a 39 bit bi-directional data bus, while address bus 19 is a 32 bit bi-directional address bus. The memory controllers effect control over a memory module by the use of eight signals sent to the memory module and one signal received from the memory module. The eight signals are the following: REFRESH, LOAD DATA IN EVEN, LOAD DATA IN ODD, DATA OUT STROBE, DRIVE DATA OUT EVEN, DRIVE DATA OUT ODD, PRECHARGE and ADDRESS STROBE. The signal sent from the memory module to the memory controller is ANY ROW ADDRESS STROBE.

The ADDRESS STROBE signal starts the memory module and latches the address on the address bus into all memory modules. The selected memory module indicated by six of the address bits on the memory address bus uses the ADDRESS STROBE signal to produce a row address strobe signal for each of the memory elements in the selected module, and, through a delay line also produces the COLUMN ADDRESS STROBE (CAS) signal. Following a delay, the ADDRESS STROBE signal also produces the ANY ROW ADDRESS STROBE signal in the selected memory module. The PRECHARGE signal delays the operation of the memory module only if the same row of memory elements in that module have been addressed twice in succession. The delay is sufficient only for the memory elements to become fully functional again. The DRIVE DATA OUT ODD and DRIVE DATA OUT EVEN signals select which set of output data latches will be connected to the memory bus 18. The DATA OUT STROBE signal latches the output of all output data latches in all memory modules of the memory system. The LOAD DATA IN ODD and LOAD IN EVEN signals select which of two sets of input data latches will be connected to the memory bus 18. The REFRESH signal produces a row address strobe signal in all of the memory elements of all memory modules in the memory system. An additional signal that is optional and shown from only one memory controller is the INHIBIT SELECT signal that inhibits the operation of the memory modules and would be generally utilized if other peripheral devices were to be addressed in order to protect the information in the memory from being inadvertently addressed during such a peripheral operation.

Figure 2:
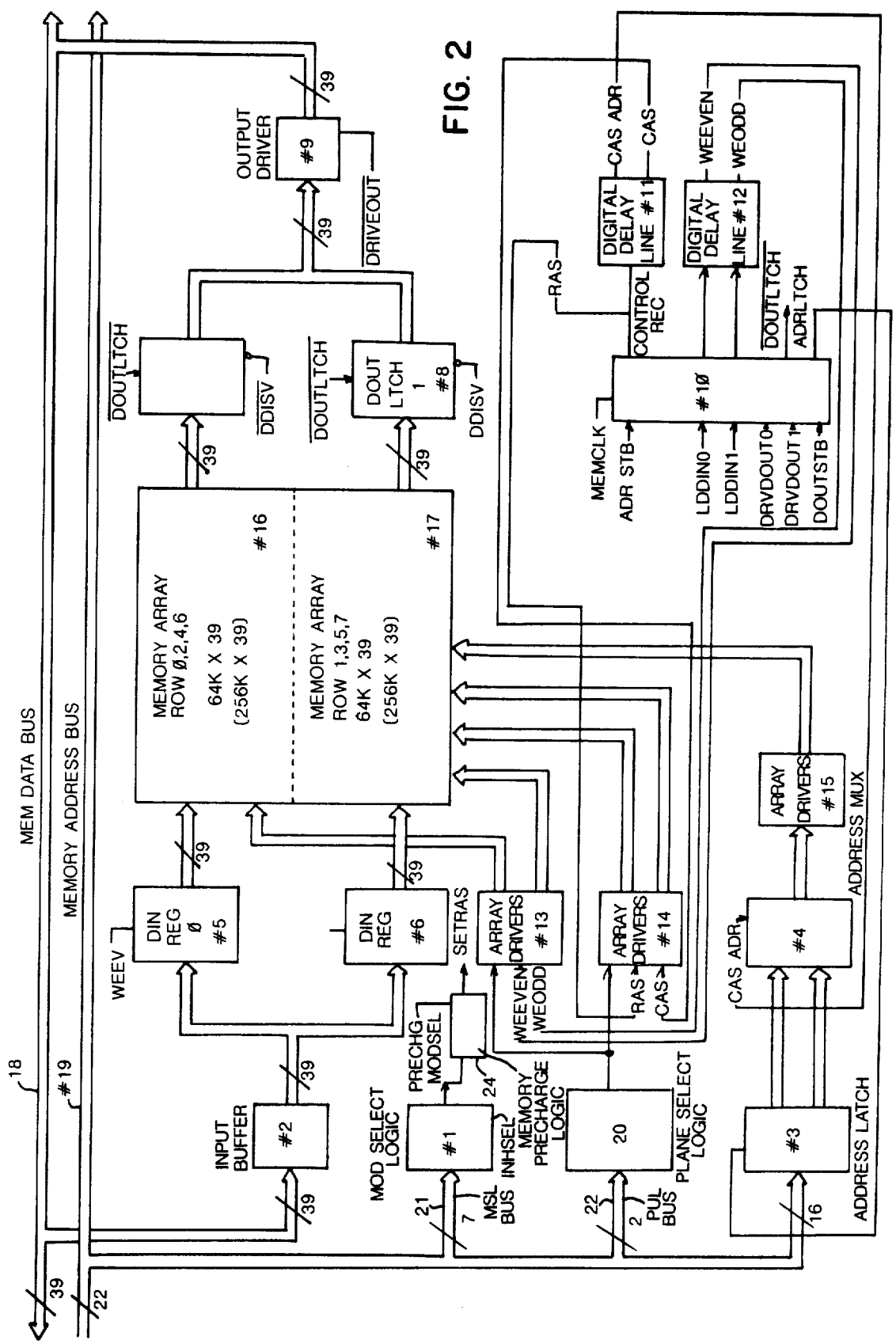
FIG. 2 is a block diagram of a memory module.

FIG. 2 shows a block diagram of a memory element. Seven bits of the address bus 19 are connected along Module Select Bus (MSL Bus) 21 to module select logic 1. The Inhibit Select signal (INHSEL) is also connected as a disabling signal to all module select logic elements of all the memory modules. In the event that the seven bits of the memory correspond to the preset information in the module select logic 1 a Module Select signal (MODSEL) is produced. The MODSEL signal is connected to memory precharge logic 24 along with the Precharge signal (PRECHG). If a different row of the memory is being selected than was selected on a previous memory cycle the Set Real Address Strobe signal (SETRAS) is produced by the memory precharge logic. Otherwise, the SETRAS signal is delayed until the PRECHARGE signal releases it. Two bits of the memory address bus 19 are connected through plane select logic bus (PSL bus) 22 to plane select logic 20. The output of the plane select logic is connected to array drivers 13 and 14. The signals from the plane select logic determine which of the memory planes will be selected during a read operation to receive the Row Address Strobe (RAS) and Column Address Strobe (CAS) signals from array drivers 14, and which of the planes will receive the write enable signals from array drivers 13. The RAS signal is always produced in the control register 10 of a selected memory module as a result of the ADDRESS STROBE signal. A delay line 11 delays the RAS signal to produce the Column Address Strobe Address (CAS ADR) and Column Address Strobe (CAS) signals. The Address Latch (ADRLTCH) signal is produced as a result of the ADDRESS STROBE signal in the control register 10. The ADRLTCH signal latches the address latches 3 of all the memory modules in the memory system. The row and column addresses are latched simultaneously. Following a delay produced by delay line 11 the CAS ADR signal switches the address multiplexer 4 in such a way that the row addresses that are first conducted to memory arrays 16 and 17 through array drivers 15 are followed by the column addresses.

The memory elements are divided into a series of odd rows or planes and a series of even rows or planes. The even half of the memory 16 and the odd half 17 may separately accessed during a write operation. During a read operation, however, both odd and even halves of the memory output a 39 bit word into data out latches 7 and 8. Latches 7 and 8 operate in response to a Data Out Latch (DOUTLTCH) signal produced in the control register 10 in response to the Data Out Strobe (DOUTSTB) signal. Depending on the location of the desired word in memory either the Drive Data Out Even (DD00) or the Drive Data Out Odd (DD01) signals will be asserted by the memory controller 23. On the next Memory Clock (MEMCLK) signal either the even data output latch 7 or the odd data output latch 8 will have its output enabled by the DD1 signal or its inverted version. Either of the clocked DD01 or DD02 signals produces the DRIVEOUT signal to drive the information from the selected latch onto the data bus. If, during a memory read cycle it is desired to produce two sequential 39 bit words including 32 information bits and 7 error correction bits the address will be provided to the memory modules together with an ADDRESS STROBE signal and DOUTSTB signal and either a DRVDOUT0 or a DRVDOUT1 signal. Immediately after the output of one of the data output latches becomes available on the memory data bus 18 the DRVDOUT signal may be inverted to drive the other output word from the other latch onto the memory bus. Meanwhile, since the output latches are in a latched state another address and address strobe signal may be sent to the same module, causing both halves of the memory array to output additional data words which are latched into the data output latches following the placement of the last of the previous two words onto the memory data bus. The contents of the second two words from the data output latches are then immediately available to be placed sequentially on the memory data bus 18. Thus, four 39 bit words may be sequentially read out of the memory without the usual delay between words customary in other memories in order to permit all the contents of the first requested word to be read out prior to the assertion of a second row and column address strobe that could terfere with the placement of the first word on the memory bus. Furthermore the last output word will be held available on the memory data bus until the memory controller 23 is instructed by the computer to remove the assertion of the DOUTSTB and the DRVDOUT signals. The memory may therefore operate as rapidly its capabilities and yet be utilized by either fast or slow computers.

During a write cycle the controller transmits the memory address along address bus 19 together with an ADDRESS STROBE signal, the information word to be read in on data bus 18, and either a Load Data In Odd (LDDIN1) or a Load Data In Even (LDDIN0) signal. The row and column ADDRESS STROBE signals are produced in the memory module in exactly the same manner as during a read cycle and the two words at that memory location are read out from both halves of the memory. The words are not not, however, latched into the data output latches. Following this, either a LDDIN0 or LDDIN1 signal from the controller produces through digital delay line 12 the Data In Even Clock (DIN0CLK) or the Data in Odd Clock (DIN1CLK) signals. The signal produced clocks the data from the data bus through input buffer 2 to either data-in register 5 or data-in register 6. If for example the DIN0CLK signal is produced as a result of the LDDIN0 signal the data word on memory data bus 18 is loaded into the data in register 5 and is made available to the even half of memory array 16. Delay line 12 also produces the write enable even and write enable odd signals depending on which of the LDDIN0 or LDDIN1 signals are sent by the controller 23. The write enable signals are conducted to array drivers 13 where they are gated by the output of the plane select logic 20 to produce write enable signals to the selected half of the memory elements in the selected module.

The clock signal ($\overline{MCLK}$) from controller 23 is inverted by inverter 68 to form the MEMCLK signal. The MEMCLK signal and its inverted form $\overline{MEMCLK}$ are used througout the memory module to clock many of the memory elements. As shown in FIG. 3 the MEMCLK signal is used to clock D flip flop 30. The D input terminal of D flip flop 30 receives the $\overline{ADRSTV}$ signal from inverter 33 and synchronizes the signal with the MEMCLK signal to form the address latch signal ADRLTCH. The ADRLTCH signal latches address bits PA12 through PA27 from address bus 19 into latches 43, 44, 45, and 46. Latches 43 and 44 contain the row address, while latches 45 and 46 contain the column address of a particular pair of 39 bit memory words in a memory module. All such latches in each memory module are actuated during a read or write memory cycle. As in most memory devices the row and column addresses must be mullted into the memory elements or chips. Latches 43, 44, 45, and 46 correspond to address latch 3 of the block diagram in FIG. 2. Four row address output signals of latch 43 (RAD0, RAD1, RAD2 and RAD3) are connected to the "A" input terminals of multiplexer 47, while four column address signals (CAD0, CAD1, and CAD3) from latch 45 are connected to "B" input terminals of this multiplexer. Four row address signals (RAD4, RAD5, RAD6 and RAD7) from latch 44 are connected to "A" inputs of multiplexer 48 while four column address signals (CAD4, CAD5, CADD6, and CAD7) from latch 46 are connected to "B" input terminals of multiplexer 48. Initially, the output signals of multiplexers 47 and 48 ($\overline{ADR0}$, $\overline{ADR1}$, $\overline{ADR2}$, $\overline{ADR3}$, $\overline{ADR4}$, $\overline{ADR5}$, $\overline{ADR6}$ and $\overline{ADR7}$) correspond to the row address signals from latches 43 and 44. On receipt of the column address strobe address (CASADR) signal from delay line 50 of FIG. 4 the multiplexer switches to its B inputs to place the column address on its output terminals. Mulitplexers 47 and 48 correspond to mulitplexer 4 of FIG. 4.

Address bit $\overline{PA28}$ is inverted in inverted in inverter 34 to form the row select A (RSELA) signal, while address bit $\overline{PA29}$ is inverted in inverter 35 to form the row select B signal (RSELB). The RESLA and RESELB signals are connected to the "B" input terminals of multiplexer 36. The ADRLTCH signal from flip flop 30 through Nor gate 69 forces multiplexer 36 to connect its "A" input terminals to its output terminals. Prior to the receipt of the ADRLTCH signal, output terminals Z0 and Z1 of multiplexer 36 are connected to the output terminals of inverters 34 and 35. As soon as the ADRLTCH signal switches multiplexer 36 the RSELA and RSELB signals that were on the B inputs of the multiplexer are then held on the output terminls due to the fact that the output terminals Z0 and Z1 are connected back to the A0 and A1 input terminals of the multiplexer. The ROWSELA and ROWSELB signals from the Z0 and Z1 output terminals of multiplexer 36 are connected to the input terminals decoder 41. Decoder 41 will put an output signal on one of its output terminals in response to a given combination of ROWSELA and ROWSELB signals. The outputs of decoder 41 are inverted by inverted input Or gates 40 to form the four row selection signals RROW01, RROW23, RROW45, RROW67. These four signals selectively enable the row address strobe signal to be connected to the memory elements in selected memory rows or planes. The refresh latch signal $\overline{\text{REFLTCH}}$ is also connected to inputs of all four Or gates 40 so that during a refresh cycle all of the memory elements of a memory module may be simultaneously connected to a row address strobe signal. The REFLTCH signal is also produced in multiplexer 36 in the same manner as row select signals are produced in response to a refresh signal $\overline{\text{REF}}$ from the controller.

Figure 4:
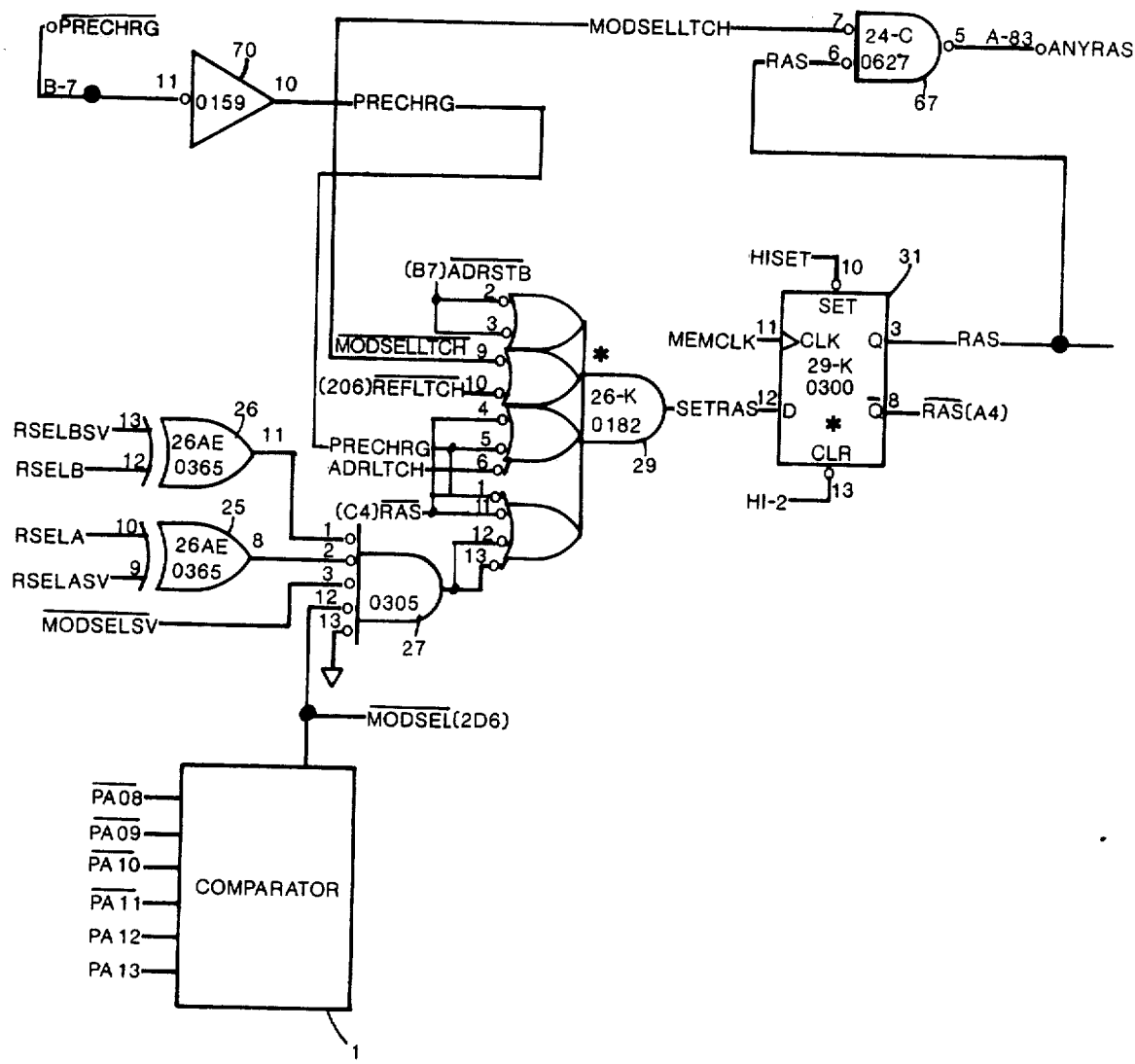
FIG. 4 is a schematic diagram of part of the memory module of FIG. 2.
Figure 1:
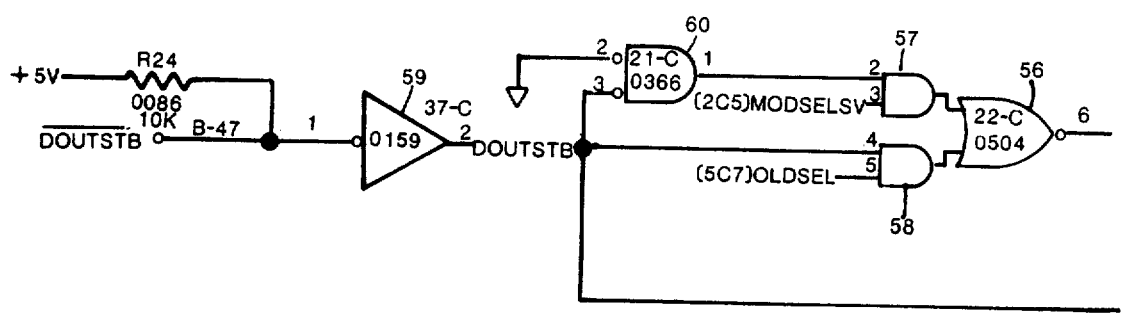
Figures 2, 4:
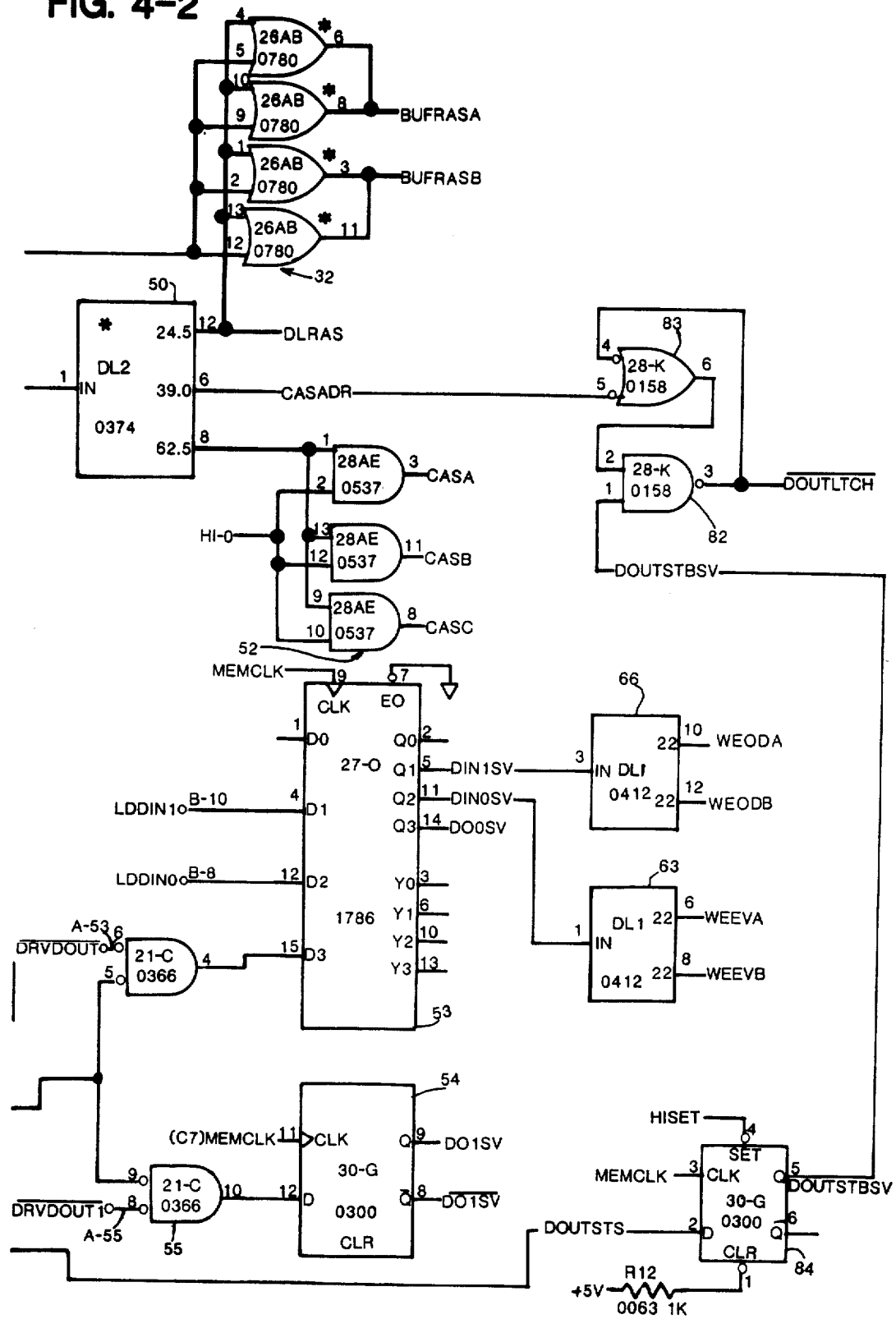

Referring to FIG. 4, physical address signals $\overline{\text{PA08}}$, $\overline{\text{PA09}}$, $\overline{\text{PA10}}$, $\overline{\text{PA11}}$, $\overline{\text{PA12}}$, and $\overline{\text{PA13}}$ are connected from the address bus 19 to comparitor 1. If the inhibit select signal INHSEL is asserted by the controller 23 all of the comparitors in the memory system are disabled. Ordinarily, a comparitor in each memory module responds to different combination of address signals to produce a module select signal $\overline{\text{MODSEL}}$ if the address combination corresponds to the address stored in the comparitor 1. The $\overline{\text{MODSEL}}$ signal is connected to multiplexer 36 in the same manner as are the row select signals and thereby produces from multiplexer 36 a Mod Select Latch signal ($\overline{\text{MODSELLTCH}}$).

The $\overline{\text{PRECHRG}}$ signal from controller 23 is inverted through inverter 70 to become the PRECHRG signal.

Exclusive Or gates 25 and 26, and gate 27 as well as Or/And gate 29 form the precharge logic circuit 24 of FIG. 2. The purpose of this circuit is to ensure that if the same row of the same memory module is selected in a current memory cycle as was selected in a previous memory cycle the row of memory elements is provided sufficient time to recover before being strobed during the current memory cycle. If we assume that during a previous memory cycle the same row of the same module was selected, then the RSELA and RSELB signals on the inputs of exclusive Or gates 25 and 26 will be identical to the stored versions of those signals RSELASV and RSELBSV. The RSELA and RSELV signals are provided by inverters 34 and 35, FIG. 3, while the RSELASV and RSELBSV signals are provided by D flip flop 37 in response to the address latch signal ADRLTCH. If the RSELA and RSELASV signals are the same and the RSELB and RSELBSV signals are the same, and if the same module had been selected immediately preceding the current selection the flip flop 37 would provide a MODSELSV signal in response to the persistance of a $\overline{\text{MODSELLTCH}}$ signal from multiplexer 36. Then And gate 27 would be enabled to provide a disabling signal to the lowest Or gate of Or/And gate 29 in response to the $\overline{\text{MODSEL}}$ signal. At this time the $\overline{\text{RAS}}$ signal would also provide a disabling input to the third and fourth lowest Or gates of gate 29. If the PRECHRG signal from the previous cycle is still be asserted, then gate 29 will not be able to produce the SETRAS signal from its output. As soon as the PRECHRG signal terminates, both of the lower two Or gates of gate 29 are enabled. At this point, the $\overline{\text{ADRSTB}}$ and $\overline{\text{MODSELLTCH}}$ signals have been asserted at the beginning of the current cycle, so that the termination of the PRECHRG signal initiates the SETRAS signal from gate 29. At the next MEMCLK signal following the production of SETRAS signal flip flop 31 produces the RAS signal and its inverted version $\overline{\text{RAS}}$. The RAS signal from flip flop 31 together with $\overline{\text{MODSELLTCH}}$ signal from mulitplexer 36 causes And gate 67 to produce the $\overline{\text{ANYRAS}}$ signal that is sent back to the controller 23. The RAS signal also is conducted through Or gate array 32 to form the BUFRASA and BUFRASB signals. BUFRASA and BUFRASB are logically identical and are used to produce the actual row address strobe signals through buffer inverters 72 and 73 as shown in FIG. 8. The BUFRASA or BUFRASB signal is gated through buffer inverters 72 and 73 as well as other identical buffer inverters (not shown) with the row selection signals RROW01, RROW23, RROW45 and RROW67 from gates 40 of FIG. 3. If, for example, the 01 row was selected then buffer inveter 72 would produce the following signals: P01RASLB, P01RASLM, P01RASLT, P01RASRT, P01RASR, and P01RASRB. As shown in FIGS. 10, 11, 12, and 13, the output signals from buffer inverter 72 are connected to all of the Row Address Strobe (RAS) input terminals of all of the memory elements of planes 0 and 1 of the memory module. Similarly, the output signals of buffer inverter 73 are connected (not shown) in the identical manner to all of the row address strobe input terminal memory elements in planes 2 and 3 of the memory. The row of the memory. The row address strobe signal from flip flop 31 is also input to delay device 50. The first signal out of delas DLRAS. The DLRAS signal is conducted to all of the Or gates in gate array 32 to extend the time period of BUFRASA and BUFRASB signals. It is also conducted to Nor gate 69, FIG. 3, to extend the time period during which multiplexer 36 is in its input "A" mode. The second signal from delay device 50 is the CASADR signal that is conducted as previously described to multiplexers 47 and 48 to switch the multiplexers to the column address portion of the address. The third signal from delay device 50 through And gate buffers 52 produces the CASA, CASB, and CASC signals, all of which are logically the same signal asserted at exactly the same time.

The $\overline{\text{MODSELLTCH}}$ signal from multiplexer 36 is input to flip flop 37 to form the MODSELSV signal and its inverted from $\overline{\text{MODSELSV}}$. Decoder 38, which is similar to decoder 41, receives the RSELBSV and RSELASV signals from flip flop 37 and a gate signal $\overline{\text{MODSELSV}}$ from flip flop 37 that is produced only when a module is selected. The output signals from decoder 38 through buffer And gates 39 form the column selection signals ROW01, ROW23, ROW45, and ROW67. The ROW01 signal is used to gate buffer inverters 74 and 75, while the ROW 23 signal is used to gate buffer inverters 76ed to gate buffer inverters 76 and 77. Buffer inverters 74 and 75, upon receipt of the ROW01 signal connect to CASA and CASC signals in the form of the signals P01CASLT, P01CASLB, P01CACASLM, P01CASRT, P01CASR, and P01CASRB to the column address strobe terminals of all the memory elements shown in FIGS. 10, 11, 12 and 13 to strobe the column address signal on the address inputs of the memory elements into the memory elements. Similarly, the ROW23 signal connects the CASA and CASC signals to the column address strobe terminals of all the memory elements (not shown) of planes 2 and 3 of the memory module. Four other identical buffer inverters (not shown) gate CAS signals in exactly the same manner to the planes 4 and 5 or 6 and 7 of the memory module.

In order to apply the address bits for both the row and column address to the address input terminals of the memory elements only when the memory elements are in a selected module or during a refresh cycle, gates 51 in FIG. 3 are used in conjunction with buffer inverters 78, 79, 80 and 81 to apply the row and column addresses to the memory elements in planes 0 and 1 of the memory. Or gates 51 initially receive the $\overline{\text{MODSEL}}$ signal from comparitor 1. Following the assertion of the address strobe signal multiplexer 36 provides $\overline{\text{MOD SELLTCH}}$ signal to the inputs of Or gates. During a refresh cycle which occurs periodically gates 51 of all the modules in the memory system produce the ADRENBA and ADRENBB signals that are used to gate the address buffers for planes 0 and 1, through buffer inverters 78, 79, 80, and 81, as well as gating the buffer inverters (not shown) for all the other planes (not shown) of the memory module.

Thus, the row and column addresses are simultaneously received by the memory module and are sequentially connected to the address input terminals of the memory elements and strobed into the elements using a delay line that presents these signals to the elements in a time sequence calculated to be optimal for the memory elements of a given module, and independently of the clock signals.

Figures 1, 5:
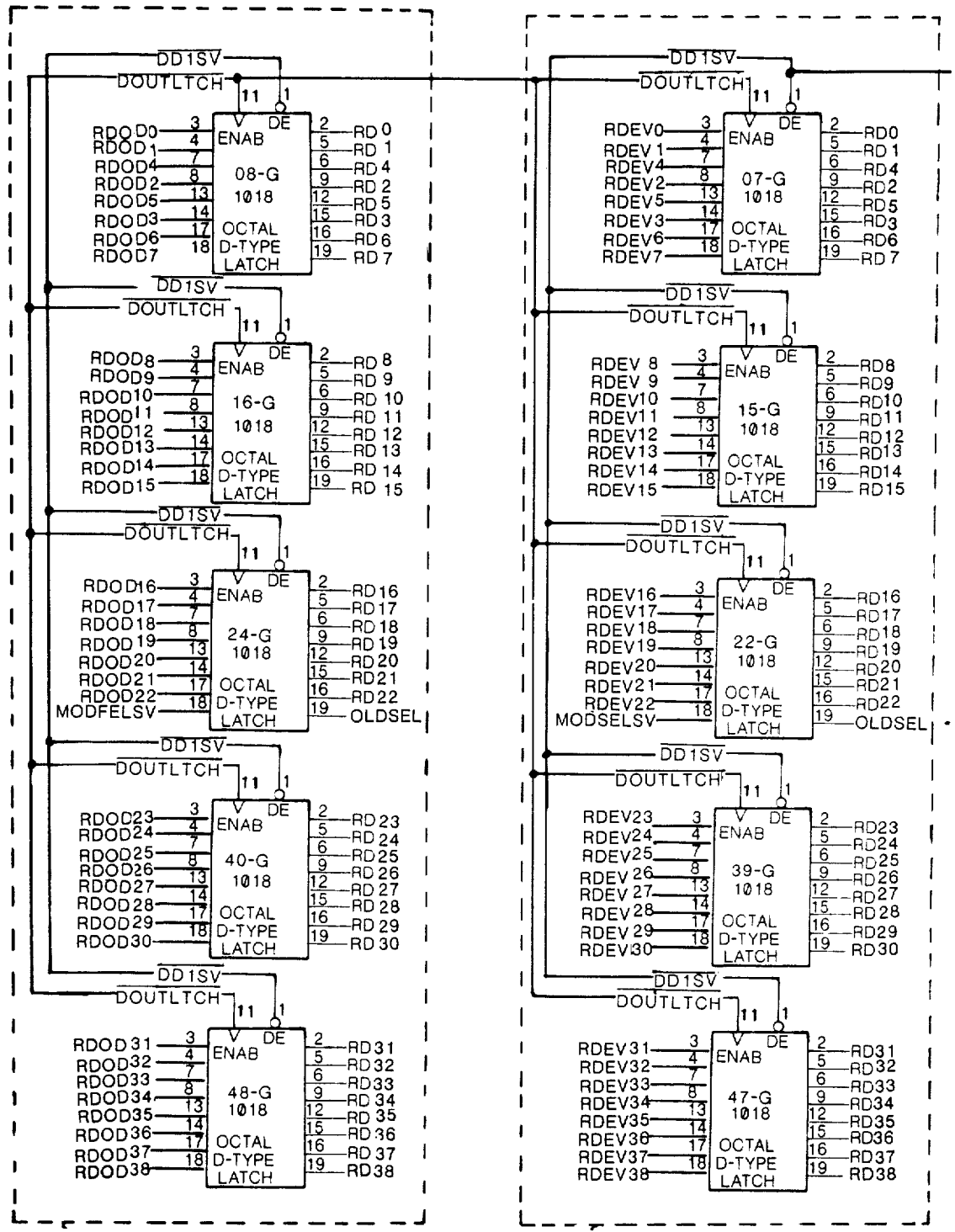
FIG. 5 is a schematic diagram of part of the memory module of FIG. 2.
Figures 2, 5:
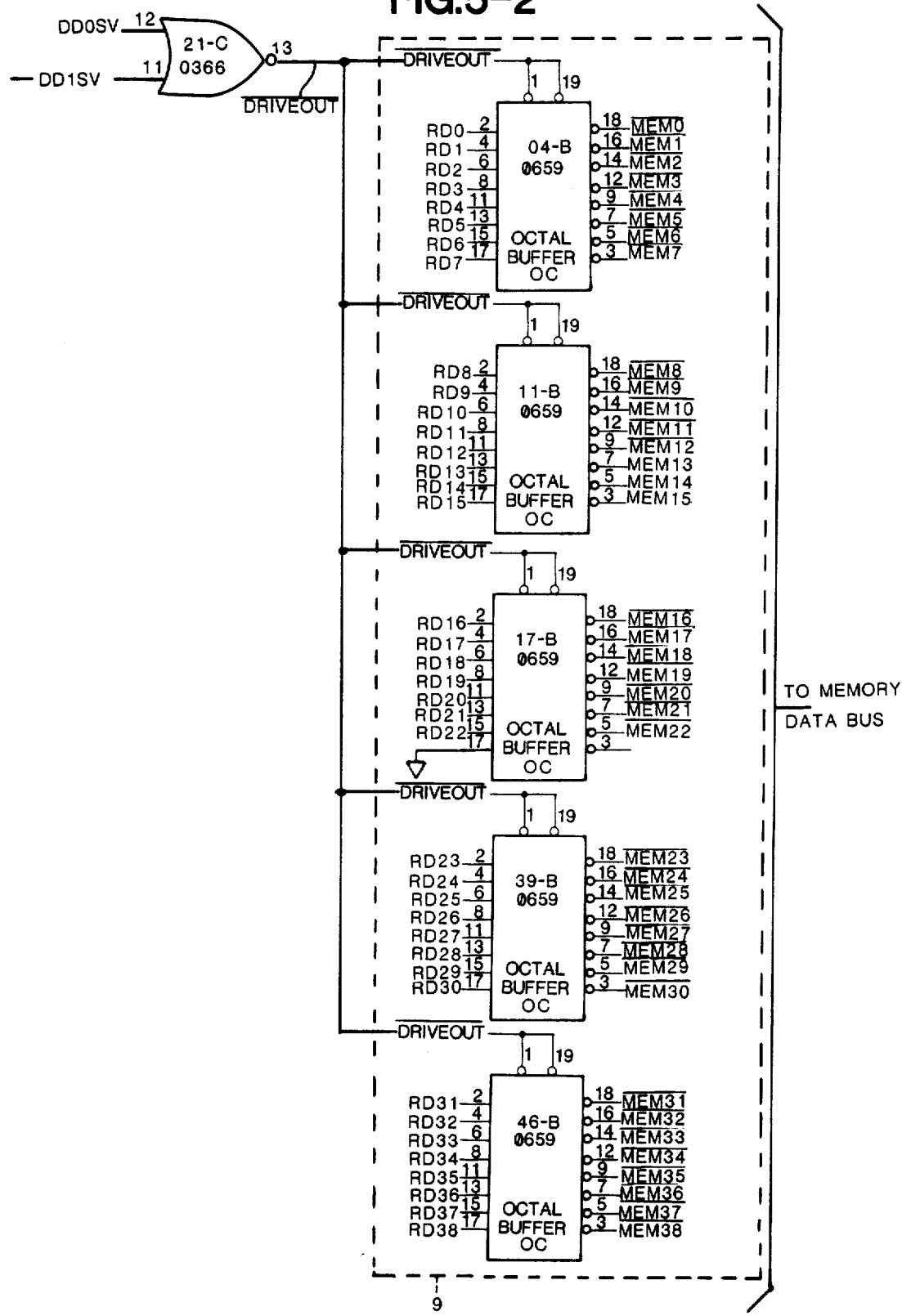

In response to the address signals and the RAS and CAS signals the memory elements output two 39 bit words. In response to the addresses applied to the memory elements and the row and column address strobe signals (RAS and CAS) the memory elements each provide a bit from their addressed location to an associated latch shown in FIG. 5. The outputs of the memory elements on the even numbered planes 0, 2, 4, and 6 are connected to even output latches 7, while the output of the memory elements on the odd planes 1, 3, 5, and 7 are connected to inputs of the odd output latches 8 of FIG. 5. Both 39 bit words are latched by the signal $\overline{\text{DOUTLTCH}}$ from Nand gate 82. Normally the CASADR signal from delay element 50 is a logical 0, thereby enabling gate 83 to provide an enabling signal to gate 82. Thus, when the data out strobe $(\overline{\text{DOUTSTB}})$ signal from controller 23 passes through inverter 59 and is input to D flip flop 84, the next MEMCLK signal causes flip flop 84 to provide the DOUTSTBSV signal to the other input of gate 82. This signal passes through gate 82 to produce the $\overline{\text{DOUTLTCH}}$ signal. In the event the column address strobe signal (CASADR) is being asserted the Or gate 83 will disable And gate 82 and delay the production of the $\overline{\text{DOUTLTCH}}$ signal until the column address strobe has terminated. In addition to latching the output signals from all the memory elements, latches 7 and 8 also latch the MODSELSV signal. Since the output of latch 8 is enabled by the inverse of the signal that enables the output of latch 7, the output of one of these latches is always enabled. Thus, once the $\overline{\text{DOUTLTCH}}$ enables the input of latches 7 and 8 the MODSELSV signals on the inputs of latches 7 and 8 will result in the OLDSEL signal on the output of one of the latches. The OLDSEL signal on the input of gate 58 enables the gate and indicates that output data has been latched. Thus on the receipt of the DOUTSTB signal And gate 58 produces a signal that is inverted by Nor gate 56 and enables both And gates 55 and 61. If the requester requires that the even memory word be read out of the latch 7 then the controller will send the $\overline{\text{DRVDOUT}}$ signal to gate 61, which will be passed to D flip flop 53. At the next MEMCLK signal the flip flop 53 will produce the DD0SV signal. On the other hand, if the odd word is to be read out the controller 23 provides the $\overline{\text{DRVDOUT1}}$ signal to And gate 55. Flip flop 54, in response to the output of gate 55 produces the $\overline{\text{DD1SV}}$ signal and the inverted form of that signal DD1SV at the next MEMCLK signal following the insertion of $\overline{\text{DRVDOUT1}}$ signal. Referring to FIG. 5, if the odd latches 8 are to be read out the $\overline{\text{DD1SV}}$ flip flop 54 provides an output enable signal to latch 8 and places the contents of latch 8 on the input terminals of buffer inverter 9. Buffer inverter 9 is used as an output driver to drive the contents of the latches on to the memory bus in the form of the signals $\overline{\text{MEM0}}$ through $\overline{\text{MEM38}}$. If the even signals are to be placed on the input terminals of buffer inverter 9 the DD1SV signal from flip flop 54 is a 0 signal, thereby enabling the output of latch 7. Either of the signals DD1SV or DD0SV produces the $\overline{\text{DRIVEOUT}}$ signal to cause the buffer inverters 9 to place the data signal on the memory bus.

During a full write operation of the memory the signals $\overline{\text{DOUTSTB}}$, $\overline{\text{DRVDOUT0}}$, and $\overline{\text{DRVDOUT1}}$ are not asserted by the controller 23. Instead, in addition to the ADDRESS STROBE and PRECHARGE signals the controller 23 provides the signals LOAD DATA IN ODD or LOAD DATA IN EVEN. The LOAD DATA IN ODD (LDDIN1) signal and the LOAD DATA IN EVEN (LDDIN0) signals are connected to flip flop 53. In response to the next MEMCLK signal flip flop 53 produces either of the data in 1 save (DIN1SV) signals or the Data In Even (DIN0SV) signals. These signals are connected to delay devices 63 and 66. In response to the DIN1SV signal delay device 63 produces the WEODA and WEODB signals. Both of these signals are produced at the same time and are therefore the logical equivalants of each other. Similarly the DIN0SV signal on delay device 66 produces the WEEVA and WEEVB signals.

Figures 1, 6:
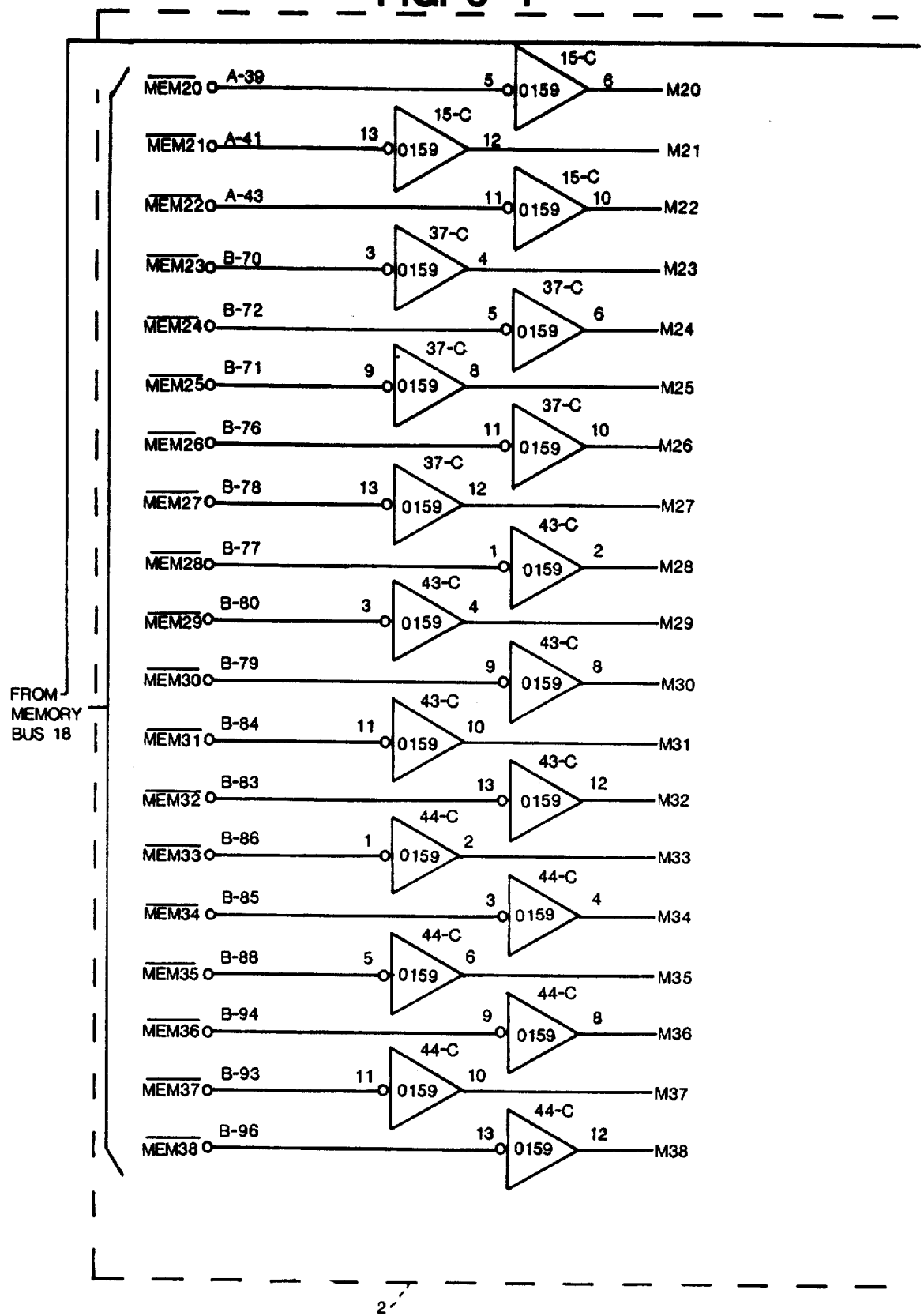
FIG. 6 is a schematic diagram of part of the memory module of FIG. 2.
Figures 2, 6:
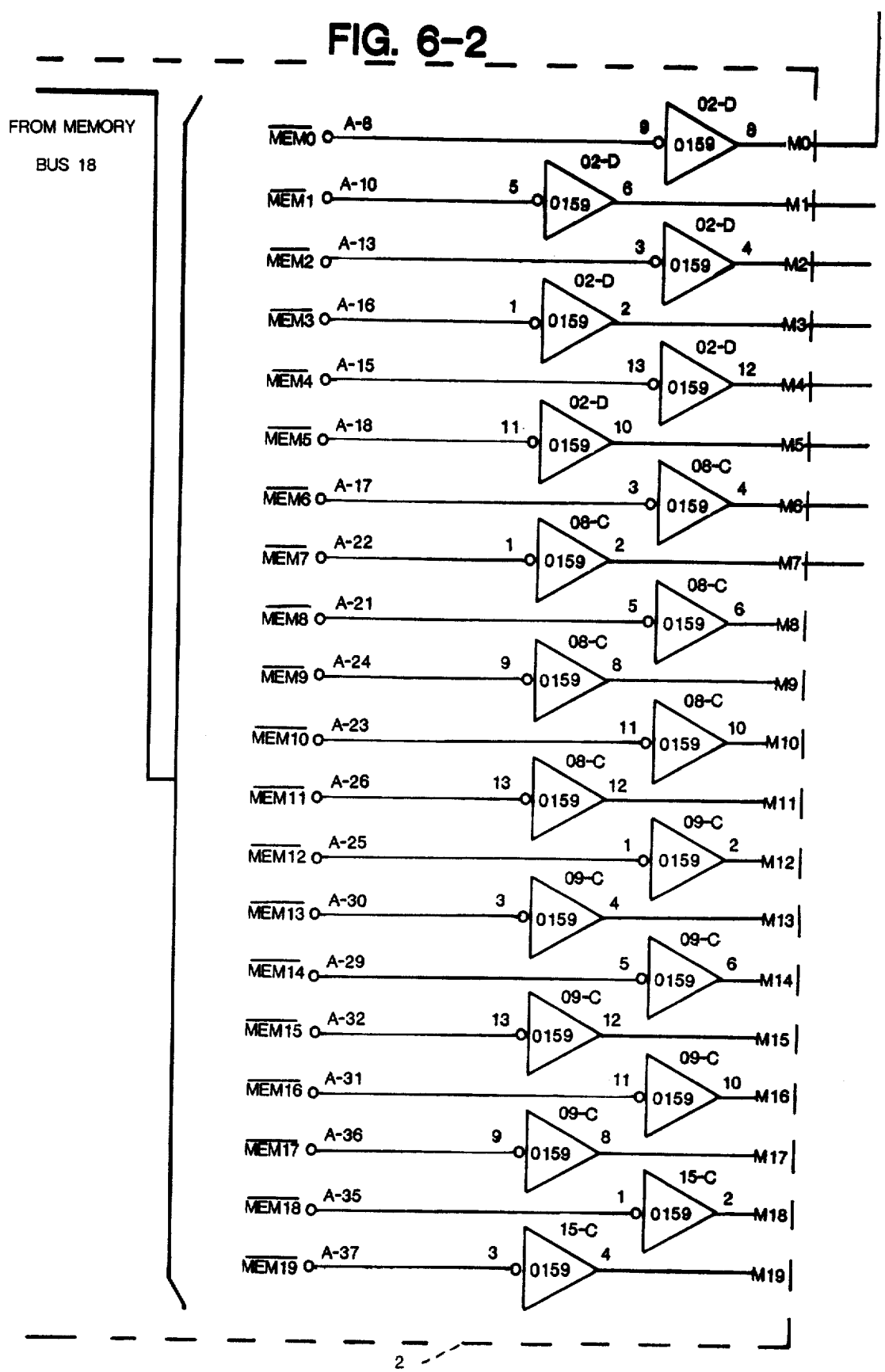
Figures 3, 6:
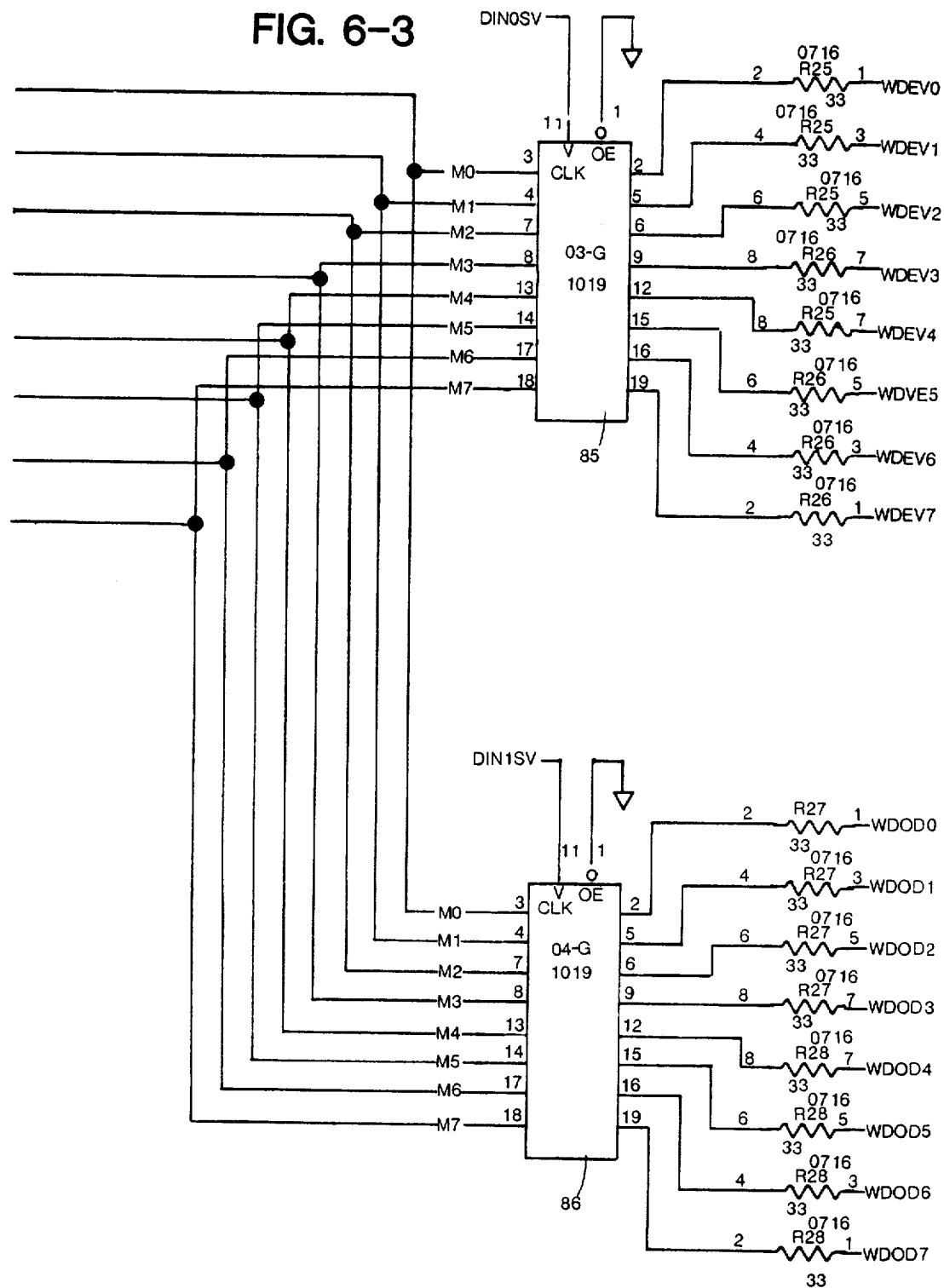
Figure 7:
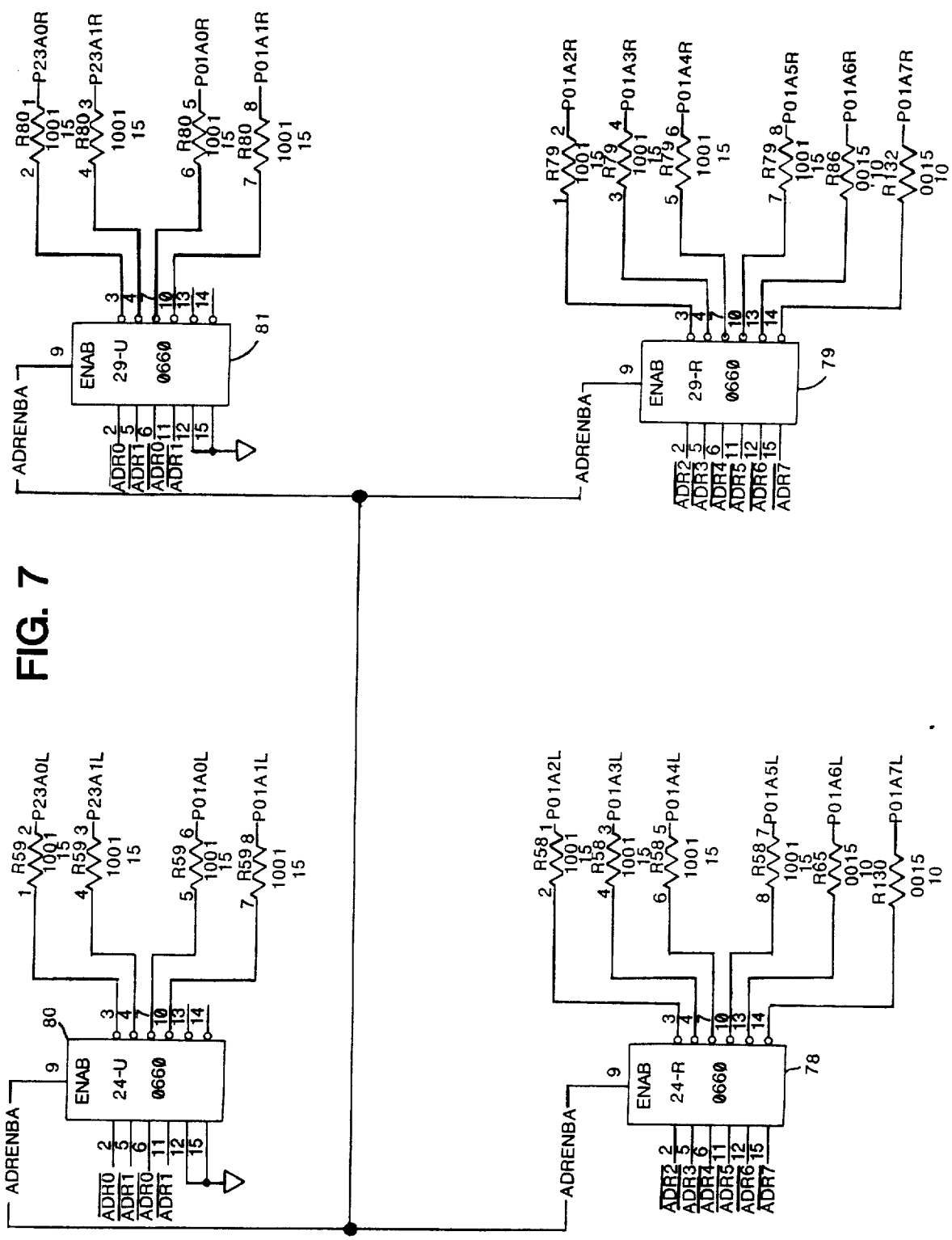
FIG. 7 is a schematic diagram of part of the memory module of FIG. 2.
Figures 1, 11:
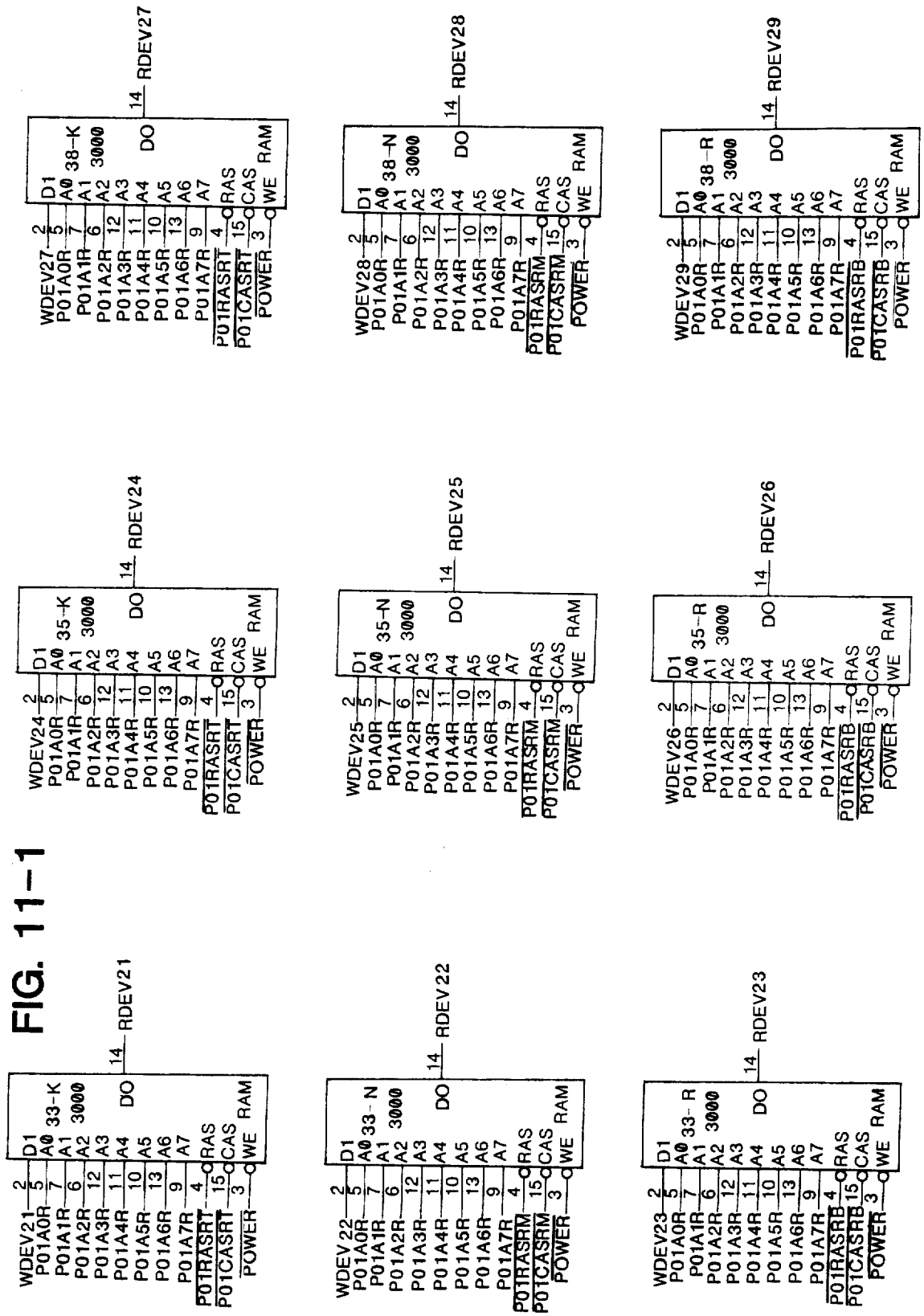
FIG. 11 is a schematic diagram of part of the memory module of FIG. 2.
Figures 2, 11:
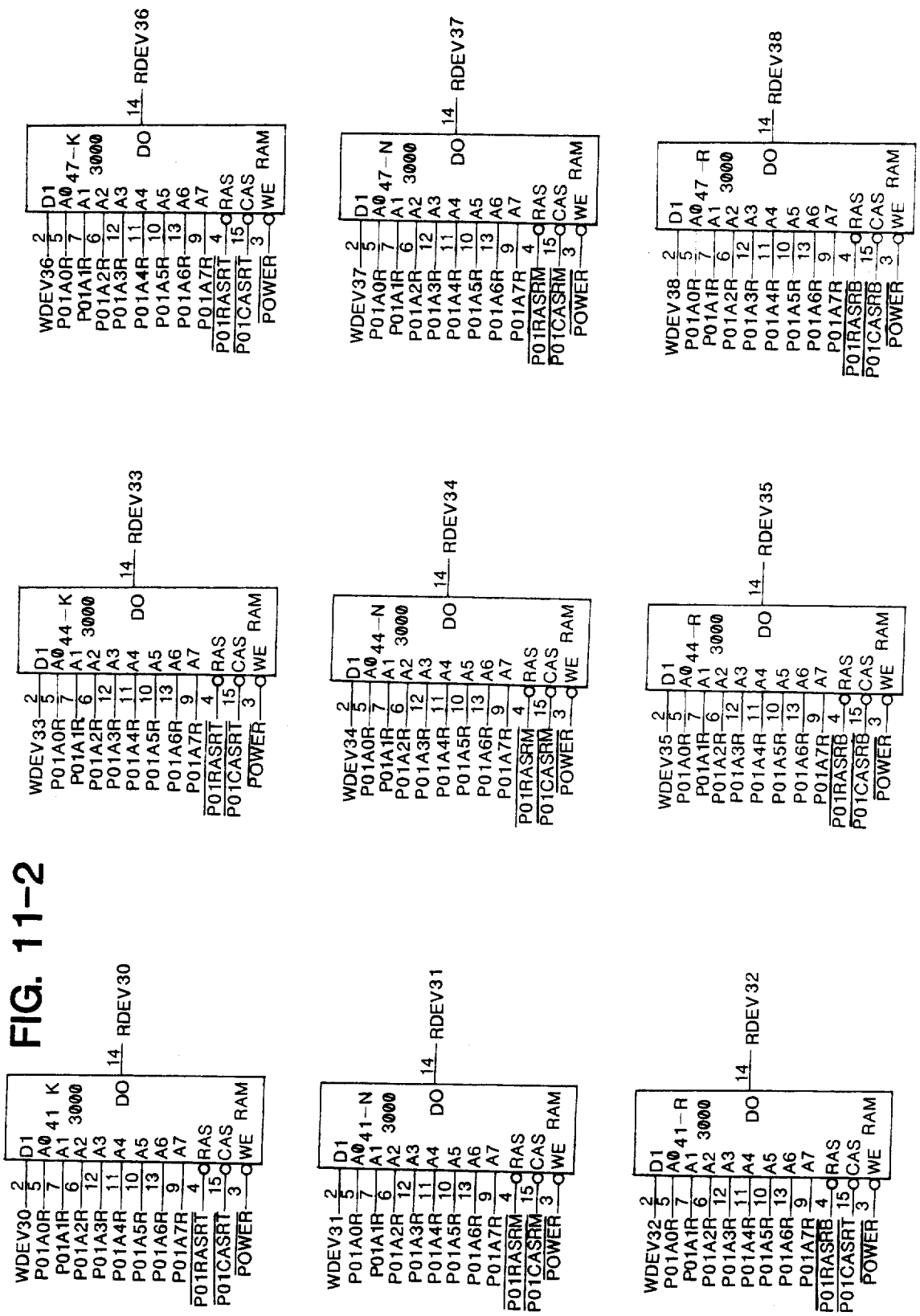
Figures 3, 12:
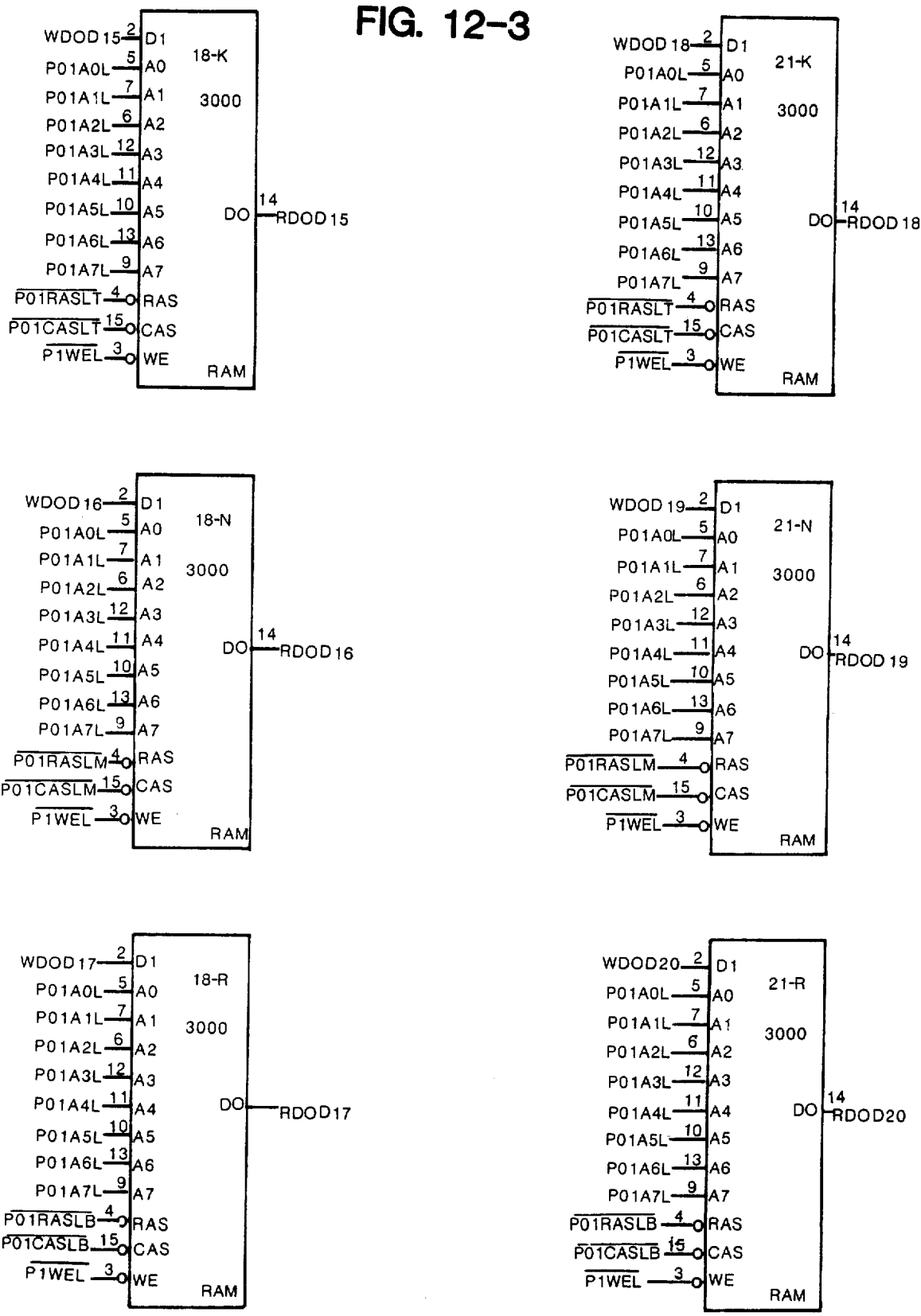
FIG. 12 is a schematic diagram of part of the memory module of FIG. 2.

In addition to the address signal the controller also transmits on the memory data bus 18 an information word to be written on either of the odd or even sides of a particular memory location in a a particular module of the memory device. The data signal from the memory data bus 18 is connected through buffers 2 to registers 85 and 86. Register 85 is one of five substantially identical such registers (4 not shown) that form data-in register 5 of FIG. 2. Register 86 is similarly one of five (4 not shown) registers that form data-in register 6 of FIG. 2. The additional registers, of course are necessary to accommodate the remaining 30 bits of the information word. As shown in FIG. 6, the DIN0SV signal clocks the data word from buffers 2 directly to data input terminals of the memory elements. The output of register 85 is connected to the even memory planes 0, 2, 4, and 6, while the output of register 86, in response to the DIN1SV signal is connected to the odd memory planes 1, 3, 5, and 7. Row selection during a read cycle is accomplished in exactly the same manner as during a write cycle of the memory.

CONTROLLER DESCRIPTION

Controller 28 requires a three bit command input from whatever CPU it is used with in order to control the memory circuits. The three memory command bits MC0, MC1, MC2 cause the memory controller to perform seven different control functions and also provide a null state as shown in the following examples:

| MC | MEMORY CONTROL SIGNALS | | | |
|---|---|---|---|---|
|  | 0 | 1 | 2 |  |
| | 0 | 0 | 0 | NO OP (null state) |
| | 0 | 0 | 1 | READ DOUBLE WORD |
| | 0 | 1 | 0 | READ QUAD WORD |
| | 0 | 1 | 1 | READ MODIFY WRITE |

-continued

| MC | MEMORY CONTROL SIGNALS | | | |
|---|---|---|---|---|
|  | 0 | 1 | 2 |  |
| 1 | 0 | 0 |  | WRITE QUAD WORD |
| 1 | 0 | 1 |  | WRITE DOUBLE WORD |
| 1 | 1 | 0 |  | WRITE WORD |
| 1 | 1 | 1 |  | WRITE BYTE |

Figures 1, 14:
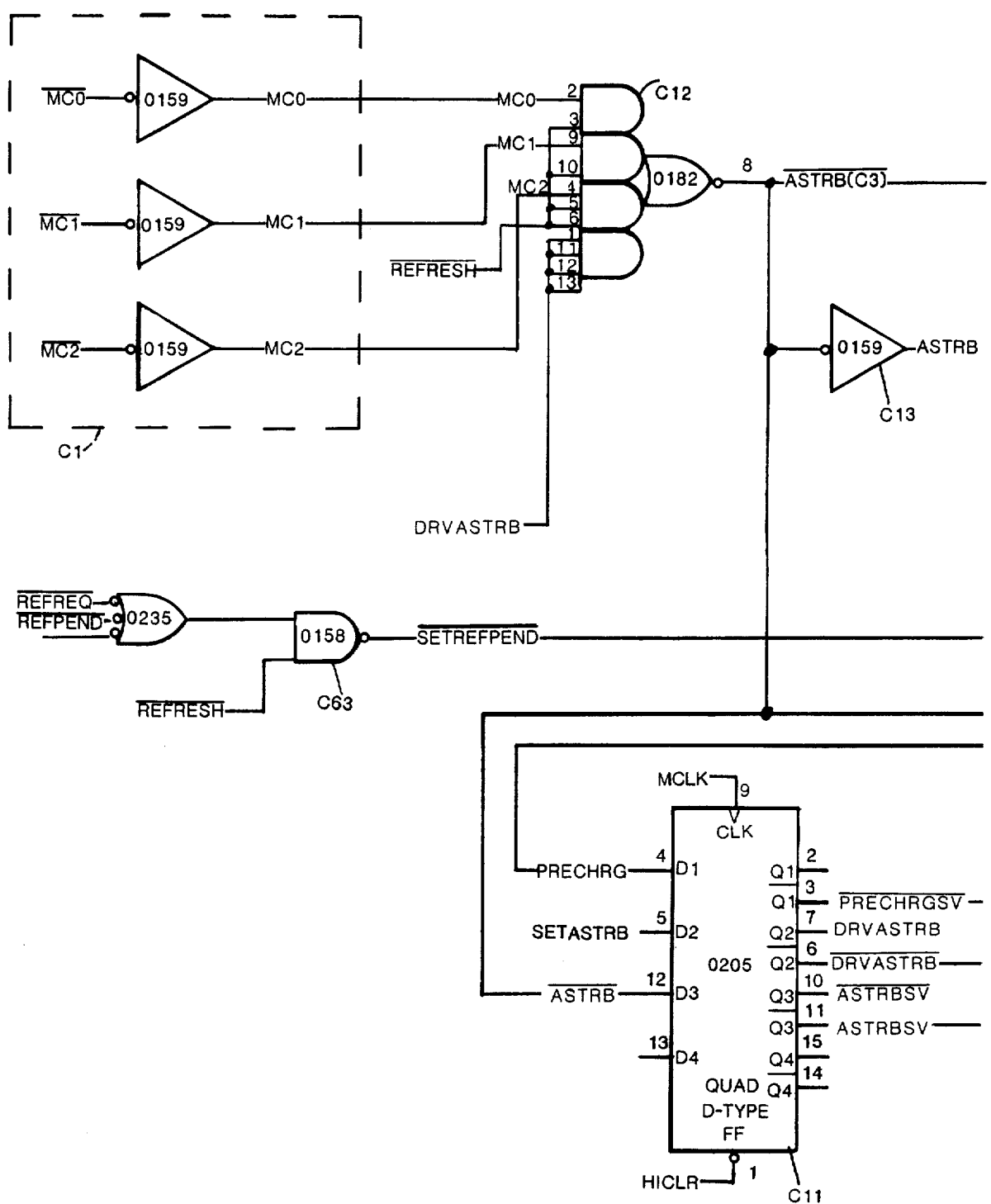
FIG. 14 is a schematic diagram of a portion of the memory controller.
Figures 2, 14:
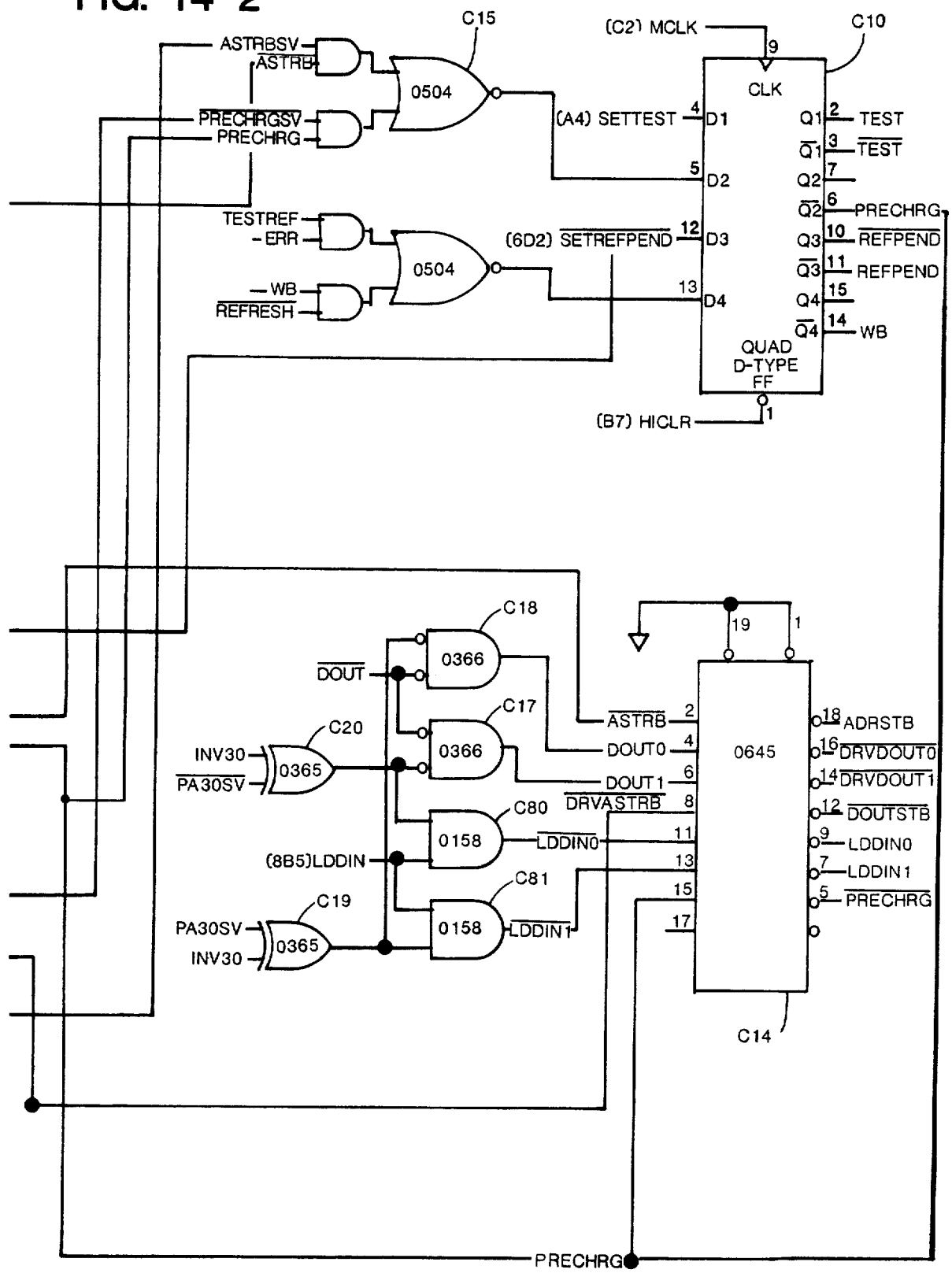

As shown in FIG. 14, the MC0, MC1 and MC2 are inverted by inverter amplifiers C1 and converted into the signals MC0, MC1, and MC2. Two line multiplexer C2 in FIG. 15 receives the signals MC0, MC1 and MC2 on its A1, A2 and A3 inputs and normally provides these signals on three of its output terminals as SETCPA1, SETCPA2 AND SETCPA3 signals as preset inputs for the most significant bits of this counter. If all of the equipment is operating properly each of the two count enable signals for the counter C3 will be logical "1" and the counter C3 will change its output upon each memory controller clock (MCLK) signal. The output of counter C3, signals CPA1-CPA7 and REFRESH, is connected to two programmable read-only memories C4 and C5.

The SETCPA1, SETCPA2, SETCPA3 signals are loaded in parallel into counter C3 in response to a "0" level in the signal RUNNING. The signal RUNNING, prior to the receipt of the MC0, MC1, MC2 signals is a logical "0". In addition, the next number produced by the counter C3 following each read or write memory cycle is a number that causes prom C5 to output a SETEND signal. The SETEND signal is latched by flip flop C6 on the receipt of the next MCLK pulse to produce the END signal. NAND gate C7, FIG. 15, receives the END signal on one of its inputs as a high signal between memory cycles. The other input of NAND gate C7 is connected to the output of NOR gate C8. While normally providing a logical "1" output NOR gate C8 produces a logical "0" output as soon as it receives any one of the CPA1, CPA2;, CPA3 or REFRESH signals.

The high END signal keeps the RUNNING signal low between memory read, write and refresh cycles. When the SETCPA1, SETCPA2, SETCPA3 or SETREF signals are received by counter C3 the low RUNNING signal parallel enables these signals to preset the counter to a count corresponding to the selected memory cycle. At the same time nor gate C8 in response to the counter output signals CPA1, CPA2, CPA3, and REFRESH outputs a logical "0", enabling NAND gate C7. The output of counter C3 at this time no longer corresponds to the END signal, so that the prom is C5 changes the SETEND output signal to a logical "0". On the next MCLK pulse flip flop C6 changes the END signal to a logical "0", resulting in a high level in the RUNNING signal from NAND gate C7, thereby permitting the counter C3 to run, conditional on the count enable input STOPSTATE from ANDNOR gate C9 remaining high.

In summation, the SETEND output from prom C5, present at the end of each memory cycle and during periods when the memory is inactive, causes flip flop C6 to produce the END signal . This in turn results in a "0" signal level in the RUNNING signal from NAND gate C7 and enables the SETCPA1, SETCPA2, SETCPA3 and SETREF signals from multiplexer C2 to preset counter C3 when a memory request is received in the form of a "0" level on one or more of the signals MC0, MC1, and MC2. The counter C3 then provides an output signal CPA1, CPA2, CPA3, CPA4, CPA5, CPA6, CPA7, and REFRESH that causes the SETEND signals from prom C5 to change to a "0" level. The next MCLK pulse on prom C6 changes the END signals to a "0" level and enables NAND gate C7. In addition at least one of the CPA1, CPA2, CPA3, REFRESH signals from counter C3 is then at a "1" level, thereby causing NOR gate C8 to output a "0" signal. The RUNNING signal from NAND gate C7 then changes to a logical "1", permitting counter C3 to begin counting forward from the number preset by the SETCPA1, SETCPA2, SETCPA3 and SETREF signals.

The first instruction of any memory cycle includes the signal set address strobe (SETASTRB) from prom C4. Flip flop C11, FIG. 14, latches the SETASTRB signal and produces the drive address strobe (DRVASTRB) signal.

Upon the receipt of any of the memory request signals MCC, MC1, MC2, ANDNOR gate C12 provides a logical "0" level as an address strobe barred signal $\overline{ASTRB}$ that is inverted by inverter C13 to produce the address strobe (ASTRB) signal, provided that the memory is not in a REFRESH operation. During such a REFRESH operation the $\overline{REFRESH}$ signal would be a logical zero, thereby inhibiting those portions of AND-NOR gate C12 that receive the MC0, MC1, and MC2 signals from producing the $\overline{ASTRB}$ signal. The DRVASTRB signal from flip flop C11 is connected to an input of ANDNOR gate C12 to produce the ASTRB signal independent of the state of the REFRESH and MC0, MC1, MC2 signals. The $\overline{ASTRB}$ signal is connected to driver C14, thereby producing the signal ADDRESS STROBE (ADRSTB) that is connected to inverter 33 of the memory module.

The $\overline{ASTRB}$ signal from AND NOR gate C12 is passed to AND/NOR gate C15 as one of its inputs. Connected to another input of this gate is the signal Address Strobe Saved (ASTRBSV). This signal is generated at an output of latch C11 in response to the next MCLK signal following the receipt of an $\overline{ASTRB}$ signal from gate C12 at an input of the latch. Initially the ASTRBSV signal is a logical "0", while the $\overline{ASTRB}$ signal is in a logical "1" state. Upon the receipt of one or more of the signals MC0, MC1, and MC2 gate C12 changes the $\overline{ASTRB}$ signal to a logical "0", while in response to this change the signal ASTRBSV changes to a logical "1" following the receipt by latch C11 of the next MCLK pulse. During these transitions the ASTRBSV and $\overline{ASTRB}$ inputs of gate C15 are never concurrently logical "1". Thus the output of this gate remains set at logical "1". As described above, the MC0, MC1, MC2 signals also cause prom C4 to produce the SETASTRB signal and in turn causes flip flop C11 to produce the DRVASTRB signal after the next MCLK pulse, thereby forcing Gate C12 to continue producing the ASTRB signal after the MC0, MC1, MC2 signals have terminated. During most of the memory cycles commanded by the memory request signals MC0, MC1, MC2 the SETASTRB signal from prom C4 and thus the ASTRB signal from gate CR will change logical state several times. When ASTRB changes from a logical "0" to a logical "1" the output of gate C15 changes to a logical "0". In response to the output of gate C15 flip flop C10 provides the PRECHRG signals for the memory module through driver C14 in the form of a PRECHRG signal.

The PRECHRG signal is also connected to flip flop C11. On the next MCLK signal following the generation of the PRECHRG signal flip flop C11 produces the $\overline{\text{PRECHRGSV}}$ as a logical "0".

The PRECHRG and $\overline{\text{PRECHRGSV}}$ are connected to additional input terminals of AND/NOR GATE C15. Initially, the $\overline{\text{PRECHRGSV}}$ signal is a logical "1" and the PRECHRG signal is a logical "0". On the MCLK signal after the ASTRB and ASTRBSV signals reach a logical "1" state the PRECHRG signal is generated. This signal, combined with the initial logical "1" state of the signal $\overline{\text{PRECHRGSV}}$ maintains the logical "0" output of gate 15 through the next following MCLK whereupon flip flop changes the $\overline{\text{PRECHRGSV}}$ signal to a logical "0" state. Gate C10 changes the PRECHRG signal to a logical "0" upon the MCLK signal following the change of the $\overline{\text{PRECHRGSV}}$ signal to a logical "0", thus ensuring that the PRECHRG signal will persist for at least two MCLK periods.

Read Cycle

Figures 1, 16:
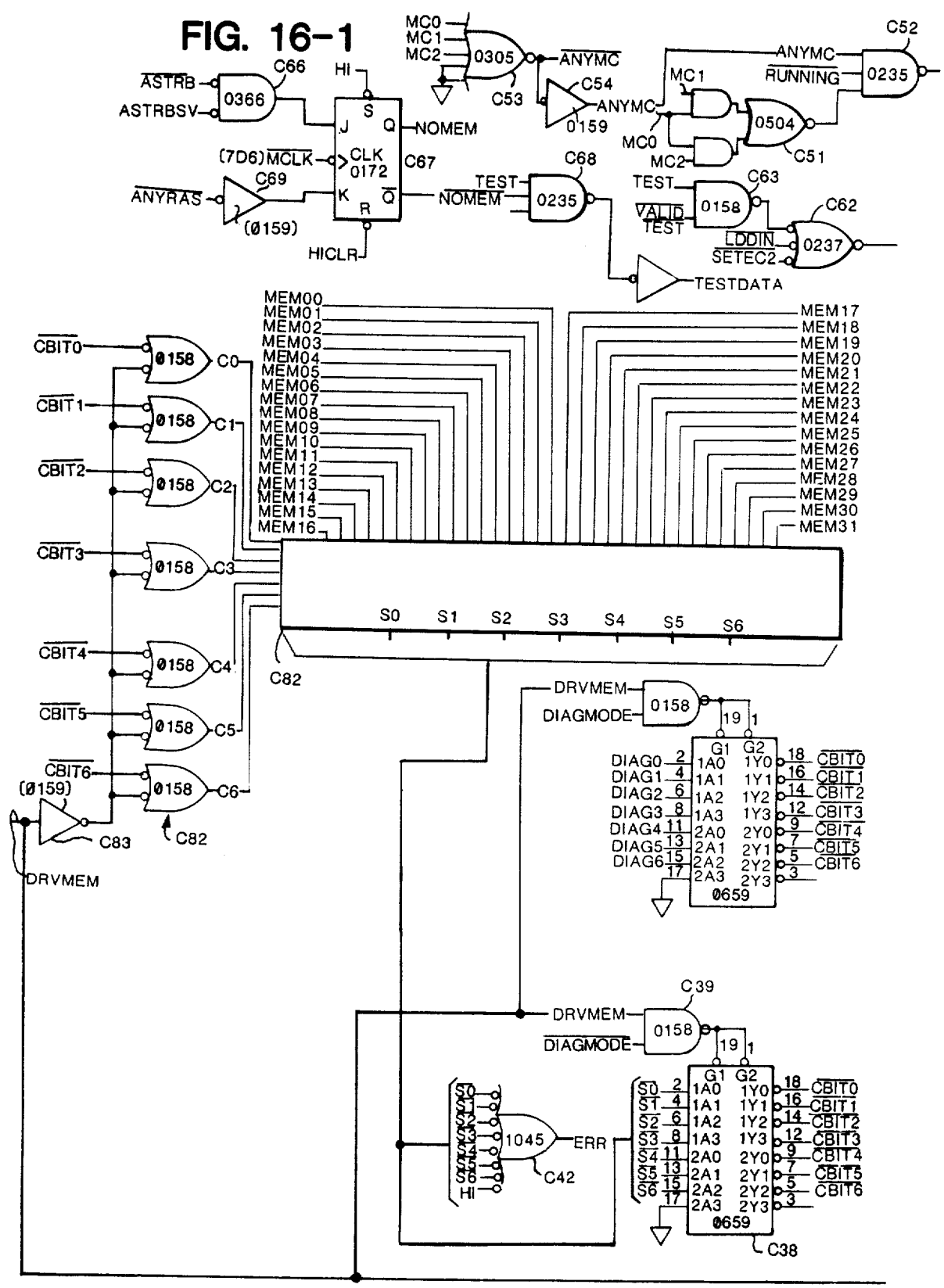
FIG. 16 is a schematic diagram of a portion of the memory controller.
Figures 2, 16:
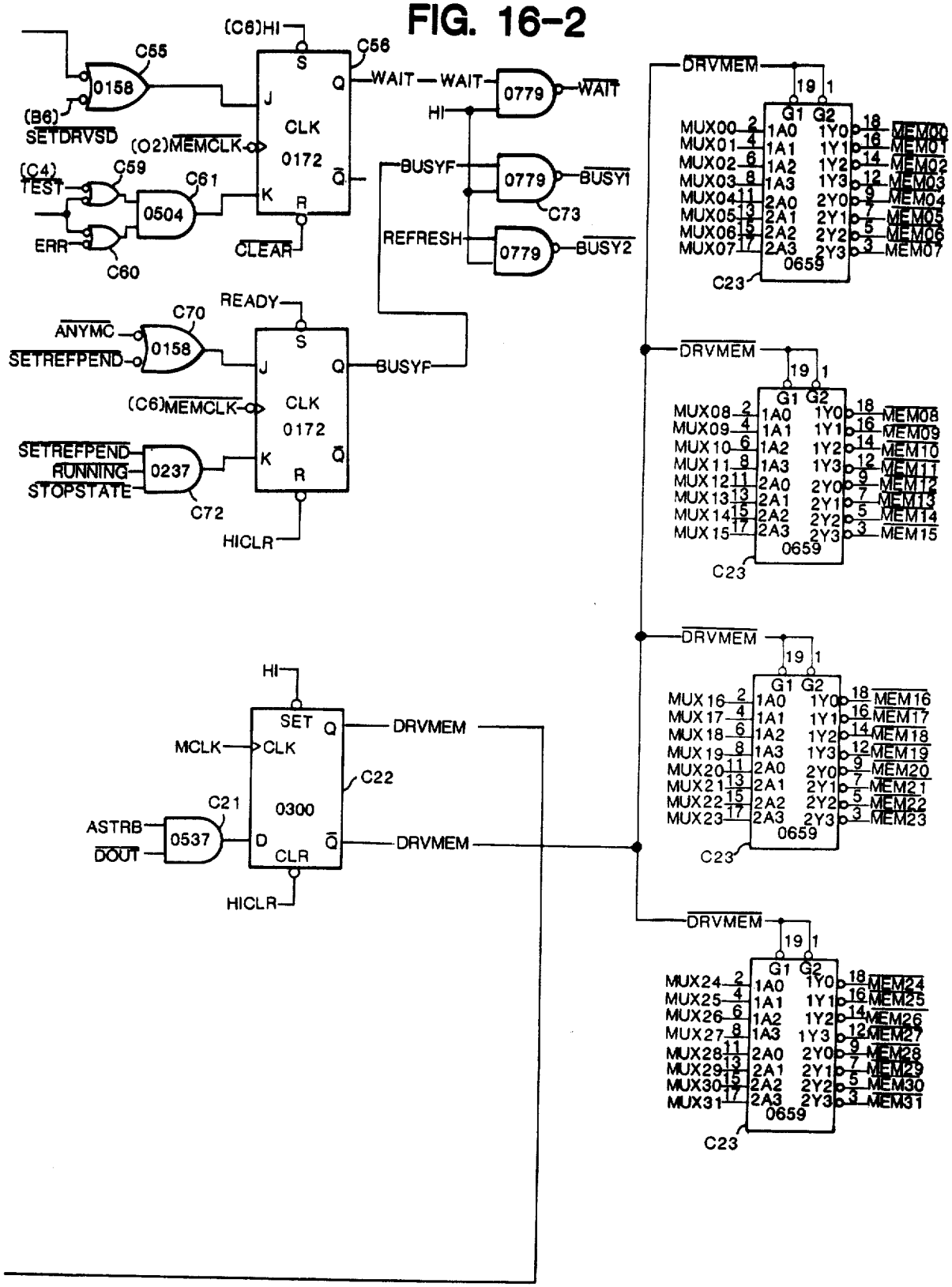

After the ADRSTB and PRECHRG signals are transmitted to the memory the signals $\overline{\text{DOUTSTB}}$, $\overline{\text{DOUT0}}$ and $\overline{\text{DOUT1}}$ are generated as follows. The output of prom C4, when provided with the preset output of counter C3, provides the signal $\overline{\text{SETDOUT}}$. The $\overline{\text{SETDOUT}}$ signal is conducted to an input of flip flop C6 and, upon the next MCLK pulse, the flip flop provides a $\overline{\text{DOUT}}$ signal. The $\overline{\text{DOUT}}$ signal from flip flop C6 and the ASTRB signal from inverter C13 are connected to AND gate C21 as shown in FIG. 16. Flip flop C22 receives the output of AND gate C21, and, after the next following MCLK pulse, outputs a $\overline{\text{DRVMEM}}$ signal to disable memory bus drivers C23. Driver C14 inverts the $\overline{\text{DRVASTRB}}$ signal from prom C11 and provides the $\overline{\text{DOUTSTB}}$ signal for the memory.

The DOUT signal from flip flop C6 is also fed as a gating signal to inverted input AND gates C17 and C18. AND gate C18 receives the latched version of one of the address bits PA30SV from exclusive OR gate C19, while gate C17 receives the inverted version of that address bit DA30SV through exclusion OR gate C20. Thus, the DOUT0 and DOUT1 signals are generally selected by address bit PA30. In the event that the effect of address bit PA30 on the selection of the DOUT1, DOUT0 signals is to be inverted, the signal INV30 is used. As shown in FIG. 14, INV 30 is connected in common to exclusive OR gates C19 and C20. The INV30 signal is generated by flip flop C6 in response to the next MCLK signal following receipt from PROM C4 of the SETINV30 signal.

The DOUT0 and DOUT1 signals are amplified in power and inverted by driver-inverter C14 to form the signals DRVDOUT0 and DRVDOUT1 (drive data out even and odd). These signals select the plane from which the 39 bit word is read out of the memory during a read cycle.

The information read out of the memory module passes into the controller on data bus 18 to inverter drivers C41, the output of which forms the thirty-two MEM0 through MEM31 signals. These signals are latched by latch C40 in response to the $\overline{\text{LTCHMEM}}$ signal.

Address bit PA30 is used during a read operation where a 32 bit word is to be accessed from the memory to determine which of two 32 bit words is to be read first. When a 16 bit word is to be read the signal PA 31 is used to control the sequence of the 16 bit word portions to be read. The PA30SV, $\overline{\text{PA30SV}}$ and the SA31SV signals are provided by flip flop C16. Flip flop C16 also provides the BYTESELSV (Byte Select Save) signal during a Byte read operation. The PA30SV and $\overline{\text{PA30SV}}$ signals are produced in response to a PA30 signal on an input of flip flop C16. Gated buffer C24 passes the signal $\overline{\text{SA30}}$ from the computer's system address bus, FIG. 1, to flip flop C16 as the memory address signal $\overline{\text{PA30}}$. Buffer C24 is only inhibited from passing the $\overline{\text{PA30}}$ signal during the refresh mode of the memory. The signal SA31 is connected to flip flop C16 directly from the computer system address bus. Flip flop C16 is clocked by the ASTRBSV signal from flip flop C11.

Figures 1, 18:
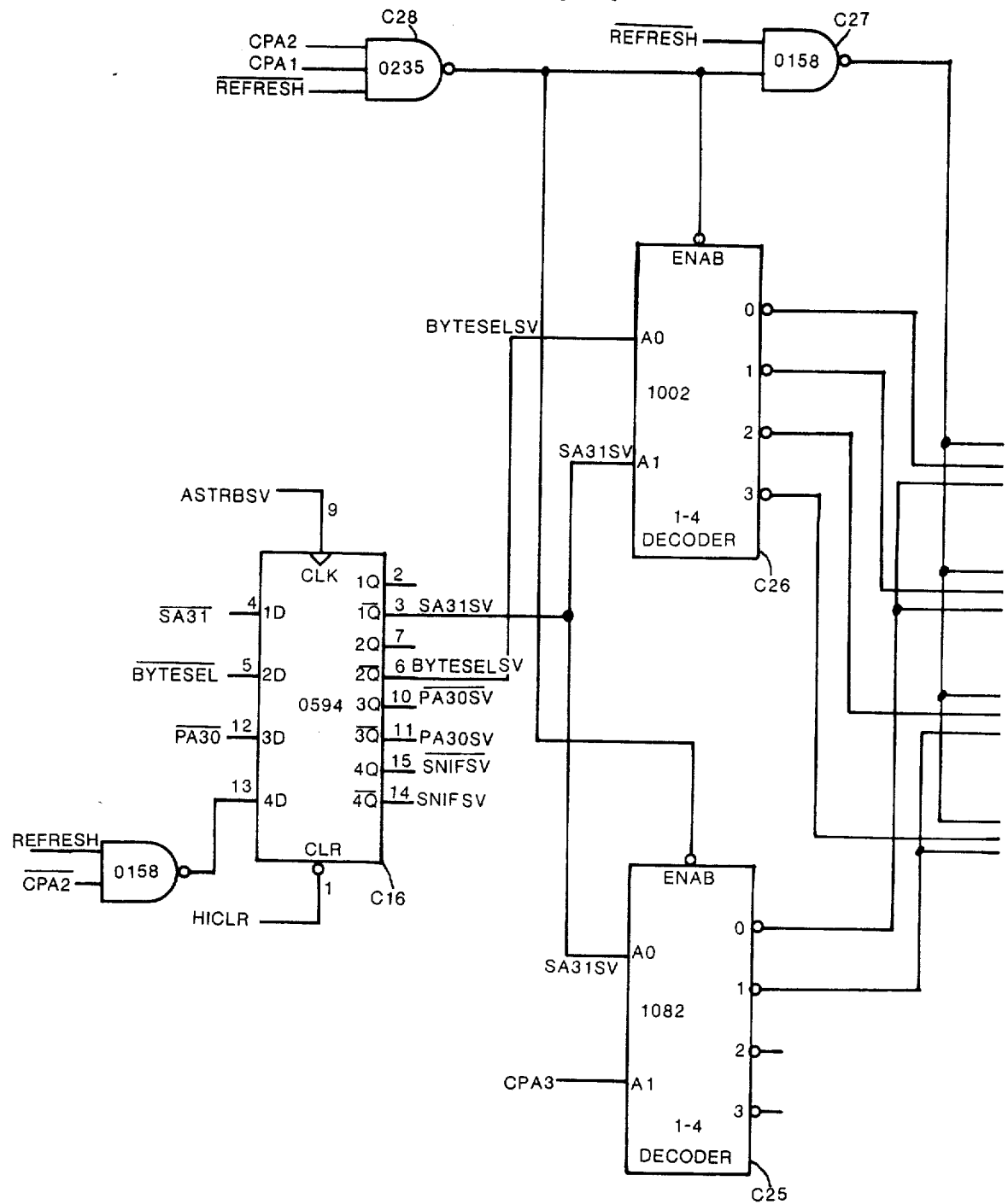
FIG. 18 is a schematic diagram of a portion of the memory controller.
Figures 2, 18:
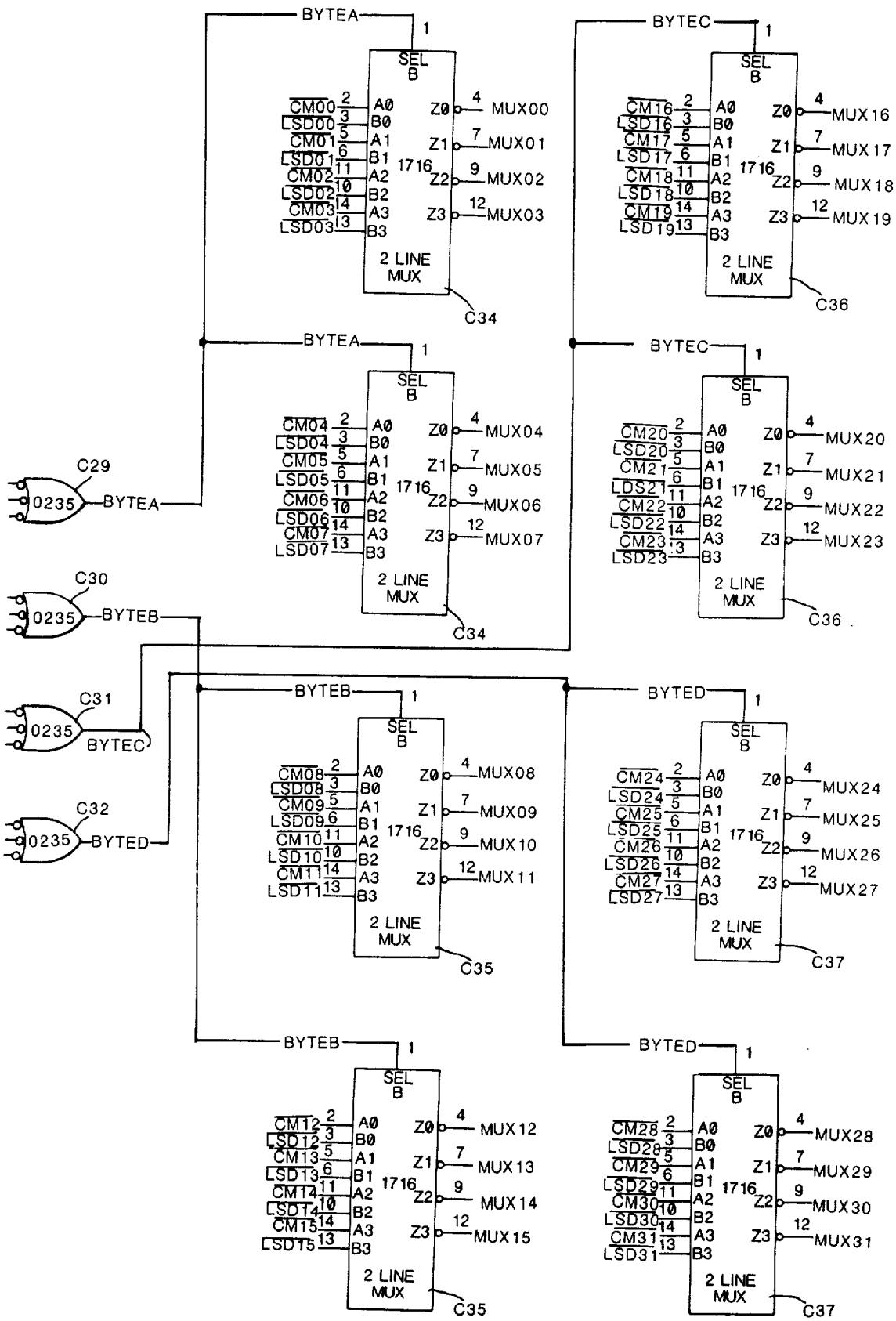

Byte selection is accomplished by 1–4 decoders C25 and C26 as shown in FIG. 18, NAND gates C27 and C28 and NOR gates C29, C30, C31, C32. Decoder C25 permits the selection of two bytes at a time to be written into the memory by generating pairs of byte select signals. If CPA3 is at its "0" level and gate C28 is enabled, then the state of the signal SA31SV on the input of Decoder C25 will determine whether the signals BYTEA and BYTEB are generated by gates C29 and C30 or the signals BYTEC and BYTED are generated by gates C31 and C32. If, on the other hand the signal CPA 3 is a logical "1" then no paired byte selection can be made. Single byte selection is effected by decoder C26 using combinations of the signals SA31SV and BYTESELSV to enable one of gates C29, C30, C31 and C32. In the REFRESH mode both of gates C27 and C28 are disabled by the $\overline{\text{REFRESH}}$ signal and no byte selection can be made. Furthermore, in order for a byte selection to occur, the signals CPA1 and CPA2 must be present indicating a "write word" or "write byte" cycle. During the writing of information into the memory the $\overline{\text{REFRESH}}$ signal will normally be a logical "1", thereby enabling both gates C27 and C28. If the desired mode of information access is a word write rather than a byte write, either or both of signals CPA2 and CPA1 will be at a logical 0. In this case gate C28 will output a logical "1" and gate C27 will case all of gates C29, C30, C31 and C32 to provide their respective outputs BYTEA, BYTEB, BYTEC and BYTED.

Thus, the memory was started, and at the appropriate time the correct DRVEDOUT signal was generated which causes the memory to output the selected date onto the data bus 18. The data enters the controller 28 through inverter-buffers C41, FIG. 20, and is latched by latch C40 in response to the LATCH MEMORY DATA BUS signal ($\overline{\text{LTCHMEM}}$) provided that the signals are valid.

Assuming that valid signals are present, the latched signals from the memory data bus LMEMO-LMEM31 are provided by latch C40 to exclusive OR gates C82. The OR gates C82 are for the purpose of correcting errors in the signals $\overline{\text{MEMO-MEM31}}$ received from the memory. Since we are assuming that there were no such errors the exclusive OR gates merely invert the signals LMEM00-LMEM31 to form the signals $\overline{\text{CM00-CM31}}$ (corrected memory 00-corrected memory 31).

Figures 1, 19:
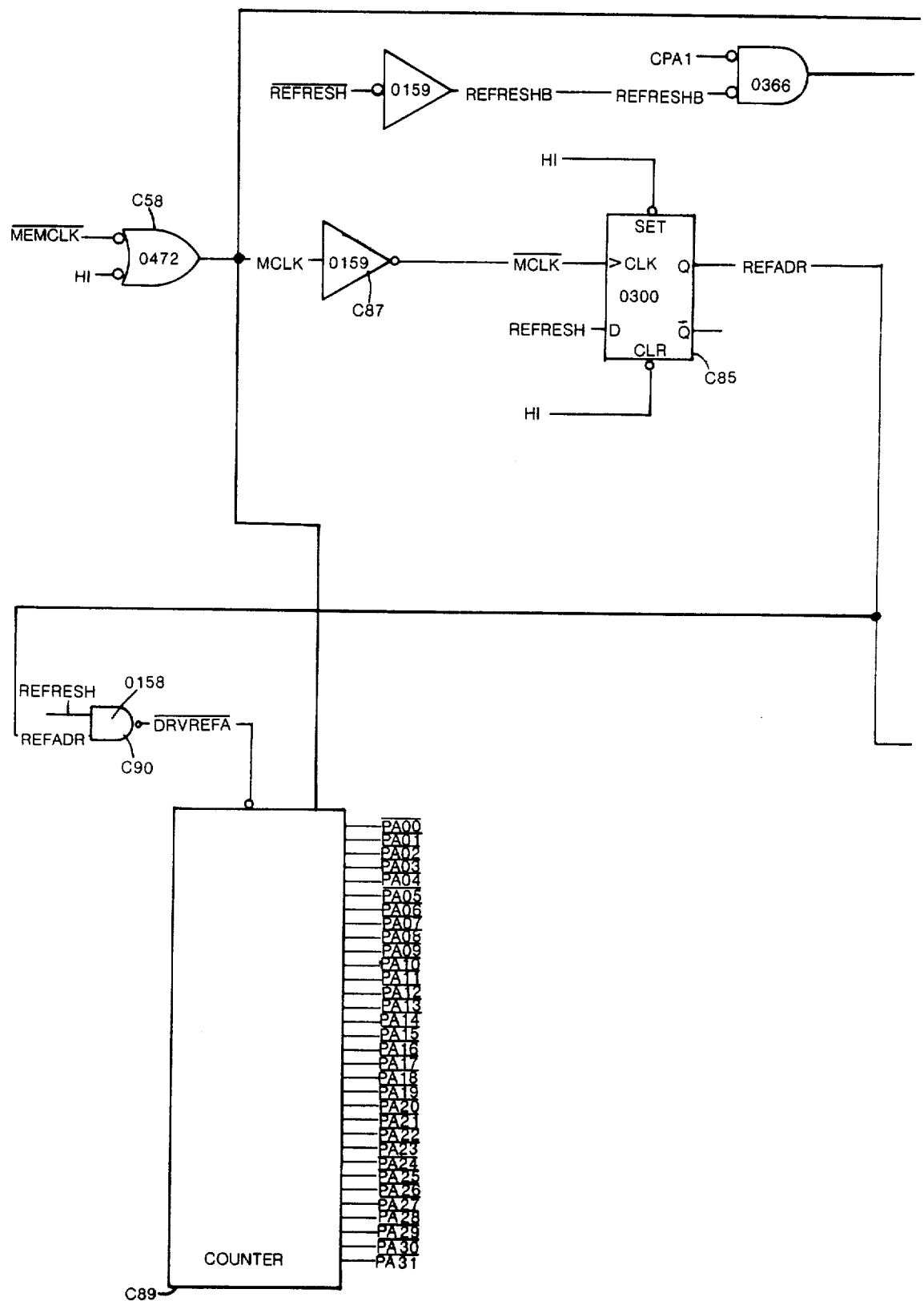
FIG. 19 is a schematic diagram of a portion of the memory controller.
Figures 2, 19:
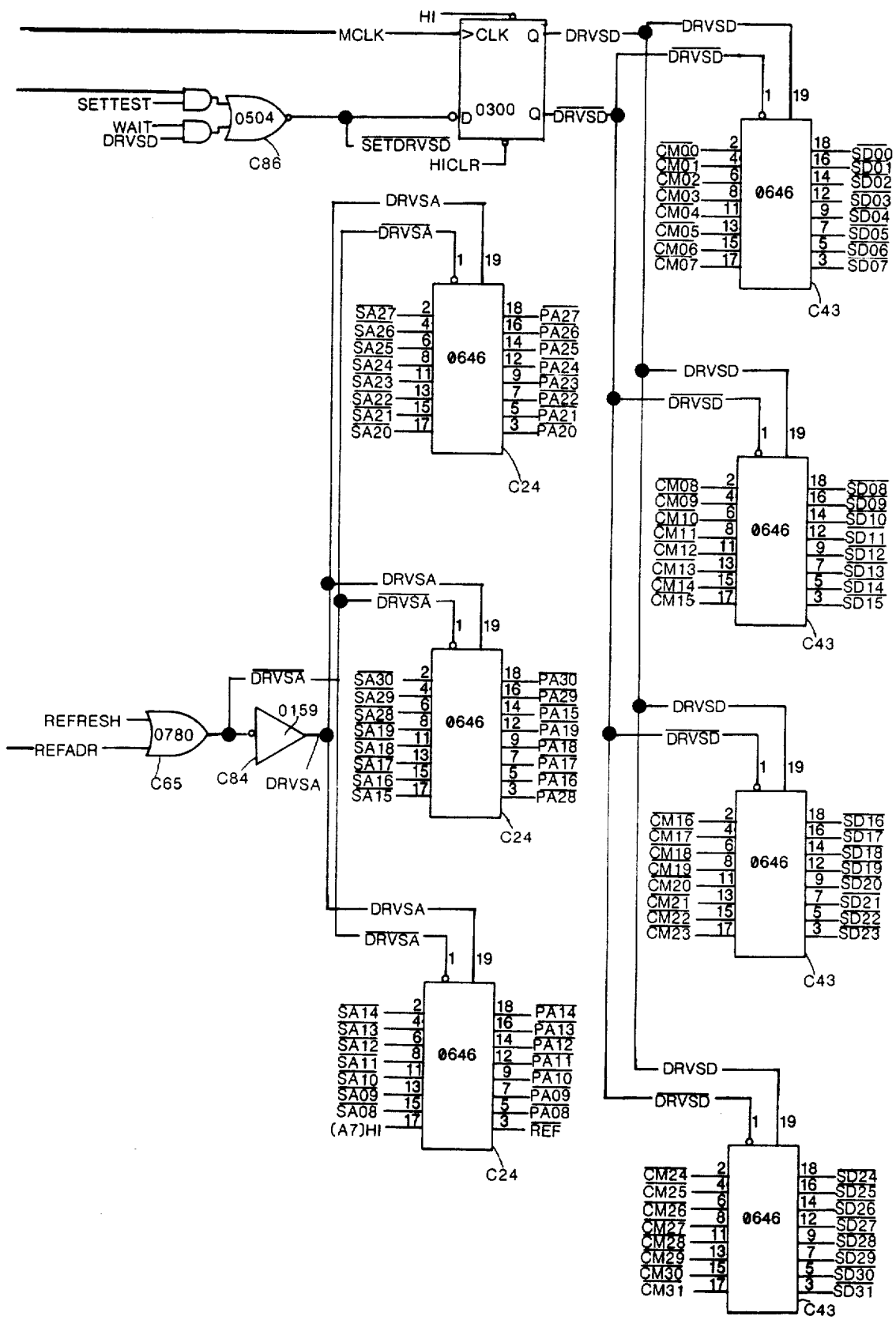

The signals $\overline{\text{CM00-CM31}}$ are then driven by noninverting tristated drivers C43, FIG. 19, to form signals $\overline{\text{SD00-SD31}}$ (system data 00-system data 31) and are passed on the system data bus to the computer requesting the information.

Parity Generation and Error Checking

During a WRITE cycle information signals from a requestor such as the CPU of a computer, pass into the inputs of latch C33 on the system data bus as system data signals SD00-SD31 and are latched in response to the signal $\overline{\text{LTCHSD}}$ from flip flop C75. From Latch 33 output signals $\overline{\text{LSD00-LSD31}}$ are passed into inputs of multiplexers C34, C35, C36 and LC37. During the writing of a full word the BYTEA, BYTEB, BYTEC and BYTE D signals are all logical ones and the multiplexers C34, C35, C36 and C37 pass the $\overline{\text{LDS00-LSD31}}$ signals in the form of output signals MUX00-MUX 31 to system data bus drivers C23. In response to the drive memory signal DRVMEM the drivers C23 send the 32 bit word to the memory bus in the form of signals $\overline{\text{MEM00-MEM31}}$. The 32 bit word is also passed through buffer inverters C41 into parity generator C82 to form parity signals S0-S6 that are passed through driver C38 and onto the signal bus in response to the drive memory (DRVMEM) signal. The DRVMEM signal normally passes through NAND gate C39 in a WRITE mode, since at that time the system is not in DIAGNOSTIC mode and the signal DIAGMODE on the other input to NAND gate C39 is a logical one. The output signals from driver C38 in the form of correction signals $\overline{\text{CBIT01-CBIT6}}$ (Correction Bit) are passed through the parity logic portion of the memory data bus 18 to the memory, to be stored there together with the corresponding memory word.

During a "READ" cycle where information is requested by the requestor to be passed through and corrected by the controller 28 the DRVMEM signal from latch C22 is not present during the time that the memory is sending its stored 39 bit word, consisting of 32 information bits and 7 parity bits, to the controller. The parity bits CBIT0 through CBIT6 are received on the input terminals of NOR gates C82. The DRVMEM signal on the input of inverter C41 is a logical zero at this time so that the NAND gate C82 passes and inverts the CBIT0-CBIT6 signals to form the signals C0-C6. Parity generator C82 receives the 32 bit information word MEM00-MEM31 and the 7 bit parity bit signal C0-C6 and generates correction bits S0-S6. NOR gate C42 receives the signals S0-S6 and generates the error signal ERR.

The ERR signal from NAND gate C42 is connected to an input of AND/NOR gate C44 together with the signal TESTDATA that is produced at the appropriate time in the read cycle by a system to be described below. A concurrance of the signals TESTDATA and ERR causes AND/NOR gate C44 to produce the set correct enable barred signal $\overline{\text{SETCORRENB}}$.

Latch C45 receives the SETCORRENB signal and, on receipt of the next MCLK pulse, provides the correct enable signals CORRENB and $\overline{\text{CORRENB}}$. The CORRENB signal from latch 45 is connected to an input of AND/NOR gate C44 and, together with the signal end correct 2 (ENDCORR2) which is normally at a logical one level, causes AND/NOR gate C44, FIG. 20, to continue to produce the $\overline{\text{SETCORRENB}}$ signal after the ERR and TESTDATA signals are discontinued. The CORRENB signal from latch C45 latch C45 is connected to a second input of latch C45 and produces the signal ENDCORR1 and $\overline{\text{ENDCORR1}}$ at the next MCLK pulse following the appearance of the CORRENB signal. NAND gate C46 receives the ENDCORR1 and CORRENB signals from latch C45 and produces the $\overline{\text{SETEC2}}$ signal at an input of latch C6. On the receipt of the next MCLK pulse following the $\overline{\text{SETEC2}}$ signal latch C6 produces the $\overline{\text{ENDCORR2}}$ signal that reverses the state of the $\overline{\text{SETCORRENB}}$ signal from gate C44. One MCLM pulse after SETCORRENB reverses state latch C45 terminates the CORRENB sie CORRENB signal. The CORRENB signal thus remains for three MCLK pulses.

Figures 1, 17:
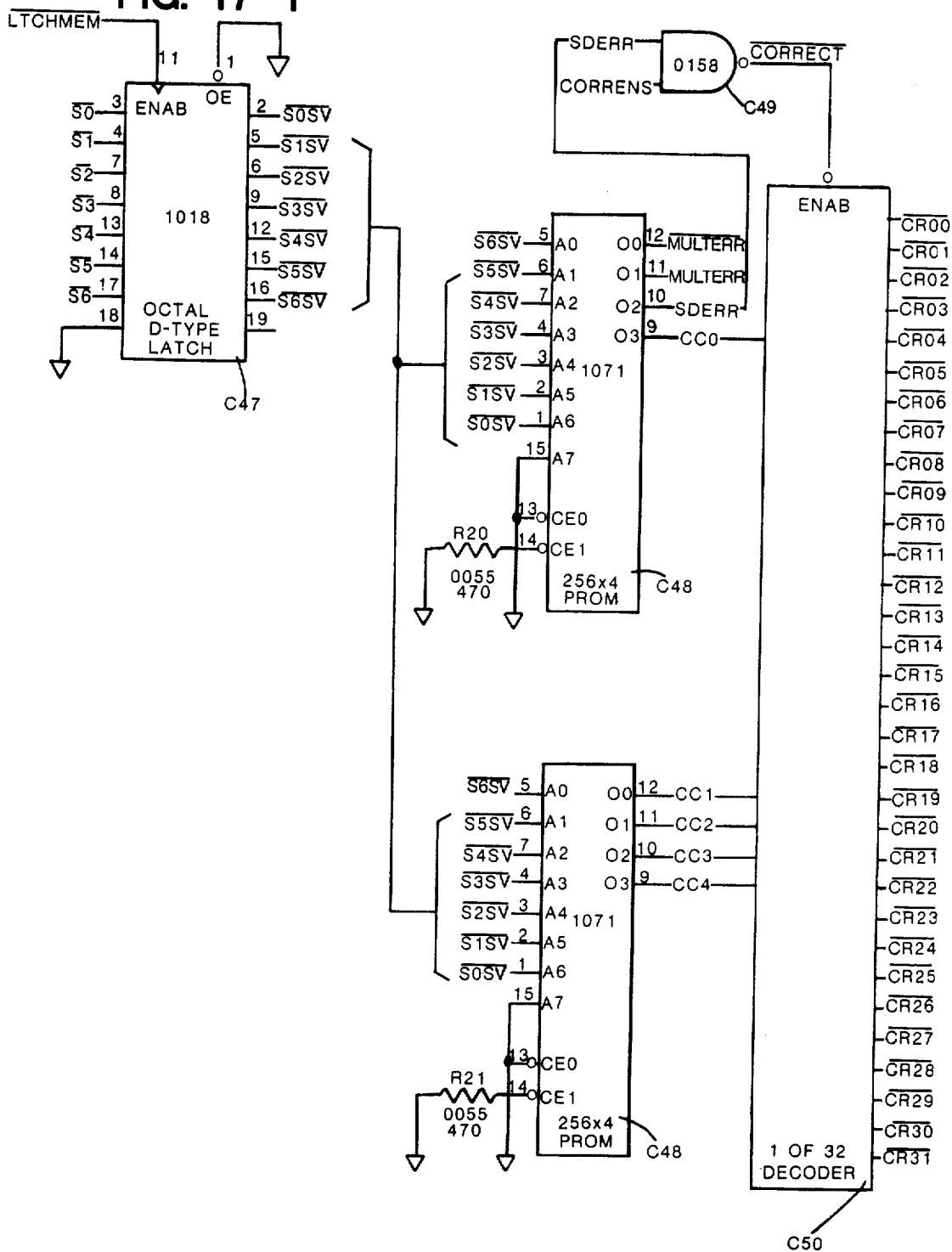
FIG. 17 is a schematic diagram of a portion of the memory controller.
Figures 2, 17:
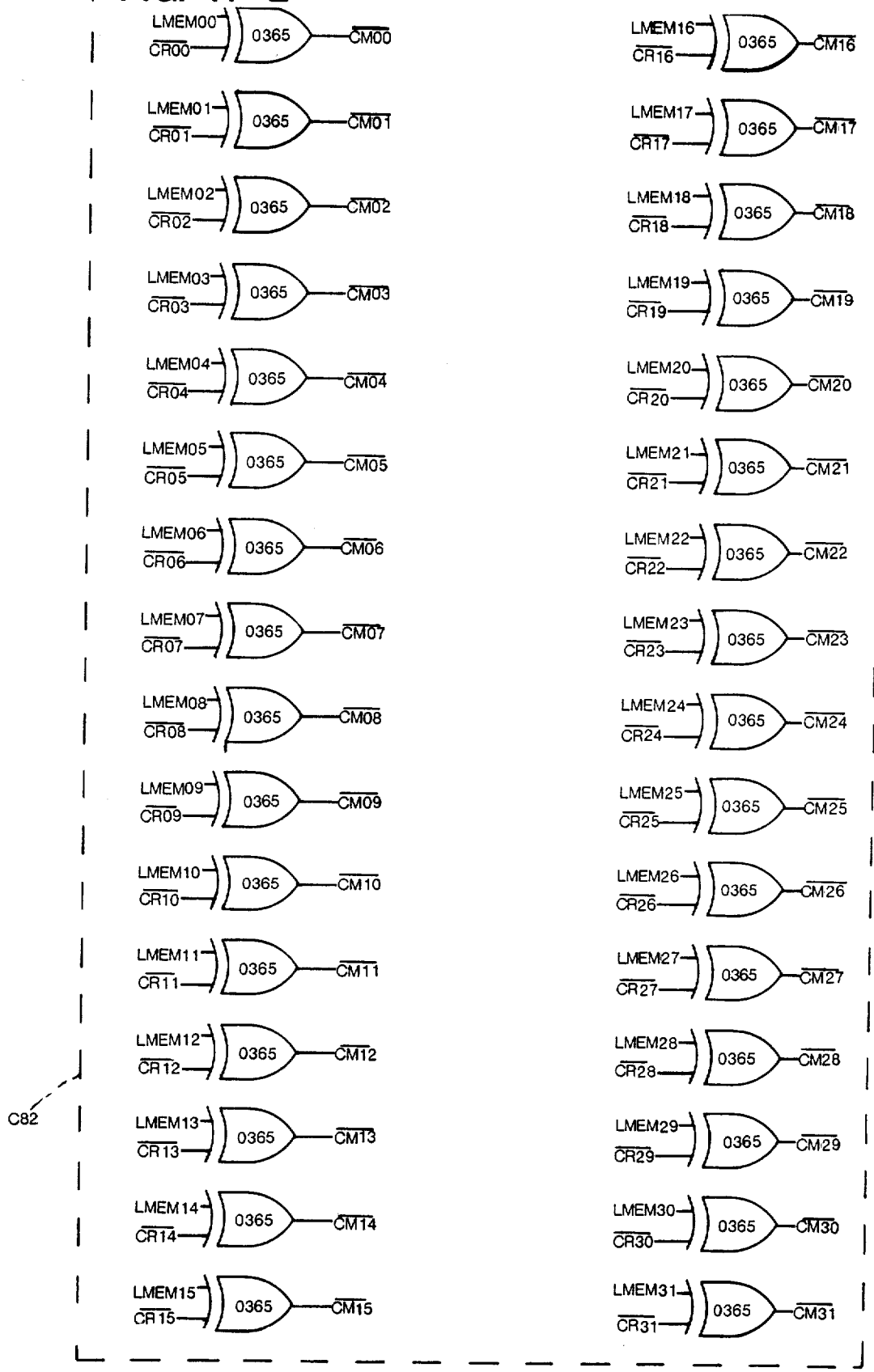

The LTCHMEM signal is generally produced by flip flop C83, at or near the end of a read memory cycle and causes latch C47, FIG. 17, to produce the $\overline{\text{S0SV-S6SV}}$ signals from the $\overline{\text{S0-S6}}$ signals. Prom C48 receives the $\overline{\text{S0SV-S6SV}}$ signals and converts them into correction codes CC0-CC4 and the signals MULTERR (multiple error) and SDERR (single detected error). The SDERR from prom C48 and the CORRENB signal from latch C45 are combined in NAND gate C49 into the signal $\overline{\text{CORRECT}}$.

Decoder C50 receives the CORRECT signal as a gate signal and the signals CC0-CC4 as information signal and changes one of its output signals CR00 through CR31 from its normal logical one state to a logical zero corresponding to the detected error.

Exclusive OR gates C82 receive the correction signals CR00-CR31 and correct the latched memory signals LMEM00-LMEM31 to form the corrected memory word $\overline{\text{CM00-CM31}}$. The $\overline{\text{CM00-CM31}}$ signals from exclusive OR gates C82 pass through drivers C43 on to the system data bus as signals $\overline{\text{SD00-SD31}}$ and are sent to the requestor.

Generation of the "$\overline{\text{WAIT}}$" Signal (FIG. 16)

The $\overline{\text{WAIT}}$ signal is generated by flip flop C56 during all read cycles and during quad word write cycles to indicate to the requestor that the system data bus is reserved for the controller asserting the $\overline{\text{WAIT}}$ signal. AND/NOR gate C51 receives the signals MC0, MC1, MC2 and generates an inhibiting signal for NAND gate C52 upon receipt of all of the requestors MC0, MC1, MC2 code combination except those indicating a read cycle or a quad word write cycle. NAND gate C52 also receives the ANYMC signal from NOR gate C53 through inverter C54. The ANYMC signal is generated by NOR gate C53 in response to any of the requestor codes MC0, MC1, MC2 that are received by the controller. The $\overline{\text{RUNNING}}$ signal, also received by NAND gate, is normally at a logical one level and therefore gate C52 passes it's signal through OR gatOR gate C55 into J-K flip flop C56, thereby setting the flip flop on the next MEMCLK signal. As indicated above $\overline{\text{RUNNING}}$ is generated by NOR gate C8 and NAND gate C57 one MCLK pulse pulse after any of the MC0-MC2 signals is received by the controller from the requestor. Therefore one MCLK pulse following the generation of the ANYMC signal the $\overline{\text{RUNNING}}$ signal changes to a logical zero and disables NAND gate C52. The MEMCLK signal triggers the J-K flip flop C56 to produce the WAIT signal before the RUNNING signal disables NAND gate C52 and removes the logical one level from the J input of flip flop C56, because the flip flop C56 receives the MEMCLK signal immediately from the requestor, where the $\overline{\text{RUNNING}}$ signal is generated only after propagation delays following the MEMCLK signals the CPA1-CPA3 signals are generated and further delays through NOR gate C8 and NAND gate C57 where RUNNING is generated. The second input signal to NOR gate C55, set drive system data barred, (SETDRVSD) is used to generate the WAIT signal during a test cycle.

The flip flop C56 is reset under any of four different conditions. The most common condition is that during a test cycle no errors are detected. Under this condition the logical zero signals $\overline{TEST}$ from flip flop C10, FIG. 14, and ERR from NOR gate C42 are inverted and passed through NOR gates C59 and C60, thereby enabling AND gate C61 to provide a logical one signal to the K input of flip flop C56. If an error is detected and is being corrected the $\overline{SETEC2}$ signal from NAND gate C46, FIG. 15, will pass through NOR gates C62, C59 and C60 and AND gate C61 to reset flip flop C56 on the next MEMCLK pulse.

During a quad word write operation the $\overline{LDDIN}$ signal from flip flop C45 also resets the J-K flip flop C56 through NAND gates C62, C59 and C60 and AND gate C61 between the transmission of the two words stored in the memory in such an operation.

Finally, if during a read cycle or a refresh cycle the test is invalid, either because the controller addressed a non existent memory module, the TEST signal from latch C10 and the $\overline{VALIDTEST}$ signal from NAND gate C68 pass through NAND gates C63 and C61 and NOR gates C59, 60 and C62 to reset flip flop C56.

Write Cycles

The write cycles begin with a write command where the MC codes correspond to the binary equivalent of the decimal numbers 4,5,6,7. One additional cycle where writing is involved is the cycle designated with the MC code equivalent of the number 3 and called "read, modify, write".

At the same time the system address bus transmits a 23 bit system address $\overline{SA8}$-$\overline{SA30}$ to driver C24, FIG. 19. If the controller in any mode other than "refresh" mode the driver C24 passes the address in the form of physical address signals $\overline{PA08}$-$\overline{PA30}$ in response to the signal $\overline{DRVSA}$ from OR gate C65 and inverter 84.

The $\overline{DRVSA}$ signal is generated by OR gate C65 in response to absence of the REFRESH signal from counter C3 and the REFADR signal from flip flop C85. The REFADR is merely a clocked version of the REFRESH signal, using $\overline{MCLK}$ from inverter 87.

Immediately after the MC0-MC2 codes are received by the controller ANDNOR gate C12 produces the $\overline{ASTRB}$ signal that is converted by driver C14 into the signal ADRSTB. The ADRSTB signal is transmitted to the memory and received by inverter 33 for use by latch 30 in developing the ADRLTCH signal. NORAND gate 29 of the memory converts the ADRSTB signal into the SETRAS signal. Latch 31 of the memory converts the SETRAS signal to the RAS signal. If the identity of the memory module corresponds to the physical address signals PA8-PA14 the module select logic 1 will provide to multiplexer 36 the MODSEL signal which in turn will result in the MODSELLTCH signal from the multiplexer.

The MODSELLTCH signal from multiplexer 36 and the RAS signal from latch 31 produce the ANYRAS signal from NAND gate 67.

NAND gate C66 receives the $\overline{ASTRB}$ signal from AND/NOR gate C12 and the ASTRBSV signal from latch C11. In response to the output of NAND gate C22 J-K flip flop C67 produces the NOMEM signal upon the receipt of the next MCLK pulse, thereby disabling NAND gate C68. J-K flip flop C67 is reset and the disabling input to NAND gate C62 is removed in response to the $\overline{ANYRAS}$ signal received by J-K flip flop C7 through inverter C69.

GENERATION OF THE "BUSY1" SIGNAL

Upon receipt of the MC signals NAND gate C53 generates the ANYMC signal that is inverted by NOR gate C70 and provided to JK flip flop C71. JK flip flop C71 generates a BUSYF signal in response to the next MEMCLK signal after the receipt of the ANYMC signal. The next MCLK signal following the MEMCLK signal causes counter C3 to provide the CPA1, CPA2, CPA3 signals that, through NOR gate C8 and NAND gate C57 produce the $\overline{RUNNING}$ signal, thereby disabling AND gate C72 and preventing flip flop C71 from switching off the BUSYF signal. The BUSYF signal is converted by inverter C73 into the BUSY1 signal, indicating to the requester, such as a CPU, that a memory module has been actively engaged by the controller.

STORING OF DATA INTO MEMORY

After a short delay following the transmission of the MC signals and the system address, the requestor transmits the word to be stored to the controller of the system data bus in the form of $\overline{SD00}$-$\overline{SD31}$.

Figure 21:
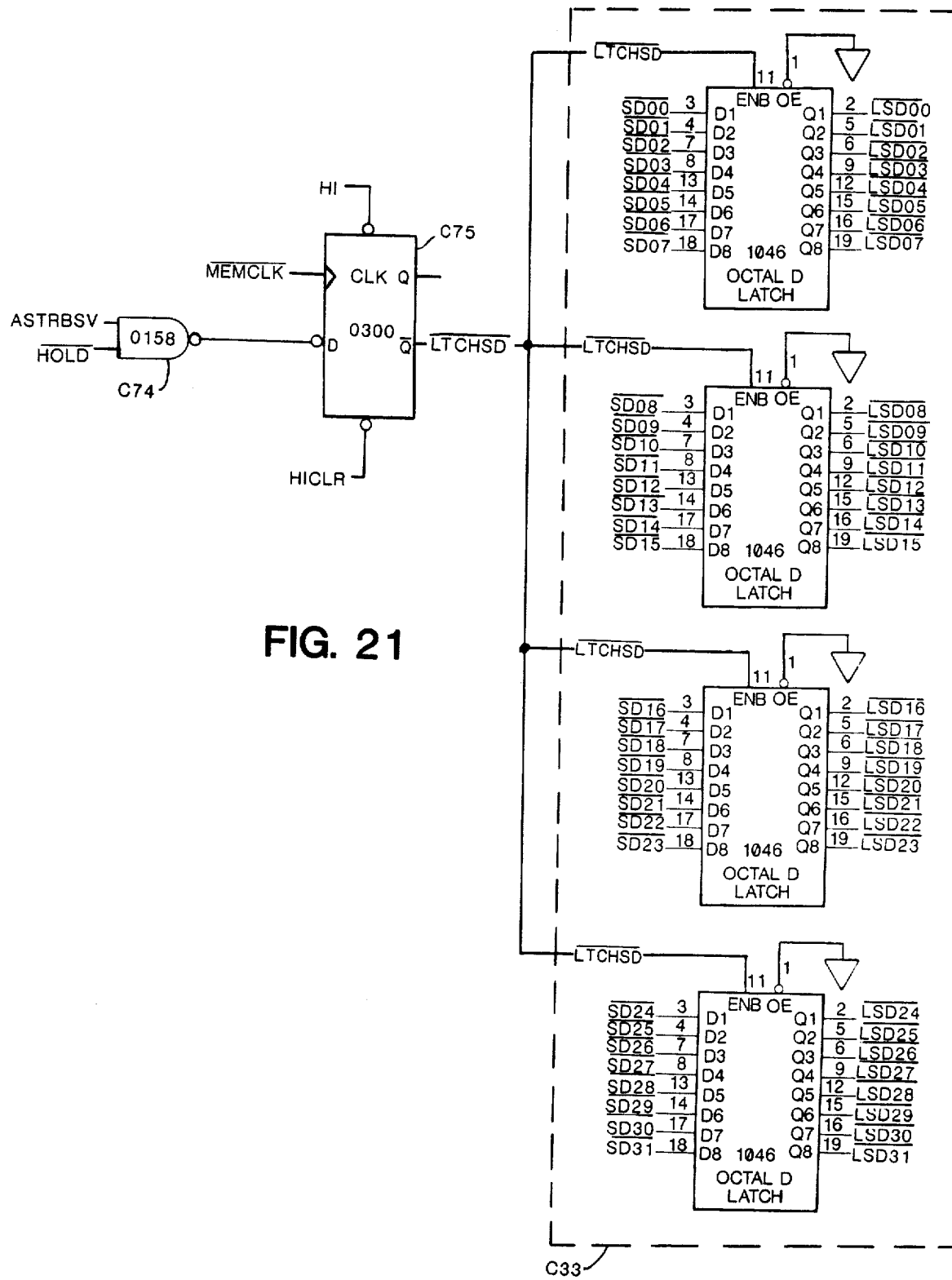
FIG. 21 is a schematic diagram of a portion of the memory controller.

One MCLK pulse after the MC signals are received by the controller from the requestor the ASTRBSV signal from Latch C11, FIG. 14, passes through NAND gate C74, FIG. 21, and prepares latch C75 to provide a LTCHSD signal at the next $\overline{MEMCLK}$ pulse. At this early portion of every cycle the $\overline{HOLD}$ signal is a logical one, thereby enabling the NAND gate C74. The $\overline{HOLD}$ signal only disables NAND gate C74 at the middle of a QUAD WORD WRITE cycle or a READ/MODIFY/WRITE cycle.

The LTCHSD signal from latch C75 removes the input enabling signal from latch C33 and thereby prevents the signals on the system data bus from further influencing the output signals $\overline{LSD00}$-$\overline{LSD31}$ of this latch.

Multiplexers C34, C35, C36, C37, FIG. 18, receive the latched system data ($\overline{LSD00}$-$\overline{LSD3}$) signals on their "B" input terminals. The "B" input selection signals for these multiplexers are BYTEA, BYTEB, BYTEC and BYTED. If the contoller is not in its refresh cycle and is in neither the write word or write byte node then a logical one signal from NAND gate C28 will pass through and be inverted by enabled NAND gate C27, thereby causing all four NOR gates C29, C30, C31 and C32 to produce the BYTEA, BYTEB, BYTEC and BYTED signals. In response to these four signals all of the multiplexers C34, C35, C36 and C37 will switch to their "B" inputs and pass the latched system data signals $\overline{LSD00}$-$\overline{LSD30}$ to the memory bus drivers C23, FIG. 16, as multiplexer signals MUX00 and MUX31. AND gate C21 receives the $\overline{DOUT}$ (Drive Out) signal from Latch ASTRB signal from inverter C13 causes AND gate C21 to set latch C22 to produce the DRVMEM signal. The DRUMEM signal permits the MUX0-0-MUX31 signals to pass on to the memory bus 18 through driver C23 as memory bus signals $\overline{MEM0}$-$\overline{MEM31}$.

In the "writrd" mode NAND gate C28 provides a logical zero output that enables decoders C25 and C26, while disabling NAND gate C27.

In this mode the signal CPA3 is a logical zero and the logical state of the SA31SV signal from latch C16 determines whether the pairs of signals BYTEA and BYTEB or BYTEC and BYTED are provided by NOR gates C29 and C30 or C31 and C32.

In the "write byte" mode the signal CPA3 is a logical one so that decoder C25 can produce output signals only on its disconnected terminals 2 and 3 and cannot affect the output of NOR gates C29, C30, C31 and C32. In this mode each different combination of the SA313V signal and the BYTESELSV signal from latch C16 cause decoder C26 to select a different one of the output signals, thereby causing a different one of NOR gates C29, C30, C31 and C32 to produce one of the BYTEA, BYTEB, BYTEC and BYTED signals to select which sets of eight bits of the latched system data bus LSD00–LSD31 are passed through multiplexers C34, C35, C36 and C37 and driver C23 onto the memory bus as signals $\overline{\text{MEM00}}$–$\overline{\text{MEM31}}$.

Since in both write cycles and read cycles information is read from the addressed memory module to the memory data bus 18 the thirty-two bit information word in a memory location may be either replaced entirely in a double word write cycle, or replaced partially in a word write cycle or a byte write cycle. A partial word write cycle involves reading the information stored in the selected memory module into latches C40 in response to a LTCHMEM signal from flip flop C83. The thirty-two bit memory word $\overline{\text{MEM0}}$ $\overline{\text{0}}$–$\overline{\text{MEM31}}$ from the memory data bus 18 is inverted by inverters C41 and applied to latches C40 in the form of signals MEM00–MEM31. The latching of the latches 40 also occurs during any read cycle. The LMEM00-LMEM30 signals are passed through exclusive Or gates C82 where they are corrected by the output of decoder C50, $\overline{\text{CR00}}$–$\overline{\text{CR31}}$, and passed as corrected memory signals $\overline{\text{CM00}}$–$\overline{\text{CM31}}$ to multiplexers C34, C35, C36 and C37. Depending on the state of the BYTEA, BYTEB, BYTEC and BYTED signals, the output of these multiplexers, MUX00–MUX31, will be the word originally read from the memory module with eight or more bits from the system data bus substituted for bits in the original word. The contents of the multiplexers is then passed through inverter-drivers C23 on to the memory data bus 18.

Figures 1, 15:
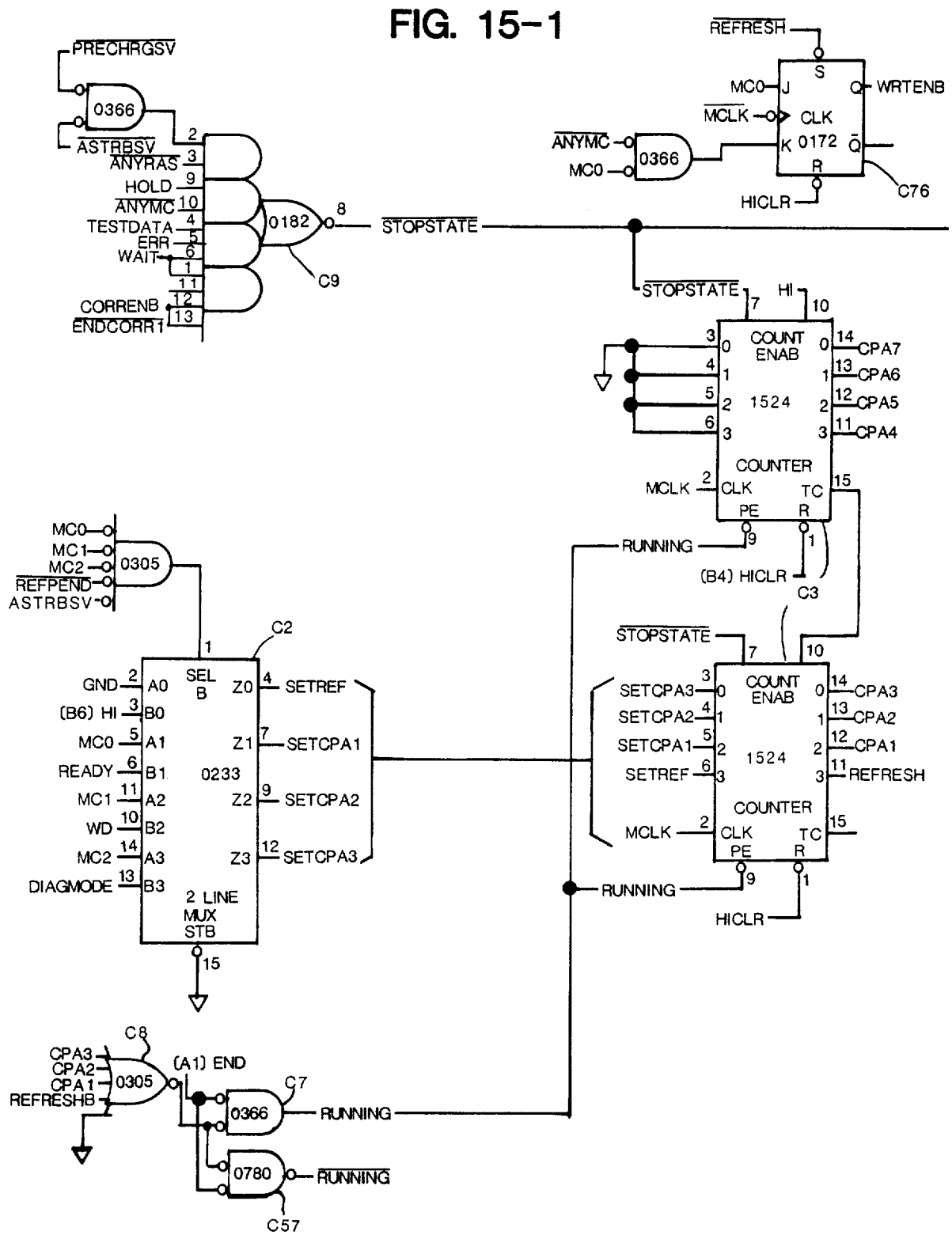
FIG. 15 is a schematic diagram of a portion of the memory controller.
Figures 2, 15:
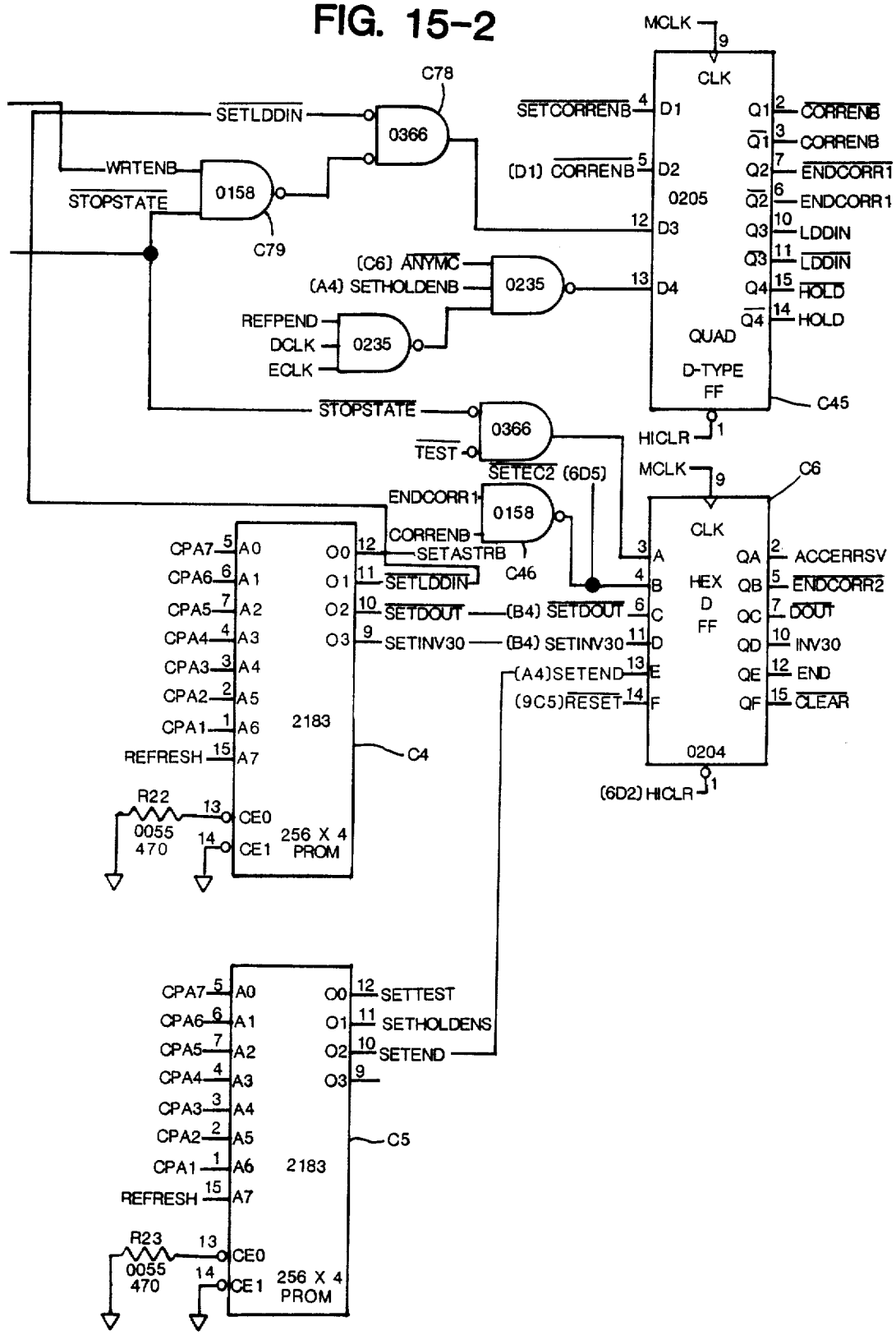
Figures 1, 20:
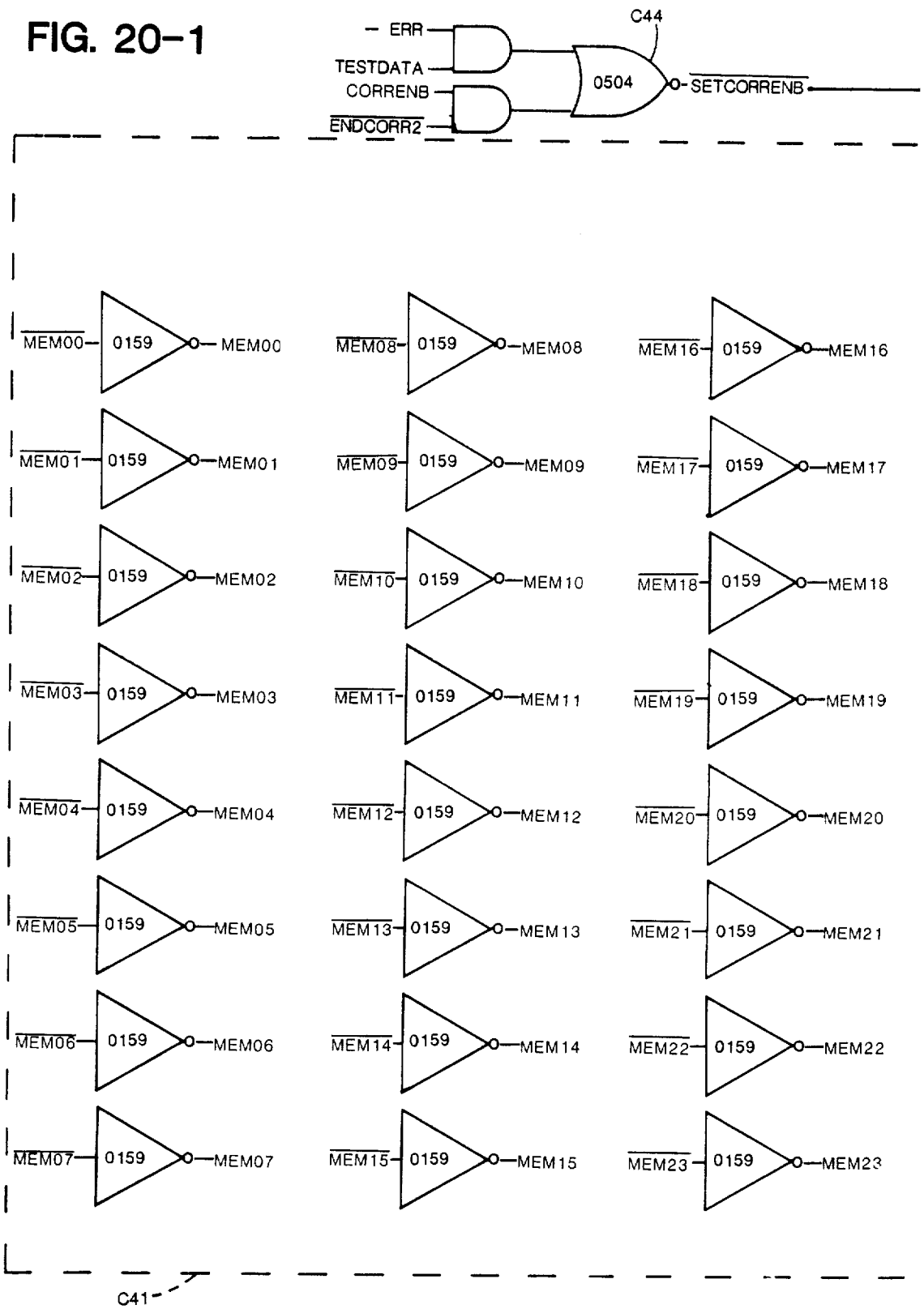
FIG. 20 is a schematic diagram of a portion of the memory controller.
Figures 2, 20:
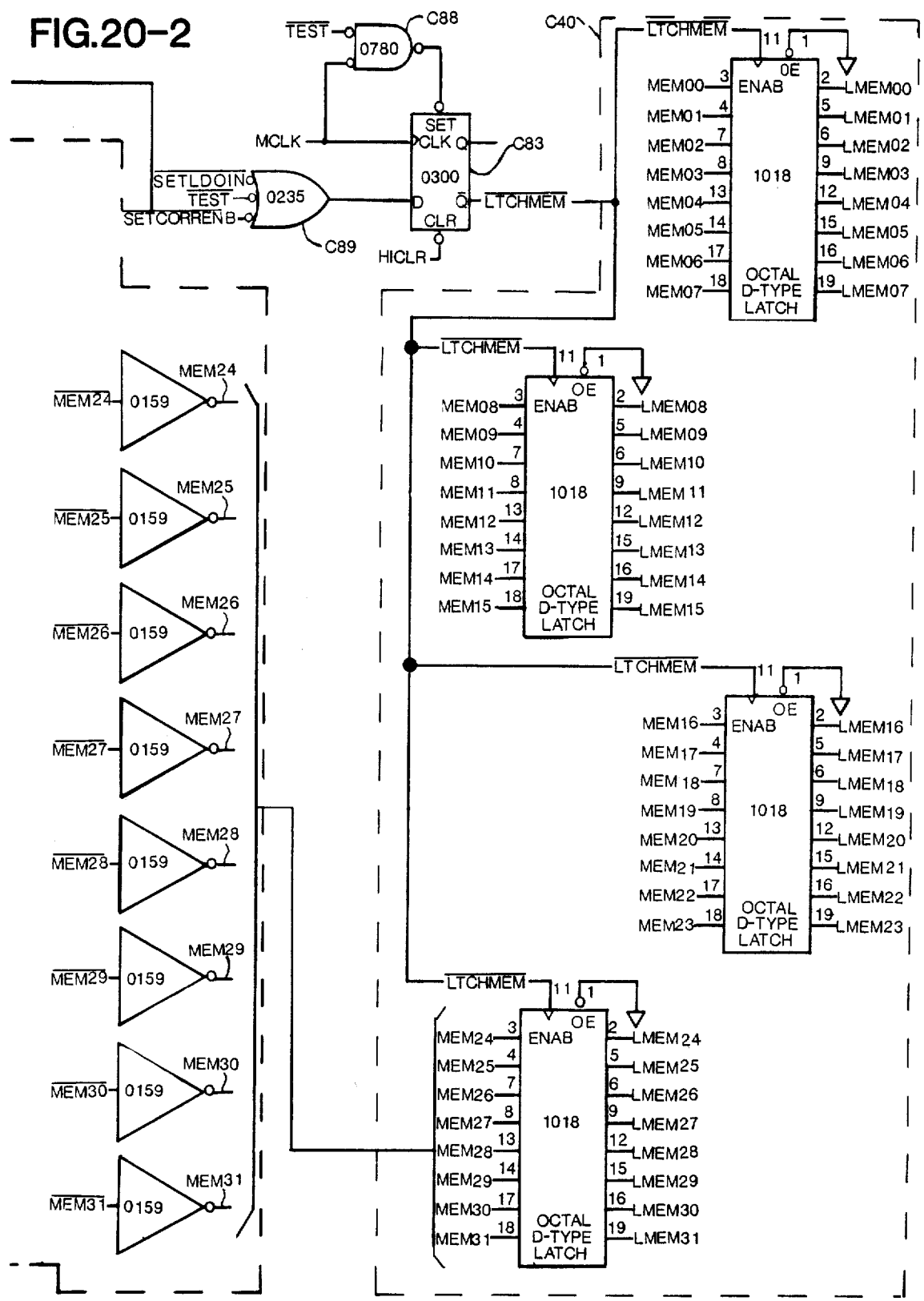

Flip flop C83, FIG. 20, is set by the $\overline{\text{TEST}}$ signal from flip flop C10, FIG. 1, through AND gate C88, and reset by a zero output from Or gate C89, when all of the signals $\overline{\text{SETLDDIN}}$ from prom C4, FIG. 15, SETCORRENB from AND/NOR gate C44, FIG. 20, and $\overline{\text{TEST}}$ from flip flop C10, FIG. 14, are no longer asserted.

The $\overline{\text{TEST}}$ signal is generated by flop flop C10 in response to the SETTEST signal from prom C5, FIG. 15 which is asserted on the third clock clock pulse of every read cycle including a partial write cycle that is in reality a read-modify-write cycle.

During any of the write cycles the MC0 signal is a logical one. The MC0 signal sets J-K flip flop C76 to produce the WRTENB signal at the next MCLK signal following the MC0 signal. In any of the read memory modes the MC0 signal is a logical zero, thereby enabling NAND gate C77 to pass the ANYMC signal on its second input to the "k" input of the flip flop C76 and resetting the flip-flop. This terminates the WRTENB signal.

The signal $\overline{\text{SETLDDIN}}$ (Set Load Data IN) is generated by prom C4 and connected to an input of NAND gate C78, FIG. 15. NAND gate C79 provides an output for the second input of NAND gate 78 and has as its inputs the signals WRTENB and $\overline{\text{STOPSTATE}}$. The $\overline{\text{STOPSTATE}}$ signal is normally at a logical one level so that the WRTENB signal passes through NAND gates C78 and C79 to cause Latch C45 to produce the signal LDDIN (Load Data In).

Inputs of NAND gates C80 and C81, FIG. 14 are connected in common to the LDDIN signal. Exclusive OR gate C19 provides the second input to NAND gate 81 and has for its inputs the signals PA30SV, the latched version of physical address PA30, and INV30. Exclusive OR gate 20 provides the second input to NAND gate 80 and has for its inputs the signals INV30 and $\overline{\text{PA30SV}}$. Normally the signal INV30 is a logical zero, so that if the signal $\overline{\text{PA30SV}}$ is a logical zero the signal PA30SV is a logical one, thereby causing NAND gate C80 to provide the signal LDDIN0.

Similarly, if the signal PA30SV is a logical one, the signal $\overline{\text{PA30SV}}$ is a logical zero, thereby causing NAND gate 81 to provide the signal LDDIN1.

If the signal INV30 is a logical one than the effect of the signal PA30SV on NAND gates 80 and 81 is reversed. The INV30 signal is used during a quad word write cycle during the writing of the second words.

Next, prom C5 outputs the SETEND signal to latch C6. The signal END is produced by the latch in response to the SETEND signal following the next MCLK pulse.

NAND gate C7 receives the END signal and in response to this signal terminates the RUNNING signal and thereby stops counter C3.

During a refresh cycle OR gate C58 inverts the MEMCLK signal to produce a MCLK signal that is itself inverted by inverter 87 to produce the signal MCLK. The MCLK signal clocks flip flop C85 to convert the REFRESH signal into a REFADR signal that is applied, together with the REFRESH signal to NOR gtate 90 to produce the drive refresh address signal DRVREFA that turns on refresh address counter C89. Counter C89 is a normal binary counter that, in response to the DRVREFA signal and the MCLK pulse generates all possible 32 bit addresses onto the memory address bus 19.

What is claimed is:

1. A memory device for a computer system,
said computer system including
system data bus; a system address bus;
a central processing unit connected to said system data and system address buses controller means connected to said system data and system address buses for providing the following signals:
a MEMORY ADDRESS signal indicative of a memory location to be addressed,
a MEMORY DATA signal during a write operation of said memory device,
an ADDRESS STROBE signal,
a LOAD DATA IN EVEN signal during said write operation,
a LOAD DATA IN ODD signal during said write operation,
a DATA OUT STROBE signal during a read operation, of said memory device,
a DATA OUT EVEN signal during said read operation,
a DATA OUT ODD signal during said read operation, and
a PRECHARGE signal,
said memory device being provided with a memory address bus connecting said memory device to said controller, a memory data bus connecting said memory device with said controller, at least one memory module in said memory device and having an array of memory elements arranged nominally in odd and even halfs of rows and columns, means in said memory module responsive to said ADDRESS STROBE signal for latching said MEMORY ADDRESS signal, means in said memory module responsive to the concurrance of said ADDRESS STROBE signal and to module identification portions of said MEMORY ADDRESS signal for generating an ANY ROW ADDRESS STROBE signal for said controller means and for generating a ROW ADDRESS STROBE signal, first delay means responsive to said ROW ADDRESS STROBE signal for successively providing a row address portion of said memory address signal to said memory elements and providing a DELAYED ROW ADDRESS STROBE signal to groups of selected row of said memory elements and then providing a column address portion of said MEMORY ADDRESS signal to said memory elements, whereby both odd and even of said memory elements are addressed, means in said memory device responsive to said LOAD DATA IN EVEN signal for applying data signals on said memory data bus to even memory elements of said memory device, second delay means in each memory module responsive to said LOAD DATA IN EVEN signal for applying a DELAYED WRITE ENABLE signal to said even memory elements of said memory device, thereby enabling said even memory elements to store the DATA signals on said memory data bus, means in said memory device responsive to said LOAD DATA IN ODD signal for applying DATA signals on said memory data bus to odd memory elements of said memory device, third delay means in each memory module responsive to said LOAD DATA IN ODD signal for applying a DELAYED WRITE ENABLE signal to said odd memory elements of said memory device, thereby enabling said odd memory elements to store the DATA signals from said memory data bus, means in said memory device responsive to said DRIVE OUT STROBE signal for latching the outputs of all of the memory elements in the memory device for at least the duration of said DRIVE OUT STROBE signal, means in said memory device response to said DRIVE DATA OUT EVEN signal for enabling the output of the even memory elements of the selected memory module to be placed on the memory data bus, means in said memory device responsive to said DRIVE DATA OUT ODD signal for enabling the output of the odd memory elements of the selected memory module to be placed on the memory data bus, comparison means in each of said modules for determining whether a particular row of that module was accessed during an immediately preceding ADDRESS STROBE signal, means responsive to said comparison means for delaying the ROW ADDRESS STROBE signal until the termination of said PRECHARGE signal, means in said controller means responsive to the absence of the ANY ROW ADDRESS STROBE signal concurrent with the presence of the ADDRESS STROBE and PRECHARGE signals for delaying the transmission of any further signals to the memory device.

2. A memory module for storing digital information, comprising means for receiving a coded module address signal from a digital signal source, comparison means for comparing said module address with stored information and for providing a row address strobe signal in response to a coincidence between said stored information and the module address, means responsive to said row address strobe signal for providing said digital signal source with a recognition signal, first delay means responsive to said row address strobe signal for providing a column address strobe after a preset delay period, a first plurality of ordered sets of memory elements, a second plurality of ordered sets of memory elements, means responsive to a portion of said module section address for providing row and column selection signals corresponding to the identity of the ordered sets of memory elements, multiplexer means responsive to the column address strobe and row address strobe signals and to the row and column selection signals for providing said row address strobe and column address strobe signals to the selected sets of the memory elements in the first and second plurality of sets of memory elements, a said selected sets of memory elements being responsive to said row address strobe and column address strobe signals for providing an information word stored in the elements and corresponding to the module address signal, latch means for concurrently storing an information word from both sets of memory elements, said latch means being responsive to a word selection signal from said digital signal source for selectively providing the digital signal source with one of the information words or with both words in sequence, means for receiving write selection signals from said digital signal source, means for receiving data words from said signal source, second delay means responsiveaid write selection signals for selectively providing write enabling signals to one of said first and second plurality of sets of memory elements, said memory elements being responsive to the row address strobe, column address strobe and write enabling signals for storing the data words in the memory element address location indicated by said coded module address signal as information words.

3. A memory module as recited in claim 2, wherein the latch means for selectively providing the digital signal source with one of the information words or with both words in sequence further comprises means for providing the selected information words to the digital data source continuously and for terminating the provision of said word only after the word selection signal terminates.

4. A memory module as recited in claim 2, wherein said latch means further comprises isolation means for maintaining the first words read from the memory elements independent of further changes in the output of said memory elements, whereby following the storage of the information word in the latch means a new module addresss may be provided to the module and the words in the latch means may be read out during the time necessary for the first delay means to address the memory elements selected by the new address, so that four consecutive words may be read from the memory module without the normal addressing delays between words.

5. A memory module as recited in claim 3, wherein said latch means further comprises isolation means for maintaining the first words read from the memory elements independent of further changes in the output of said memory elements, whereby following the storage of the information word in the latch means a new module addresss may be provided to the module and the words in the latch means may be read out during the time necessary for the first delay means to address the memory elements selected by the new address, so that four consecutive words may be read from the memory module without the normal addressing delays between words.

6. A memory module as recited in claim 2, wherein the means for receiving the coded module address signal comprises an address latch means responsive to an address strobe signal from the digital signal source for storing the module address signal for as long as the address strobe signal is asserted.

7. A memory module as recited in claim 3, wherein the means for receiving the coded module address signal comprises an address latch means responsive to an address strobe signal from the digital signal source for storing the module address signal for as long as the address strobe signal is asserted.

8. A memory module as recited in claim 4, wherein the means for receiving the coded module address signal comprises an address latch means responsive to an address strobe signal from the digital signal source for storing the module address signal for as long as the address strobe signal is asserted.

9. A memory module as recited in claim 5, wherein the means for receiving the coded module address signal comprises an address latch means responsive to an address strobe signal from the digital signal source for storing the module address signal for as long as the address strobe signal is asserted.

10. A memory module as recited in claim 2, wherein said first delay means further comprises means for providing a delayed row address strobe signal prior to providing the column address signal, and wherein said multiplexer means further comprises means responsive to the delayed row address strobe signal for connecting the memory elements to the column address portion of the module address subsequent to the application of the row address portion of the module address and the row address strobe signal and prior to the application of the column address strobe signal.

* * * * *